(12) United States Patent  
Kato et al.

(10) Patent No.: US 8,169,047 B2
(45) Date of Patent: May 1, 2012

(54) SEMICONDUCTOR DEVICE COMPRISING A SCHOTTKY BARRIER DIODE

(75) Inventors: Kunihiko Kato, Tokyo (JP); Hideki Yasuoka, Tokyo (JP); Masatoshi Taya, Tokyo (JP); Masami Koketsu, Tokyo (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 776 days.

(21) Appl. No.: 12/205,622

(22) Filed: Sep. 5, 2008

(65) Prior Publication Data

US 2009/0065888 A1 Mar. 12, 2009

(30) Foreign Application Priority Data

Sep. 6, 2007 (JP) ................................. 2007-231849

(51) Int. Cl.
*H01L 29/66* (2006.01)
(52) U.S. Cl. ........ 257/476; 257/471; 257/475; 257/483; 257/484; 257/E21.359; 257/E21.368; 257/E29.338
(58) Field of Classification Search .................. 257/471, 257/475, 476, 483, 484, E21.359, E21.368, 257/E29.338
See application file for complete search history.

(56) References Cited

U.S. PATENT DOCUMENTS

| 6,597,050 B1 * | 7/2003 | Dunn et al. ................. 257/453 |
| 2006/0220166 A1 | 10/2006 | Kikuchi et al. |
| 2007/0278608 A1 * | 12/2007 | Shim et al. ................. 257/481 |

FOREIGN PATENT DOCUMENTS

| JP | 8-64845 A | 3/1996 |
| JP | 10-117002 A | 5/1998 |
| JP | 2006-310791 A | 11/2006 |

* cited by examiner

*Primary Examiner* — Jay C Kim
(74) *Attorney, Agent, or Firm* — Miles & Stockbridge P.C.

(57) ABSTRACT

The present invention aims to enhance the reliability of a semiconductor device equipped with a Schottky barrier diode within the same chip, and its manufacturing technology. The semiconductor device includes an n-type n-well region formed over a p-type semiconductor substrate, an n-type cathode region formed in part thereof and higher in impurity concentration than the n-well region, a p-type guard ring region formed so as to surround the n-type cathode region, an anode conductor film formed so as to integrally cover the n-type cathode region and the p-type guard ring region and to be electrically coupled thereto, n-type cathode conduction regions formed outside the p-type guard ring region with each separation portion left therebetween, and a cathode conductor film formed so as to cover the n-type cathode conduction regions and to be electrically coupled thereto. The anode conductor film and the n-type cathode region are Schottky-coupled to each other.

10 Claims, 43 Drawing Sheets

SEMICONDUCTOR DEVICE COMPRISING A SCHOTTKY BARRIER DIODE

CROSS-REFERENCE TO RELATED APPLICATIONS

The disclosure of Japanese Patent Application No. 2007-231849 filed on Sep. 6, 2007 including the specification, drawings and abstract is incorporated herein by reference in its entirety.

BACKGROUND OF THE INVENTION

The present invention relates to a semiconductor device and a manufacturing method thereof, and particularly to a technique effective if applied to a semiconductor device equipped with a Schottky barrier diode.

The development of a liquid crystal display (LCD) or the like widely already in actual use as a display device is being carried out with the objective of making further high definition, life extension and the like. A semiconductor device called "LCD driving integrated circuit (driver IC: Integrated Circuit or called simply "driver")" is used for control of the operation of the LCD.

In a driving integrated circuit used at a location close to a power supply as well as an LCD driver, a backward current introduced into a main apparatus due to voltage inversion at the supply of power, for example can lead to a so-called latch-up phenomenon that causes abnormal generation of heat at a parasitic element or the like in particular. As a device for preventing such a latch-up phenomenon, a diode that rectifies the backward current flowing into each of principal parts of various drivers has been built in each of the various drivers. In particular, a Schottky barrier diode (SBD or called simply "Schottky Diode") is applied to an LCD driver discussed by the present inventors et al. The basic principle of operation of the Schottky barrier diode and its electrical characteristics, which are required to explain its reason, will be descried below in brief.

The Schottky barrier diode comprises a junction of a metal material and a semiconductor material. Considering in particular a junction where there is a difference between the work function of the metal material and the electron affinity of the semiconductor material, the above difference in energy is held at a junction surface in a state of equilibrium, and they are bonded to each other in such a manner that both are made identical in Fermi level inside the material. Thus, a potential barrier equivalent to the original difference between the work function and the electron affinity occurs at the junction surface. Particularly when the height of the barrier is sufficiently larger than thermal energy, the transportation of such carriers that come and go between the metal/semiconductor materials is inhibited thereby. Such a barrier is called "Schottky barrier" in particular. The junction of the metal and semiconductor materials having the physical properties that can yield the Schottky barrier is described below as a Schottky junction.

Here, when an electric field is applied to the Schottky junction, a potential distribution changes on the semiconductor side. That is, although the height per se of the Schottky barrier corresponding to a potential discontinuous quantity at a junction boundary remains unchanged, the height of the Schottky barrier as viewed from a majority carrier on the semiconductor side changes. Thus, the majority carrier transported to the metal side beyond the Schottky barrier only by thermal energy appears depending on field conditions, and hence the current equivalent to this flows (forward characteristic) On the other hand, the height of the Schottky barrier as viewed from the carriers remains unchanged on the metal side that does not cause a large change in potential distribution even when the electric field is applied. That is, most of the carriers on the metal side still remain unchanged to such a state that they can exceed the Schottky barrier. Thus, even when the electric field is applied, the current based on the transportation of the carriers from the metal side to the semiconductor side remains unchanged in a short-circuited state and is approximately constant at a very low value (backward characteristic). Thus, the Schottky junction having the Schottky barrier normally has rectification that allows only the transportation of the carriers from the semiconductor side to the metal side. One that has utilized this rectifying action corresponds to the Schottky barrier diode.

It is understood from the above that the forward characteristics of the Schottky barrier diode are determined depending on the behavior of the majority carrier on the semiconductor side. Thus, the Schottky barrier diode has the feature that as compared with the normal pn-junction diode that utilizes the injection of a minority carrier, a voltage drop in the forward direction is small and switching to a high frequency is fast. The height of a Schottky barrier at a normal Schottky junction is lower than a diffusion potential at a pn junction. Thus, the Schottky barrier diode has the feature that the voltage at the rising edge of a current at the forward characteristics of the Schottky barrier diode is lower than at the pn junction diode. From these characteristics, the Schottky barrier diode is applied to such a driver that a high-speed switching operation at a high frequency/low-voltage is desired, as in the LCD driver starting with a standard logic IC, a power circuit for audio equipment, a switching power supply and the like.

A latch-up preventing circuit has heretofore been configured by a Schottky barrier diode manufactured as a discrete product and mounted onto its corresponding LCD driver in external form. On the other hand, according to the discussions of the present inventors et al., there have been demands or the like for a small size-chip solution of the LCD driver per se and its reduction in power consumption as trends in demand with a rapid increase in the mounting to a mobile communication terminal or the like. A technique for building the Schottky barrier diode in its corresponding LCD driver has been invented. It has been desired to realize an LCD driver brought into low power consumption in space-saving form at low cost by building a Schottky barrier diode into a chip for forming an LCD driver in particular.

A structure and manufacturing process or the like of a Schottky barrier diode formed over a semiconductor substrate have been disclosed in, for example, Japanese Unexamined Patent Publication No. 2006-310791 (patent document 1), Japanese Unexamined Patent Publication No. Hei 10(1998)-117002 (patent document 2) or Japanese Unexamined Patent Publication No. Hei 8(1996)-64845 (patent document 3) or the like.

SUMMARY OF THE INVENTION

However, the present inventors et al. have found out such a problem that the reliability of prevention of the latch-up is impaired, as a result of investigations or discussions of a technique for forming a Schottky barrier diode in the same semiconductor chip as an LCD driver. The details thereof will be shown below.

As described above, the Schottky barrier diode has been built into the LCD driver per se with the objective of preventing the introduction of it into a LCD driver main portion through which a backward current flows. Thus, the performance of backward characteristics indicative of rectification of a backward current corresponding to a function as an original diode becomes important in addition to forward characteristics indicative of rise voltage/low resistance characteristics that can offer high-speed switching performance at a low voltage.

Even when a backward voltage is applied to the Schottky barrier diode, a constant small current (saturated current) flows due to small carriers transported from the metal side to the semiconductor side on a stationary basis. When a higher backward voltage is kept applied, a large backward current (leakage current) starts to flow by the so-called zener effect and avalanche effect. The backward voltage at this time is called "breakdown voltage". Namely, it can be said that a Schottky barrier diode high in breakdown voltage is of such a device or element high in backward breakdown voltage that can offer a function for rectifying a backward current up to a higher backward voltage.

In this respect, the breakdown voltage of the Schottky barrier diode discussed by the present inventors et al. was about 15[V] in the Schottky barrier diode. This means that there is a margin of only 2[V] or so considering that a practically used voltage of an LCD driver whose introduction has been discussed by the present inventors et al. is in the vicinity of 13[V].

In a semiconductor device being under a manufacturing process, electrical conduction is generally attempted under conditions severer than its normal use in a test process executed at a stage close to its completion. Thus, a semiconductor device high in reliability is finally left behind by screening defective semiconductor devices. In the manufacturing process of the LCD driver discussed by the present inventors et al, a test for applying a voltage higher than a practically used voltage to each of LCD drivers collectively formed over a semiconductor wafer is performed to effect screening on each pre-shipment product.

However, in the Schottky barrier diode discussed by the present inventors et al. as described above, a margin up to a backward breakdown voltage is small as compared with the practically used voltage. Thus, it is not possible to apply a large test voltage with respect to the practically used voltage upon screening. This results only in the execution of screening low in effect. Thus, a problem that becomes a cause of degradation in the reliability of the semiconductor device has been found out by discussions of the present inventors et al.

Thus, it is an object of the present invention to provide a technique that enhances reliability in a semiconductor device equipped with a Schottky barrier diode within the same chip and its manufacturing technology.

The above and other objects and novel features of the present invention will become apparent from the description of the present specification and the accompanying drawings.

While a plurality of inventions are disclosed in the present application, a summary of one embodiment thereof will be explained in brief by way of example as follows:

The one embodiment includes a first well region of a second conductivity type opposite to a first conductivity type, which is formed over a main surface of a semiconductor substrate of the first conductivity type, a second conductivity type first semiconductor region higher in impurity concentration than the first well region, which is formed in part thereof, a first conductivity type second semiconductor region formed so as to surround the first semiconductor region in circular or ring form, a first conductor film formed so as to integrally cover the first semiconductor region and the second semiconductor region and to be electrically coupled thereto, a third semiconductor region formed outside the second semiconductor region with each separation portion left therebetween, and a second conductor film formed so as to cover the third semiconductor region and to be electrically coupled thereto. The first conductor film and the first semiconductor region are Schottky-coupled to each other.

An advantageous effect obtained by the one embodiment of the inventions disclosed in the present application will be explained in brief as a representative thereof as follows:

Since a backward breakdown voltage of a Schottky barrier diode can be raised, the reliability can be enhanced in a semiconductor device equipped with the Schottky barrier diode with the same chip and its manufacturing technology.

DETAILED DESCRIPTION OF THE PREFERRED EMBODIMENTS

Figure 1:
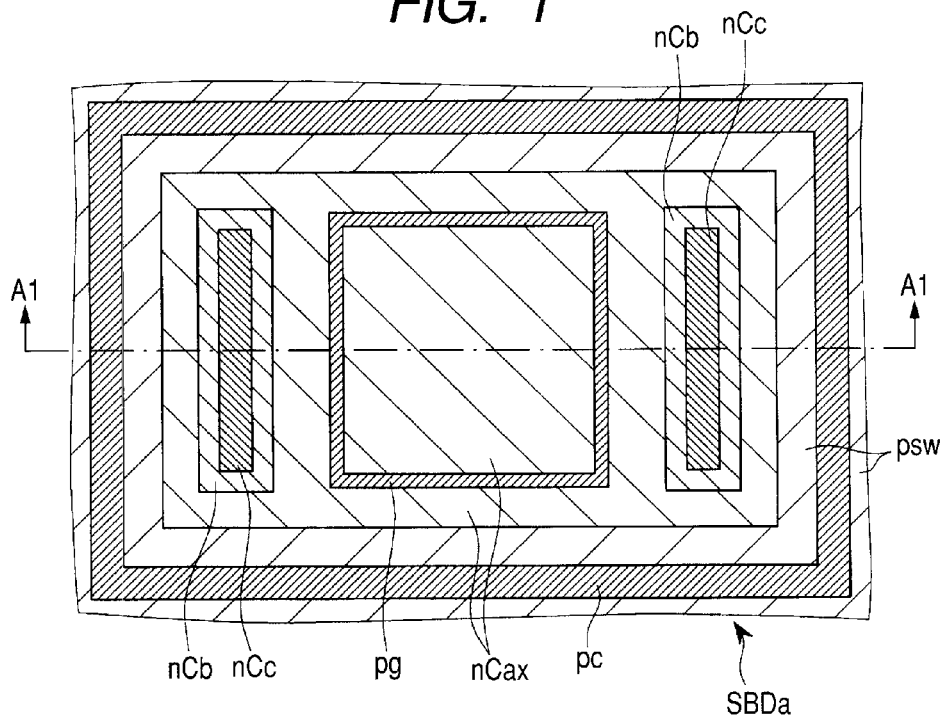
FIG. 1 is a fragmentary plan view of a semiconductor device discussed by the present inventors et al.

The invention will be described by being divided into a plurality of sections or embodiments whenever circumstances require it for convenience in the following embodiments. However, unless otherwise specified in particular, they are not irrelevant to one another. One thereof has to do with modifications, details and supplementary explanations of some or all of the other. When reference is made to the number of elements or the like (including the number of pieces, numerical values, quantity, range, etc.) in the following embodiments, the number thereof is not limited to a specific number and may be greater than or less than or equal to the specific number unless otherwise specified in particular and definitely limited to the specific number in principle. It is also needless to say that components (including element or factor steps, etc.) employed in the following embodiments are not always essential unless otherwise specified in particular and considered to be definitely essential in principle. Similarly, when reference is made to the shapes, positional relations and the like of the components or the like in the following embodiments, they will include ones substantially analogous or similar to their shapes or the like unless otherwise specified in particular and considered not to be definitely so in principle, etc. This is similarly applied even to the above-described numerical values and range. Elements or components each having the same function in all the drawings for describing the embodiments are respectively given the same reference numerals, and their repetitive explanations are omitted where possible. Preferred embodiments of the present invention will hereinafter be explained in detail based on the accompanying drawings.

First Preferred Embodiment

Problems found in a configuration of a Schottky barrier diode discussed by the present inventors et al., and its electrical characteristics will first be explained.

Figure 2:
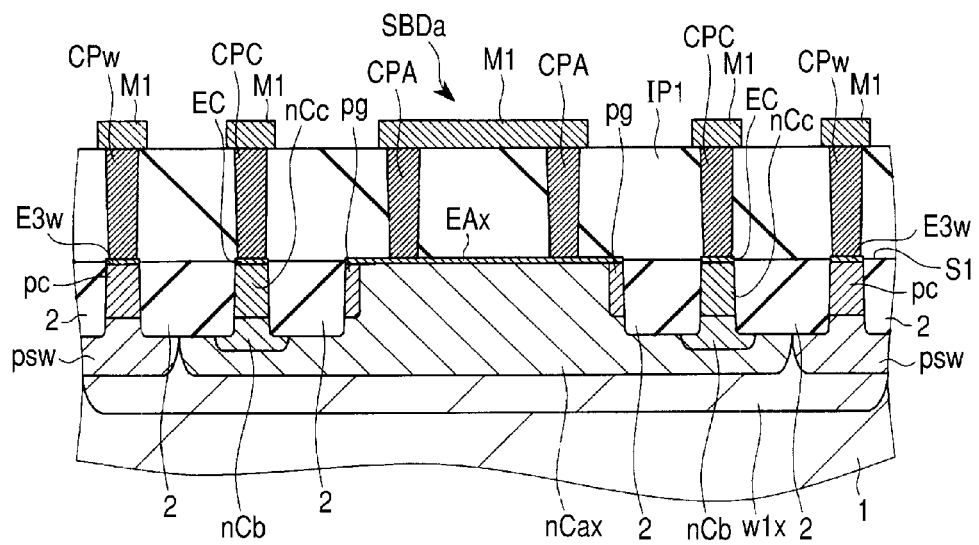
FIG. 2 is a fragmentary sectional view taken along line A1-A1 of the semiconductor device shown in FIG. 1.

During a manufacturing process of a semiconductor device, for example, a high-purity and monocrystalline semiconductor material with silicon (Si) or the like as a base material is normally handled in a state of a plane approximately-circular thin plate called "wafer". A main surface thereof is divided into areas or regions each brought to a semiconductor chip, and similar device or element groups are collectively formed in a large number of chip areas, whereby semiconductor chips each provided with a semiconductor integrated circuit having a desired circuit function are formed. The Schottky barrier diode discussed by the present inventors et al., is formed within the same chip as a semiconductor chip which forms an LCD driver. FIG. 1 shows a plan view of a Schottky barrier diode SBDa formed within the semiconductor chip. FIG. 2 shows a sectional view taken along line A1-A1 of FIG. 1. Incidentally, some hatching in the plan view of FIG. 1 is provided for convenience and does not have a specific meaning in configuration. Only semiconductor regions are shown in the plan view of the same FIG. 1, and a metal conductor film, an insulation isolating or separating portion and a metal electrode are omitted therefrom. Configurations or components of these omitted spots or parts will be explained in detail with reference to the sectional view of FIG. 2.

A separation or isolation portion 2 is formed in a main surface S1 of a semiconductor substrate 1 of p type (first conductivity type). Various semiconductor devices or elements (not shown) starting with the Schottky barrier diode SBDa are formed in an active area or region defined by the isolation portion. Here, the p type indicates that III-group impurities that can lead to acceptors, like, for example, boron (B) and the like are contained in a semiconductor material whose base material is of silicon corresponding to the IV-group element, or a semiconductor region, and majority carriers are positive holes. The following are similar unless otherwise specified. The isolation portion 2 corresponds to, for example, a trench type isolation portion called so-called STI (Shallow Trench Isolation), which is formed by embedding an insulating film comprised of silicon oxide or the like in a shallow trench formed in the main surface S1 of the semiconductor substrate 1.

A p-well region w1x corresponding to a p-type semiconductor region is formed in the main surface S1 of the semiconductor substrate 1. The Schottky barrier diode SBDa corresponding to one element or device is formed therein.

An n-type cathode region nCax corresponding to a semiconductor region of n type (second conductivity type) in which majority carriers are electrons, is formed in the p-well region w1x. Here, the n type indicates that V-group impurities that can lead to donors, like, for example, phosphorus (P) and arsenic (As) or the like are contained in the semiconductor material whose base material is of silicon corresponding to the IV-group element, or the semiconductor region, and majority carriers are electrons. The following are similar unless otherwise specified.

The n-type cathode region nCax forms the semiconductor side of the Schottky junction in the Schottky barrier diode SBDa, i.e., the cathode side into which current flows. An anode conductor film EAx is formed at part of the main surface S1 of the semiconductor substrate 1 in the n-type cathode region nCax. The anode conductor film EAx is assumed to be, for example, a conductor film with cobalt silicide ($CoSi_x$) corresponding to a compound of silicon and cobalt (Co) as a principal part or body. The anode conductor film EAx forms the metal side of the Schottky junction in the Schottky barrier diode SBDa, i.e., the anode side from which current flows out. The n-type cathode region nCax and the anode conductor film EAx are assumed to be electrically coupled to each other by the Schottky junction. The electrical coupling by the Schottky junction is simply described as Schottky coupling.

A p-type guard ring region (second semiconductor region) pg corresponding to a p-type semiconductor region is formed in the n-type cathode region nCax located below the end of the anode conductor film EAx. The p-type guard ring region pg is formed for the purpose of relaxing the effect of a reduction in breakdown voltage due to the concentration of an electric field that occurs at the end of a Schottky junction surface when the voltage is applied to the Schottky barrier diode SBDa. This effect will be explained in detail in the subsequent section of the evaluation of electrical characteristics.

With such a configuration as described above, the anode conductor film EAx is formed in the main surface S1 of the semiconductor substrate 1 in such a manner as to integrally cover the n-type cathode region nCax and the p-type guard ring region pg and to be electrically coupled to the two, particularly, to be Schottky-coupled to the n-type cathode region nCax.

The following configuration is provided to take electrical coupling to the n-type cathode region nCax. That is, n-type cathode conductive or conduction regions (third semiconductor region) nCb each corresponding to an n-type semiconductor region higher in impurity concentration (i.e., lower in resistance) than the n-type cathode region nCax, are formed at part of the n-type cathode region nCax. The n-type cathode conduction regions nCb are formed outside the p-type guard ring region pg corresponding to the end of the Schottky junction with the isolation portion 2 spaced therebetween. In order to provide electrical coupling to the n-type cathode conduction regions nCb, a cathode conductor film (second conductor film) EC is formed so as to covert the main surface S1 of the semiconductor substrate 1 and the surface of the n-type cathode conduction regions nCb. Here, n-type semiconductor regions nCc higher in impurity concentration may be formed to implement ohmic coupling between the n-type cathode conduction regions nCb and the cathode conductor film EC. The cathode conductor film EC needs to be a material for realizing ohmic coupling to the n-type cathode conduction regions nCb or the n-type semiconductor regions nCc. The cathode conductor film EC may be, for example, a cobalt silicide film formed in a manner similar to the anode conductor film EAx, a silicide compound with other elements such as tungsten (W), nickel (Ni) and the like, or a conductor film comprised of a singular or simple metal element such as aluminum (Al), copper (Cu) or the like.

A plurality of conductive portions and wirings are formed in the main surface S1 of the semiconductor substrate 1 having the above configuration. An interlayer insulating film IP1 for insulating these is formed therein. Anode contact plugs (first conductive portion) CAP are formed so as to penetrate the interlayer insulating film IP1 and be electrically coupled to the anode conductor film EAx. Thus, the anode conductor film EAx can be made electrically conductive to the metal side of the Schottky barrier diode SBDa, i.e., the anode side. Similarly, cathode contact plugs (second conductive portion) CPC are formed so as to penetrate the interlayer insulting film IP1 and be electrically coupled to the cathode conductor film EC. Thus, the cathode conductor film EC can be made electrically conductive to the semiconductor side of the Schottky barrier diode SBDa, i.e., the cathode side.

With the above configuration, the basic or elemental components of the Schottky barrier diode SBDa have been described above. In addition to the above, the semiconductor device discussed by the present inventors et al. has the following configuration. That is, it is a so-called well power-feeding portion for applying the voltage to the p-well region w1x formed with the Schottky barrier diode SBDa. In order to make electrical conduction to the p-well region w1x, a p-type well power-feeding region (fourth semiconductor region) psw corresponding to a p-type semiconductor region is formed in the main surface S1 of the semiconductor substrate 1 in the p-well region w1x so as to surround the n-type cathode region nCax in annular form.

In order to make electrical coupling to the p-type well power-feeding region psw, a well power-feeding conductor film (third conductor film) E3w is formed so as to cover the main surface S1 of the semiconductor substrate 1, i.e., the surface of the p-type well power-feeding region psw. Here, a p-type semiconductor region pc higher in impurity concentration may be formed to realize ohmic coupling between the p-type well power-feeding region psw and the well power-feeding conductor film E3w. A material for forming the well power-feeding conductor film E3w makes use of one similar to the cathode conductor film EC, for example. Well power-feeding contact plugs (third conductive portion) CPw are formed so as to penetrate the interlayer insulating film IP1 and be electrically coupled to the well power-feeding conductor film E3w.

A plurality of field effect transistors (FETs) and the like that form an integrated circuit for fulfilling a desired function are formed over the semiconductor substrate 1 in the semiconductor chip formed with the Schottky barrier diode SBDa of the above configuration. Thus, in order to wire these, a first wiring layer M1 is formed so as to be electrically coupled to the respective contact plugs CPA, CPC and CPw electrically conductive to the principal component parts of the Schottky barrier diode SBDa. The first wiring layer M1 is assumed to be comprised of, for example, Al or Cu or the like.

Figure 3:
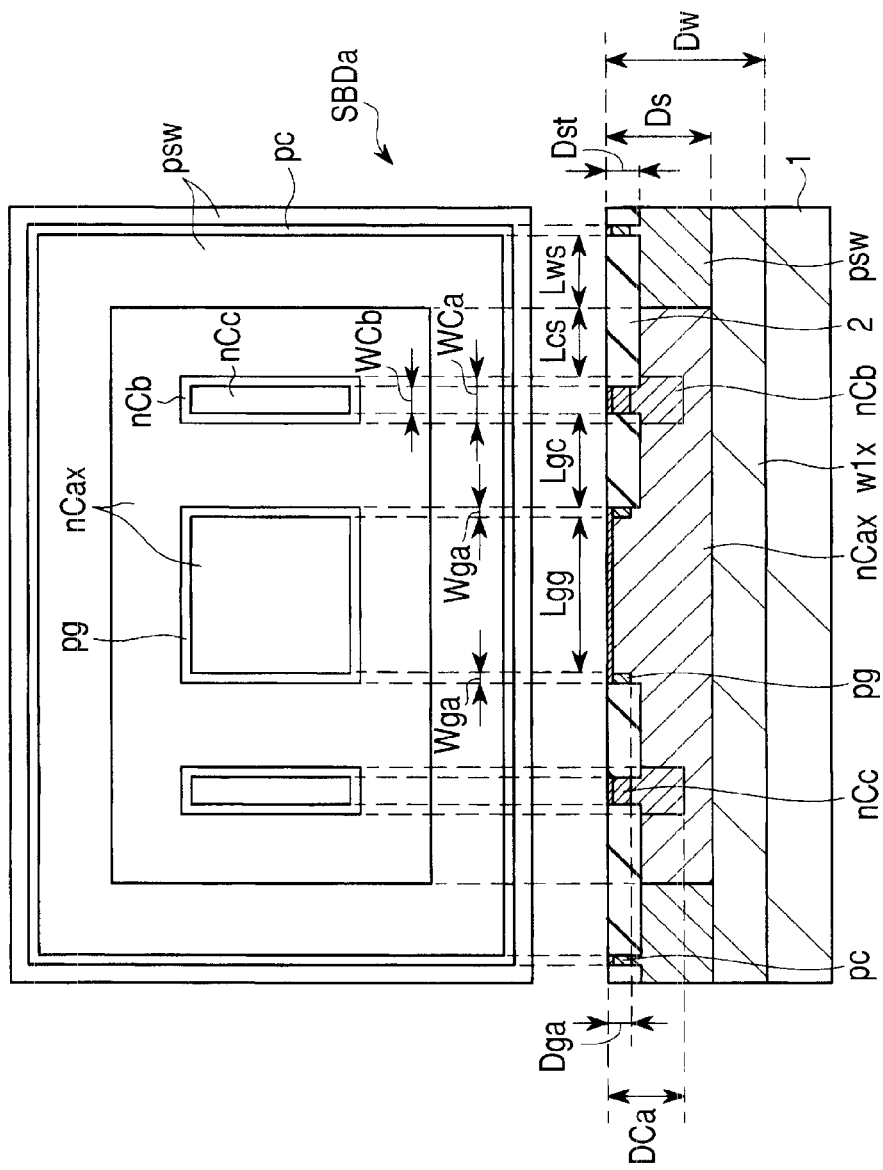
FIG. 3 is an explanatory view showing dimensions of respective semiconductor regions in the semiconductor device shown in FIG. 1.

A summary of examples illustrative of plane dimensions and depth dimensions of the respective semiconductor regions as to the Schottky barrier diode SBDa of the above configuration, which has been discussed by the present inventors et al. is shown in FIG. 3. As examples at typical or representative spots or places of the dimensions in the plane direction of the semiconductor substrate 1, there may be mentioned a cathode region width WCa=1.5 [μm], a cathode electrode width WCb=0.86 [μm], a guard ring width Wga=0.32 [μm], a guard ring-to-guard ring distance Lgg=5 [μm], a guard ring/cathode distance Lgc=2.68 [μm], a cathode/power-feeding portion distance Lcs=2.2 [μm] and a well/power-feeding portion distance Lws=2.31 [μm]. As examples at representative spots of the dimensions in the depth direction of the semiconductor substrate 1, there may be mentioned a well depth Dw=5 [μm], a power-feeding portion depth Ds=1.1 [μm], a cathode depth DCa=0.8 [μm] a separation portion depth Dst=0.35 [μm] and a guard ring depth Dga=0.25 [μm].

Problems have been found in the electrical characteristics of the Schottky barrier diode SBDa of the above configuration by the evaluation of the present inventors et al. They will be explained below in detail.

Figure 4:
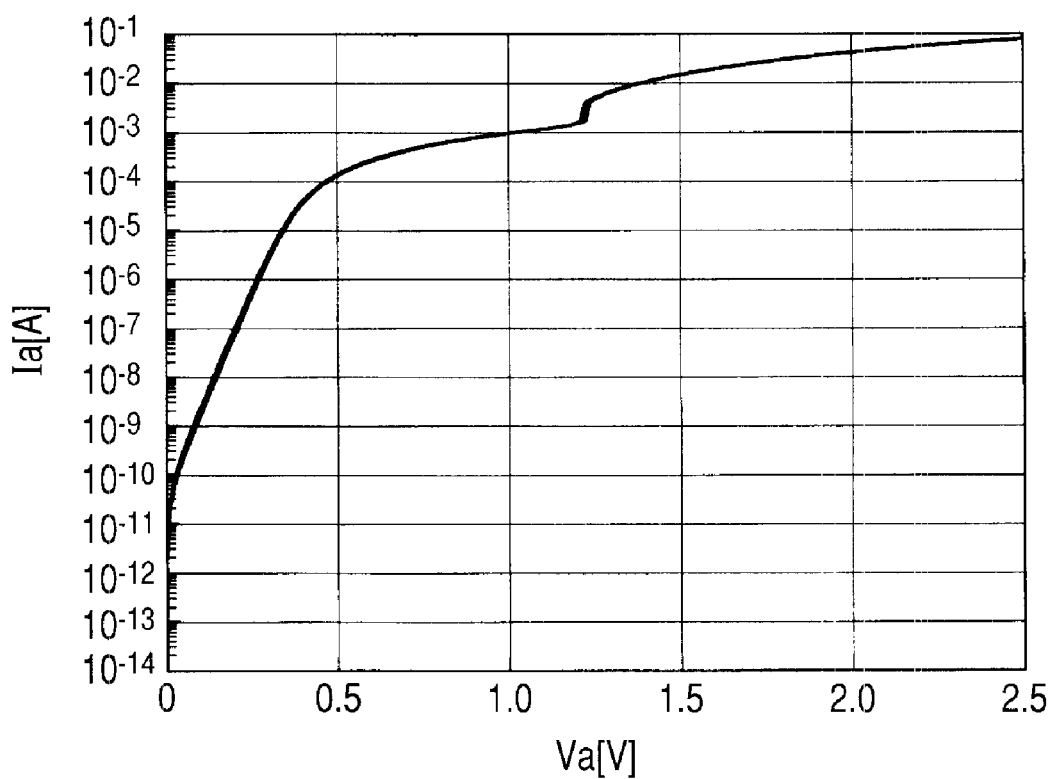
FIG. 4 is a graph diagram showing the relationship between a forward voltage and current at electrical characteristics of the semiconductor device discussed by the present inventors et al.
Figure 5:
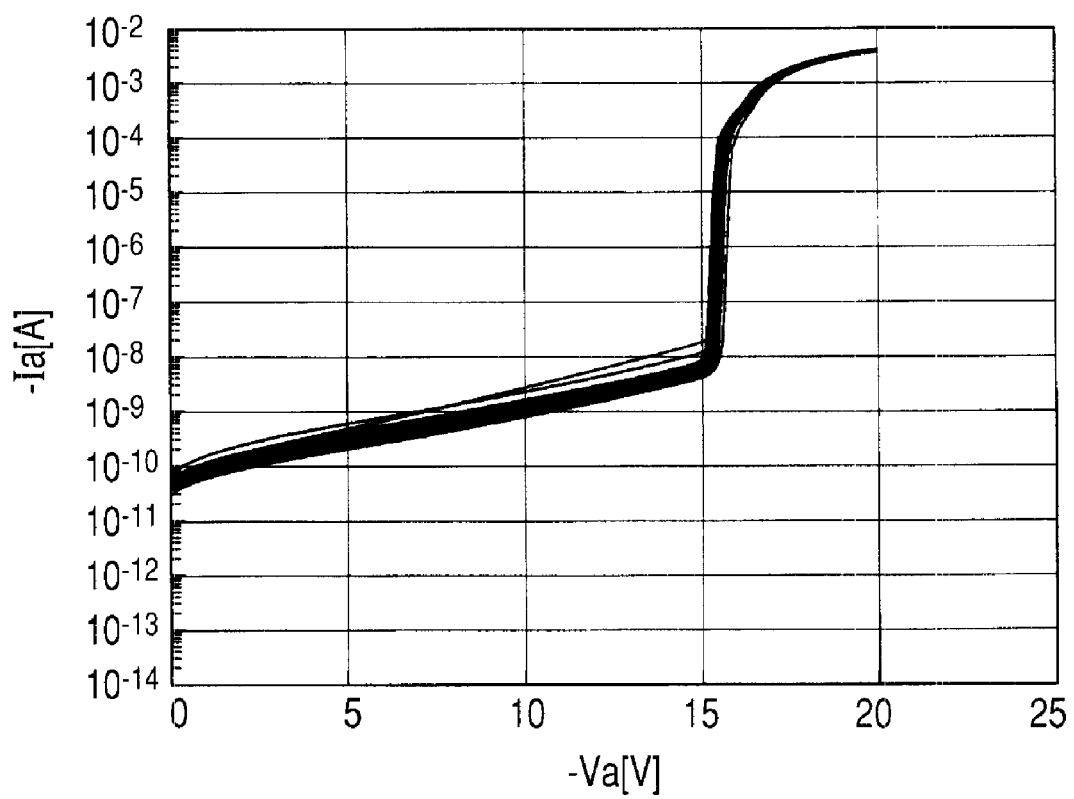
FIG. 5 is a graph diagram illustrating the relationship between a backward voltage and current at the electrical characteristics of the semiconductor device discussed by the present inventors et al.

Results obtained by measuring voltages Va applied between the anode contact plugs CPA and the cathode contact plugs CPC, and currents Ia that flow between the anode conductor film EAx and the n-type cathode region nCax at this time are shown in FIGS. 4 and 5 as the electrical characteristics of the Schottky barrier diode SBDa discussed by the present inventors et al. FIG. 4 shows current Ia-voltage Va characteristics where the voltages Va are applied in such a manner that the anode conductor film EAx becomes positive. FIG. 5 shows current Ia-voltage Va characteristics where the voltages Va are applied in the direction opposite to the positive direction. Unless otherwise specified, the electrical characteristics at the time that such voltages as descried in the former are applied, and the electrical characteristics at the time that such voltages as descried in the latter are applied, are respectively described below as forward characteristics and backward characteristics throughout all embodiments.

According to the present inventors et al., a plurality of Schottky barrier diodes SBDa are formed over the same semiconductor chip or the same semiconductor wafer in accordance with the same process, and a plurality of electrical characteristics obtained from these Schottky barrier diodes SBDa are shown in FIGS. 4 and 5 collectively. The value of each voltage Va at the measurement of the forward characteristic and the direction of a current Ia that flows at this time are respectively assumed to be positive values. In the graph diagram 5 illustrative of the backward characteristics, both each voltage Va and current Ia are respectively represented as negative absolute values. Unless otherwise specified, the electrical characteristics of the Schottky barrier diode according to the present embodiment are shown similarly subsequently. Incidentally, the voltage applied to the p-well region w1x through each well power-feeding contact plug CPw is assumed to be −13[V] with respect to a ground potential.

The forward characteristic is of a characteristic early in the rising edge in a manner similar to the characteristic of a general Schottky barrier diode SBDa. Described more quantitatively, when, e.g., the voltage Va=0.3[V], the value of current Ia=1.0×10$^{-5}$ [A] or so is obtained. According to the discussion by the present inventors et al, the present characteristic meets the demand as the forward characteristic of the Schottky barrier diode capable of fulfilling the intended function in the LCD driver.

At each backward characteristic, however, a backward current starts to flow suddenly from the time when the backward voltage exceeds Va=15[V], so that the rectification of the diode is lost. Namely, it can be said that the breakdown voltage of the Schottky barrier diode SBDa discussed by the present inventors et al. is about 15[V]. This means that only 2[V] or so is obtained as the margin considering that an actually-used voltage is 13[V] or so. Thus, when the margin from the actually-used voltage is low, the voltage at screening cannot be applied greatly, thereby leading to a reduction in the accuracy of detection of each defective chip and a reduction in the reliability of a semiconductor device.

Figure 6:
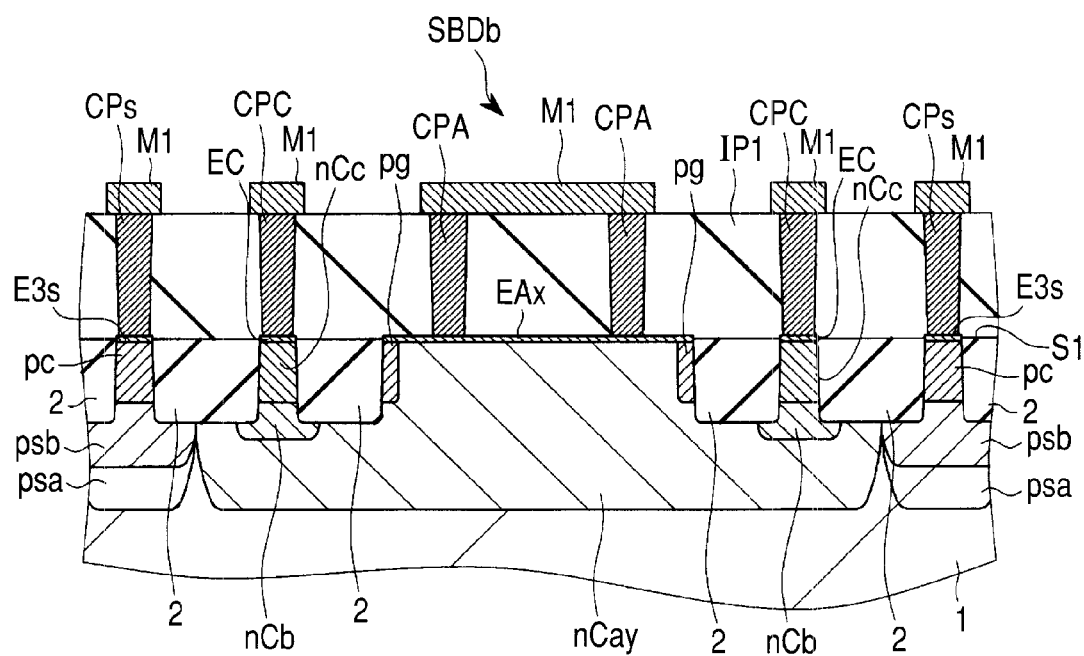
FIG. 6 is a fragmentary sectional view of another semiconductor device discussed by the present inventors et al.

Therefore, the present inventors et al. further have discussed a Schottky barrier diode SBDa having the following structure. A fragmentary sectional view of the Schottky barrier diode SBDb of other structure discussed by the present inventors et al. is shown in FIG. 6. This corresponds to a spot or location similar to FIG. 2. The present Schottky barrier diode is different from the Schottky barrier diode SBDa described using FIG. 2 in that an impurity concentration of an n-type cathode region nCay is set to a value lower than that of the n-type cathode region nCax.

In the Schottky barrier diode SBDa described using FIG. 2, the n-type cathode region nCax formed with the basic configuration of the Schottky barrier diode SBDa is formed within the p-well region w1x. On the other hand, in another Schottky barrier diode SBDb discussed by the present inventors et al, which will be explained using FIG. 6, the n-type cathode region nCay is formed so as to be directly bonded or joined to a semiconductor substrate 1 corresponding to a p type, and its junction boundary is formed so as to become deep to the same degree as the above p-type well region w1x. This is done to prevent the generation of a leak current due to a so-called punch through, resulting from the fact that the extension of a depletion layer at the application of each backward voltage reaches a bedding p-type region (p-type semiconductor substrate 1 in this case).

Since the n-type cathode region nCay is directly formed in the p-type semiconductor substrate 1 as described above, the well power-feeding portion described in FIG. 2 is substituted with a substrate power-feeding portion in FIG. 6. Namely, p-type substrate power-feeding regions (fourth semiconductor region) psa and psb of two layers each corresponding to a p-type semiconductor region are provided in such a manner that power can be fed to the semiconductor substrate 1 corresponding to the bedding p-type region of the n-type cathode region nCay formed with another Schottky barrier diode SBDb discussed by the present inventors et al. Here, the two-layer structure is made to share the roles of the p-type substrate power-feeding region psa of low impurity concentration targeted for separation, and the p-type substrate power-feeding region psb of high impurity concentration, which is a relatively low resistance for electrically coupling to the power-feeding portion. Further, substrate power-feeding conductor films (third conductor film) E3s for electrically coupling to the p-type substrate power-feeding regions psa and psb are formed and substrate power-feeding contact plugs (third conductive portion) CPs are formed to be electrically coupled thereto.

Since another Schottky barrier diode SBDb discussed by the present inventors et al. is similar in configuration to the previously-described Schottky barrier diode SBDa previously discussed by the present inventors et al. except for the spots or locations specially mentioned above, its detailed explanations will be omitted here.

The present inventors et al. have discussed the structure of the Schottky barrier diode SBDb having the n-type cathode region nCay low in impurity concentration for the purpose of an improvement in backward breakdown voltage in terms of the following consideration.

It is generally known that when a backward voltage is applied to a diode, a sudden or abrupt leak current starts to flow after a breakdown voltage due to the avalanche and zener effects. The former is to cause a large backward current by the effect of, when a change in the electric field in a depletion layer due to a high backward voltage is made steep, accelerating carries injected slightly beyond a barrier to collide with a lattice, bringing the same into ionization (impact ionization) and allowing the produced carriers to further cause similar impact ionization, thereby increasing conductive carries on an avalanche amplification basis. Similarly, the latter is to cause a backward current by the fact (tunnel effect) that when a change in the electric field in a depletion layer due to a high backward voltage is made steep, a forbidden bandwidth of each carrier as viewed in a drift direction becomes thinner and the probability of existence of the carriers is not brought to 0 even on the semiconductor side beyond a forbidden band due to filtering of a wave function.

According to the discussions of the present inventors et al., it has been understood that the above effects are apt to occur particularly at the end of the Schottky junction surface on which the electric field concentrates. Thus, in the Schottky barrier diode SBDa previously discussed by the present inventors et al., which has been described using FIGS. 1 and 2, the p-type guard ring region pg was provided to relax the effect of the reduction in the backward breakdown voltage due to the field concentration by providing a pn junction other than the Schottky junction at the end of the Schottky junction surface. This is because the pn junction corresponding to a semiconductor material of the other of two junction materials is generally higher in backward breakdown voltage than the Schottky junction corresponding to a metal material of one thereof.

However, the backward breakdown voltage was not obtained sufficiently even in the case of the Schottky barrier diode SBDa provided with the p-type guard ring region pg as described above. Therefore, the present inventors et al. have considered that the impurity concentration of each semiconductor region that contributes to the junction may be reduced to effectively fulfill the function of the p-type guard ring region pg.

This is because when the impurity concentration of the semiconductor region is low, there is a need to ionize impurity atoms to a broader area or region to obtain the same amount of storage carriers, and the depletion layer is spread up to a deeper region of the junction surface. Thus, the present inventors et al. have considered that since the factors of the avalanche and zener effects are of the abrupt change in the electric field in the depletion layer due to the backward voltage, spreading the depletion layer longer is of effective means for reducing the electric field.

Figure 7:
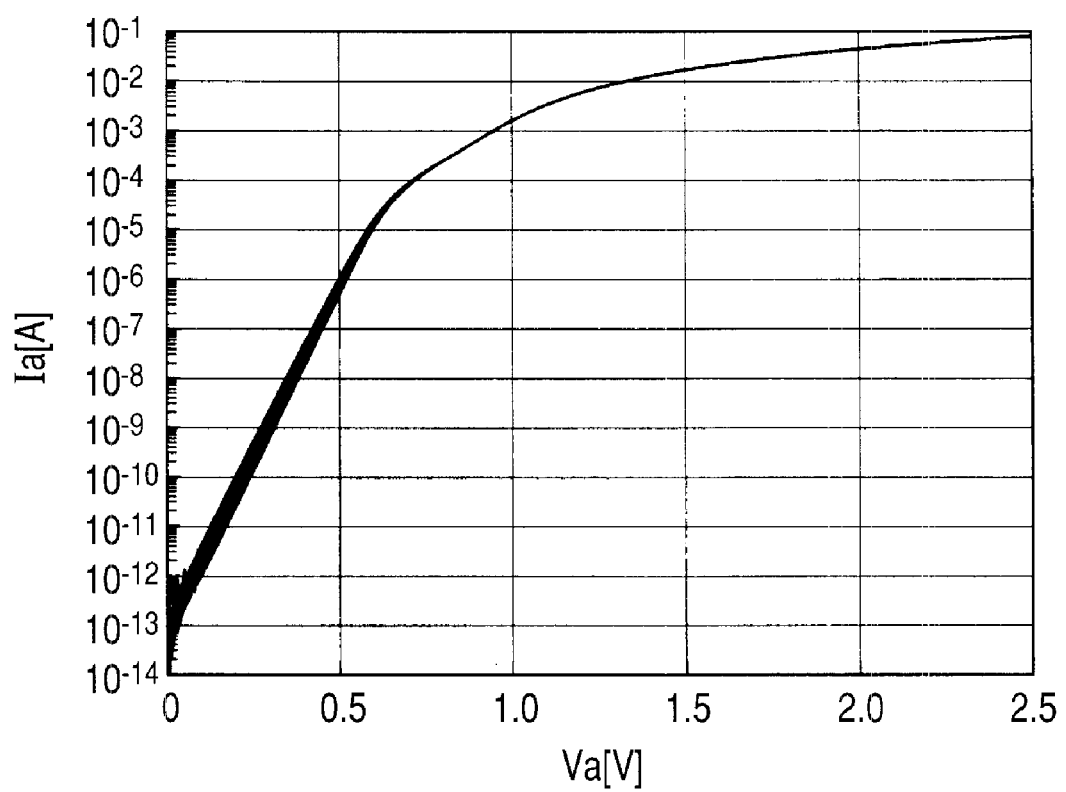
FIG. 7 is a graph diagram showing the relationship between a forward voltage and current at electrical characteristics of another semiconductor device discussed by the present inventors et al.
Figure 8:
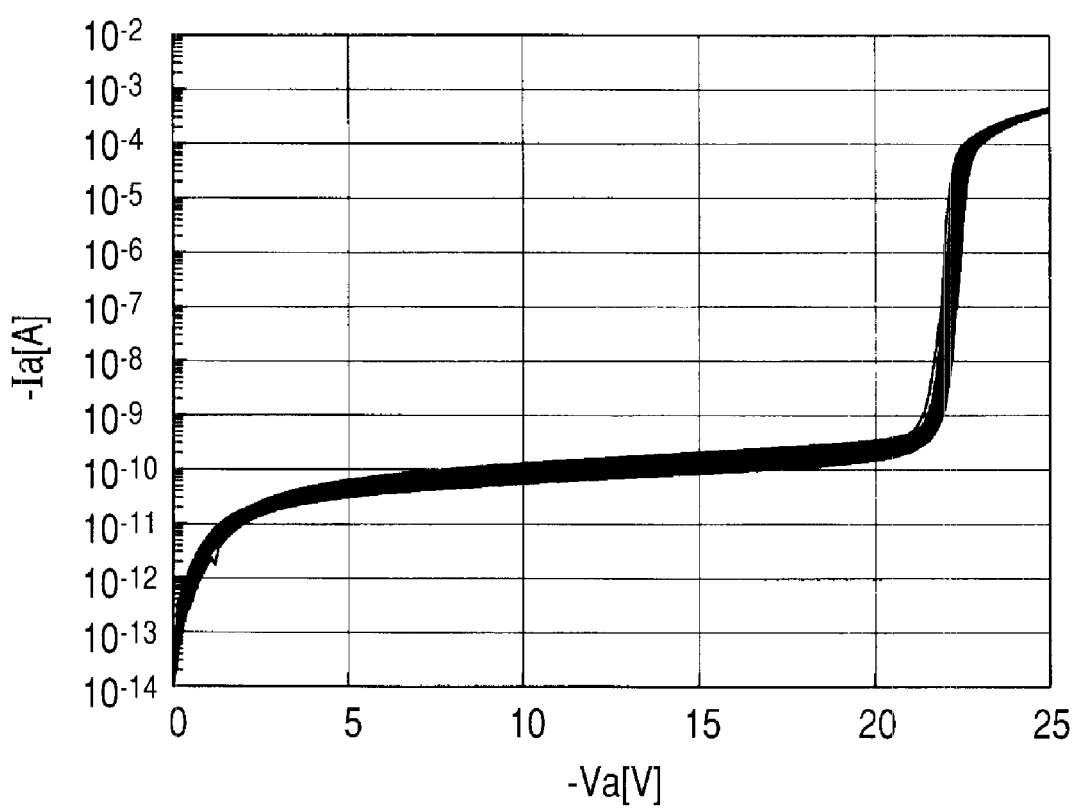
FIG. 8 is a graph diagram showing a backward voltage and current at the electrical characteristics of another semiconductor device discussed by the present inventors et al.

Actually, the present inventors et al. have measured the electrical characteristics of the Schottky barrier diode SBDb having the n-type cathode region nCay low in impurity concentration. Forward characteristics are shown in FIG. 7 and backward characteristics are shown in FIG. 8.

Since the rise in the breakdown voltage at each backward characteristic has been given here as the problem to be discussed or examined, the backward characteristics will first be referred to. As shown in FIG. 8, a breakdown at which current starts to flow suddenly at the backward characteristics, occurs in the neighborhood of a backward voltage Va=22 to 23[V]. It is found that an improvement is made as compared with the Schottky barrier diode SBDa having the breakdown voltage of about 15[V] shown in FIG. 5. A margin of 10[V] or so is allowed as compared with the practically-used voltage 13[V] being discussed by the present inventors et al.

On the other hand, looking at the forward characteristic (FIG. 7), the current assumes a value of $Ia=1.0\times10^{-9}$ [A] when the forward voltage is in the neighborhood of Va=0.3 [V]. This is brought to a value low by four digits as compared with the Schottky barrier diode SBDa having the $Ia=1.0\times10^{-5}$ [A] shown in FIG. 4. One of major advantages resides in that the Schottky barrier diode is used without using the pn junction diode because the Schottky barrier diode is early in rising edge at the forward characteristic and can handle large current at a low voltage (that is, it is of a low resistance). Accordingly, here, a new problem that although the improvement in the breakdown voltage at each backward characteristic can be attained, the low voltage operation indicative of the advantage at the forward characteristic cannot be implemented, has been found in another Schottky barrier diode SBDb discussed by the present inventors et al.

As a result of discussions by the present inventors et al. as described above, such an n-type semiconductor region low in impurity concentration that the depletion layer can be more spread in the semiconductor has been set as the cathode to enhance the breakdown voltage relative to the backward voltage. However, the reduction in the impurity concentration of the cathode means a reduction in the absolute number of majority carriers simultaneously. It results in a main factor that causes a reduction in current value for the Schottky barrier diode whose characteristics are determined depending on the behaviors of the majority carriers.

That is, it has been found out by the above series of discussions by the present inventors et al. that since the low rising voltage in the forward direction and the holding of the low resistance characteristics, and the improvement in the backward breakdown voltage are placed in a trade-off relationship in the Schottky barrier diode formed over the semiconductor substrate, it is difficult to solve the problems.

A semiconductor device according to the first preferred embodiment will next be explained.

The semiconductor device according to the first preferred embodiment of the present invention is equivalent to one in which an integrated circuit based on a plurality of field effect transistors and the like, and a Schottky barrier diode are formed in the same semiconductor chip, as an LCD driver which can manifest desired functions.

Figure 9:
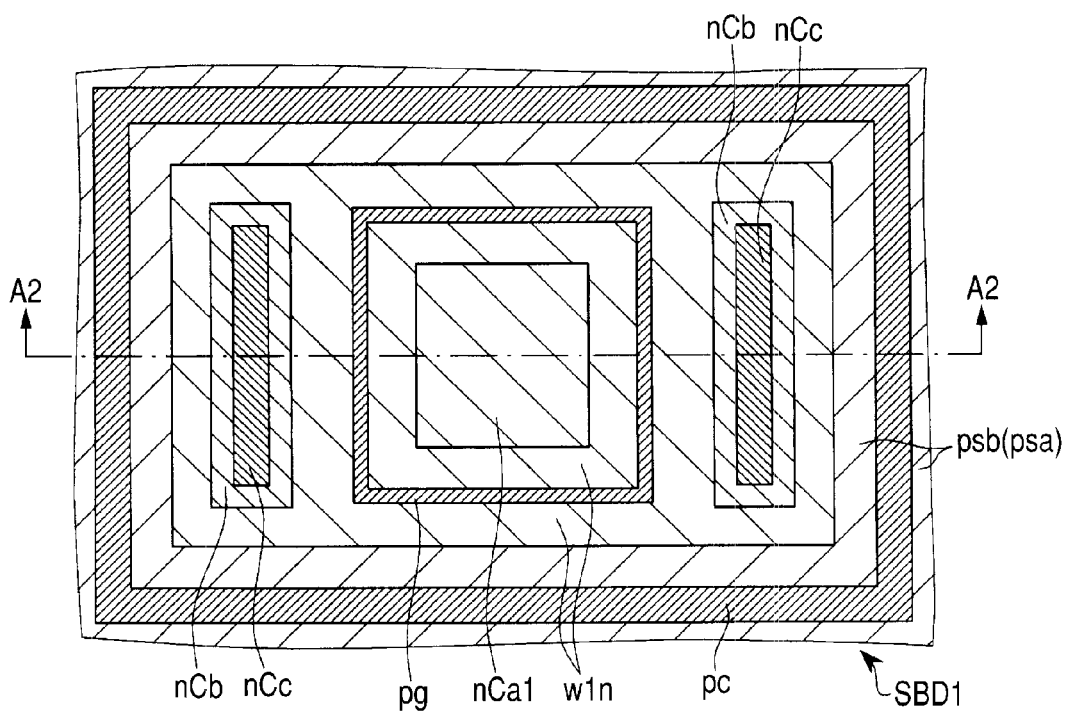
FIG. 9 is a fragmentary plan view of a semiconductor device showing a first preferred embodiment of the present invention.
Figure 10:
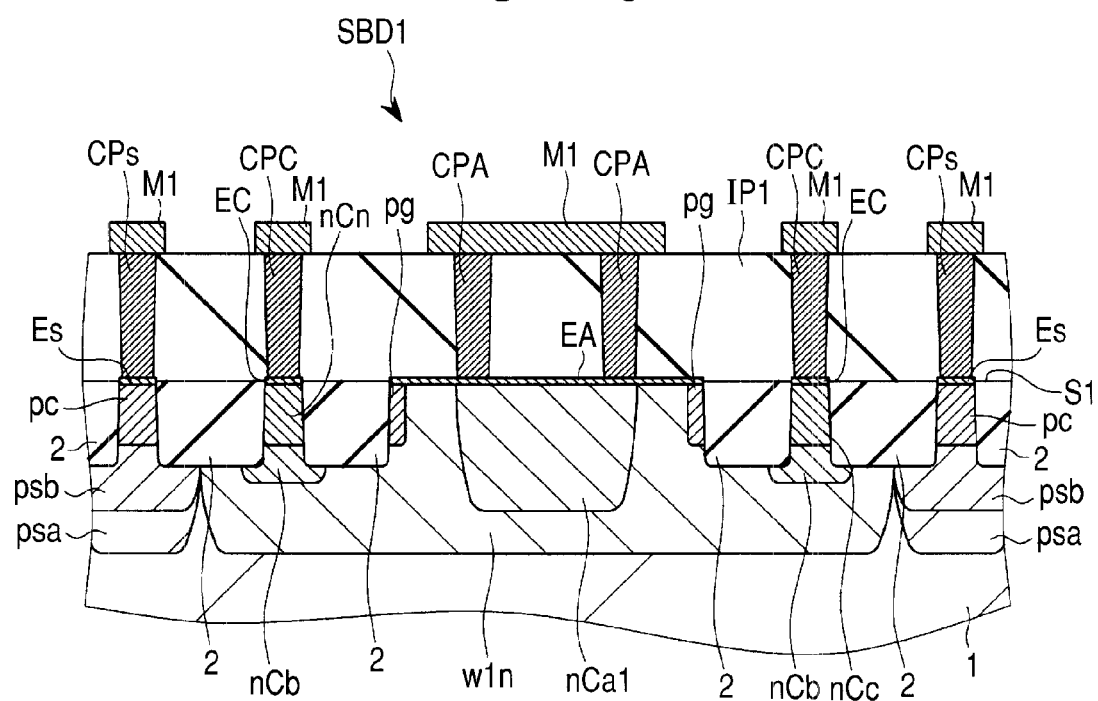
FIG. 10 is a fragmentary sectional view taken along line A2-A2 of the semiconductor device shown in FIG. 9.

FIG. 9 shows a plan view of a Schottky barrier diode SBD1 formed within the semiconductor chip. FIG. 10 shows a sectional view taken along line A2-A2 of FIG. 9. A configuration of the Schottky barrier diode SBD1 illustrated by the first preferred embodiment will hereinafter be described in detail using FIGS. 9 and 10. However, the present Schottky barrier diode SBD1 is similar to the Schottky barrier diodes SBDa and SBDb described using FIGS. 1, 2 and 6, which have previously been discussed by the present inventors et al., except for components specially mentioned below, and its dual explanations will therefore be omitted.

An isolation or separation portion 2 is formed in a main surface S1 of a semiconductor substrate 1 comprised of p-type monocrystalline silicon in which majority carriers are positive holes. Various semiconductor devices or elements (not shown) starting with the Schottky barrier diode SBD1 are formed in an active area or region defined by the separation portion 2.

An n-well region (first well region) win corresponding to an n-type semiconductor region is formed in the main surface S1 of the semiconductor substrate 1. The Schottky barrier diode SBD1 corresponding to one element or device is formed therein.

An n-type cathode region nCa1 (first semiconductor region) corresponding to a semiconductor region of n type is formed in part of the main surface S1 of the semiconductor substrate 1 within the n-well region w1n. As will be described in detail later, the n-type cathode region nCa1 forms the semiconductor side of a Schottky junction, i.e., the cathode side into which current flows. Here, the n-type cathode region nCa1 has an impurity concentration of the same degree as the n-type cathode region nCax in the Schottky barrier diode SBDa discussed by the present inventors et al, which has been described using FIGS. 1 and 2. The n-well region win has an impurity concentration of the same degree as the n-type cathode region nCay in the Schottky barrier diode SBDb discussed by the present inventors et al, which has been described using FIG. 6. That is, the impurity concentration of the n-type cathode region nCa1 is higher than that of the n-well region w1n.

Further, a p-type guard ring region (second semiconductor region) pg corresponding to a p-type semiconductor region, which has been formed in the main surface S1 of the semiconductor substrate 1, is formed within the n-well region win so as to surround the n-type cathode region nCa1 in circular form. At this time, the n-type cathode region nCa1 and the p-type guard ring region pg are formed so as not to contact each other at a distance.

Here, an anode conductor film (first conductor film) EA is formed in the surface lying within circularity of a p-type guard ring region pg formed in circular form, which surface lies in the main surface S1 of the semiconductor substrate 1 and includes the p-type guard ring region pg. With such a configuration, the anode conductor film EA is formed within the n-well region win so as to cover the p-type guard ring region pg and the n-type cathode region nCa1 formed within its circularity in integral manner. The anode conductor film EA is used as a conductor film or the like with, for example, cobalt silicide as a principal part or body and is formed so as to be electrically coupled to the n-type cathode region nCa1 and the p-type guard ring region pg respectively.

In particular, electrical coupling of the n-type cathode region nCa1 and the anode conductor film EA is of Schottky coupling. Thus, the anode conductor film EA forms the metal side of the Schottky junction, i.e., the anode side into which current flows out, over the n-type cathode region nCa1. The p-type guard ring region pg is formed below the end of the anode conductor film EA. This is formed for the purpose of relaxing the effect of a reduction in backward breakdown voltage, which is caused by the concentration of an electric field that occurs at the end of a Schottky junction surface.

Further, n-type cathode conduction regions (third semiconductor region) nCb, n-type semiconductor regions nCc and a cathode conductor film (second conductor film) EC are respectively formed outside the p-type guard ring region pg with the separation portion 2 spaced therebetween in order to make electrical coupling to the n-type cathode region nCa1. These respectively have characteristics similar to those for the components with the same reference numerals at the Schottky barrier diodes SBDa and SBDb discussed by the present inventors et al. which have been described using FIGS. 2 and 6. Their detailed explanations will therefore be omitted herein.

Anode contact plugs (first conductive portion) CPA and cathode contact plugs (second conductive portion) CPC insulated from each other by an interlayer insulating film IP1 are formed to make electrical conduction to the anode conductor film EA and the cathode conductor film EC. These components respectively have characteristics similar to those for the components with the same reference numerals at the Schottky barrier diodes SBDa and SBDb discussed by the present inventors et al. in a manner similar to the above.

Further, the following configurations or components targeted for element or device separation and substrate power-feeding are formed in the first preferred embodiment. That is, p-type substrate power-feeding regions (fourth semiconductor region) psa and psb of two layers different in impurity concentration, a p-type semiconductor region pc, a substrate power-feeding conductor film (third conductor film) Es and substrate power-feeding contact plugs (third conductive portion) CPs are formed so as to circularly cover the outside of the n-well region win that forms a main or principal portion of the Schottky barrier diode SBD1. A first wiring layer M1 is formed so as to be electrically coupled to the respective contact plugs CPA, CPC and CPs. These components also respectively have characteristics similar to those for the components with the same reference numerals at the Schottky barrier diodes SBDa and SBDb discussed by the present inventors et al. in a manner similar to the above.

Figure 11:
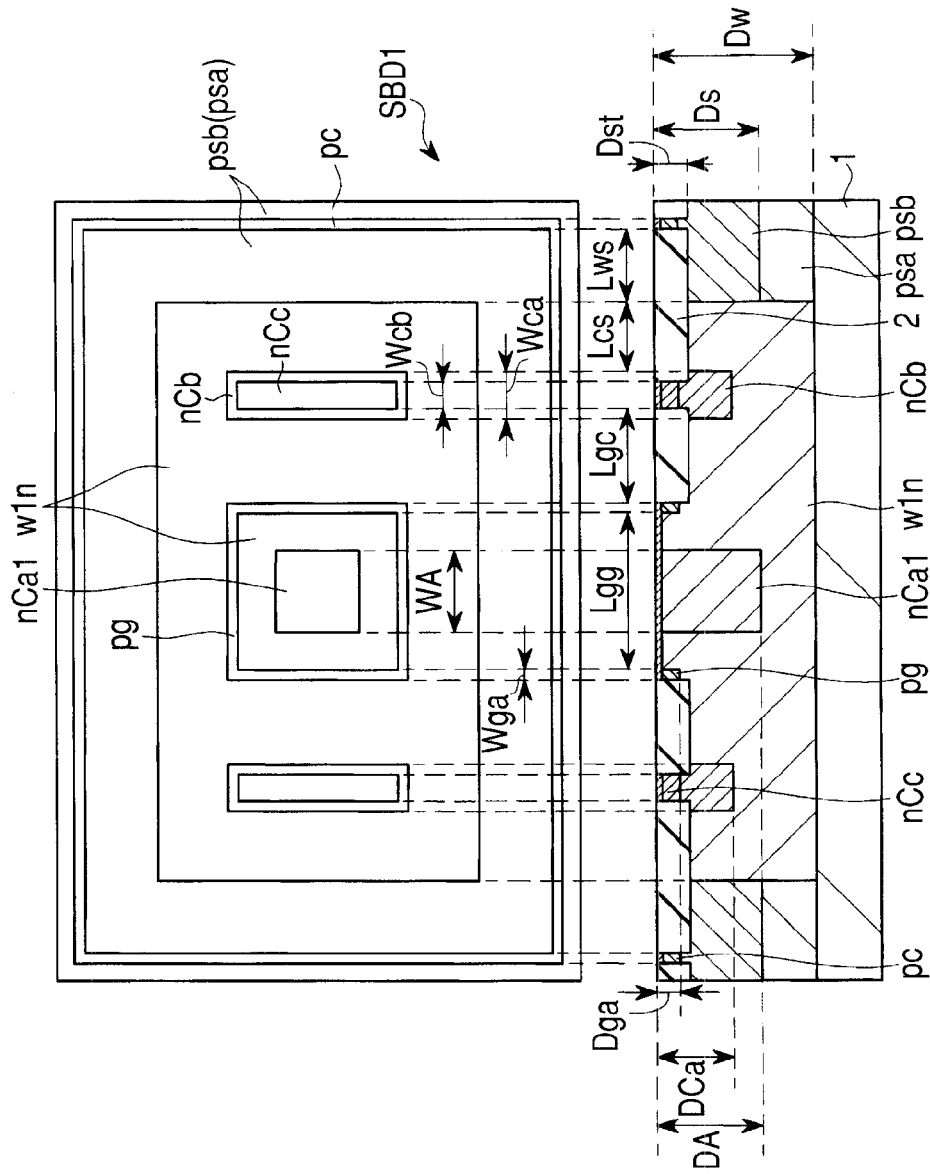
FIG. 11 is an explanatory view showing dimensions of respective semiconductor regions in the semiconductor device shown in FIG. 9.

A summary of examples illustrative of plane dimensions and depth dimensions of the respective semiconductor regions as to the Schottky barrier diode SBD1 of the above configuration, which has been illustrated in the first preferred embodiment, is shown in FIG. 11. As examples at typical or representative spots or places of the dimensions in the plane direction of the semiconductor substrate 1, there may be mentioned an anode region width WA=2.6 [μm], a cathode region width WCa=1.5 [μm], a cathode electrode width WCb=0.86 [μm], a guard ring width Wga=0.32 [μm], a guard ring-to-guard ring distance Lgg=5 [μm], a guard ring/cathode distance Lgc=2.68 [μm], a cathode/power-feeding portion distance Lcs=2.2 [μm] and a well/power-feeding portion distance Lws=2.31 [μm]. As examples at representative spots of the dimensions in the depth direction of the semiconductor substrate 1, there may be mentioned a well depth Dw=5 [μm], an anode depth DA=1.3 [μm], a power-feeding portion depth Ds=1.1 [μm], a cathode depth DCa=0.8 [μm], a separation portion depth Dst=0.35 [μm] and a guard ring depth Dga=0.25 [μm].

As described above, the Schottky barrier diode SBD1 used in the first preferred embodiment has component parts different in the following points as compared with the Schottky barrier diodes SBDa and SBDb discussed by the present inventors et al. Namely, according to the discussions of the present inventors et al., the n-type cathode region nCa1 having the impurity concentration of the same degree as one that could obtain a sufficiently large forward current, was formed at part below the anode conductor film EA in avoidance of contact with the p-type guard ring region pg. Further, the n-type cathode region nCa1 and the p-type guard ring region pg are spaced therebetween by the n-well region win low in impurity concentration.

Thus, the following effects can be expected. It is possible to ensure the forward current, i.e., hold the low resistivity of the forward characteristic by setting the n-type cathode region nCa1 to a high impurity concentration. At an n-type semiconductor material bonded or joined to the p-type guard ring region pg having yielded the breakdown at the low backward voltage due to the concentration of an electric field, the n-type cathode region nCa1 of high impurity concentration is spaced away or separated from the p-type guard ring region and bonded to the n-well region win low in impurity concentration, thereby making it possible to spread the depletion layer broader. Thus, a change in the electric field in the depletion layer with respect to the backward voltage becomes gentle, thereby making it possible to enhance the breakdown voltage.

Figure 12:
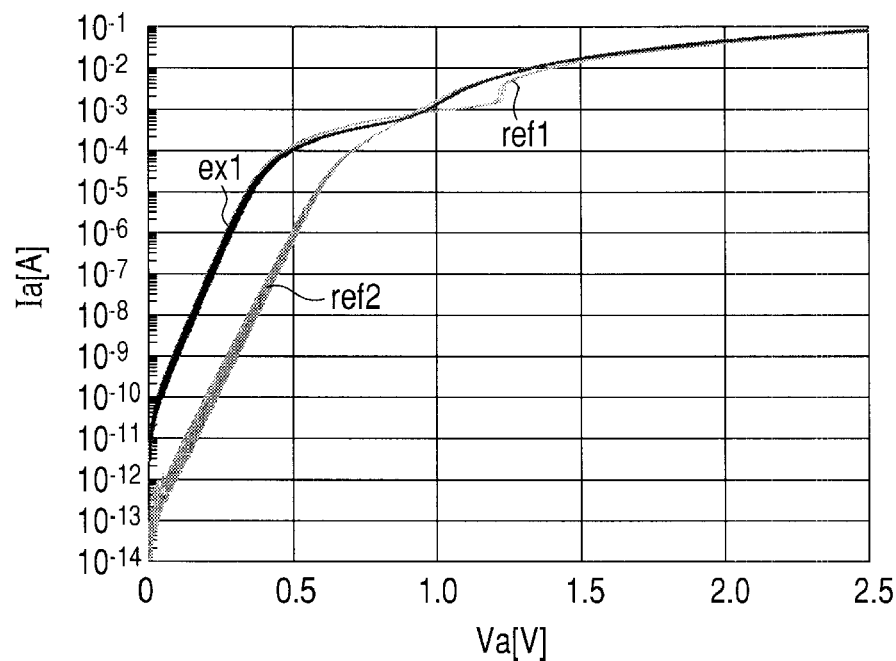
FIG. 12 is a graph diagram showing the relationship between a forward voltage and current at electrical characteristics of the semiconductor device illustrative of the first preferred embodiment of the present invention.
Figure 13:
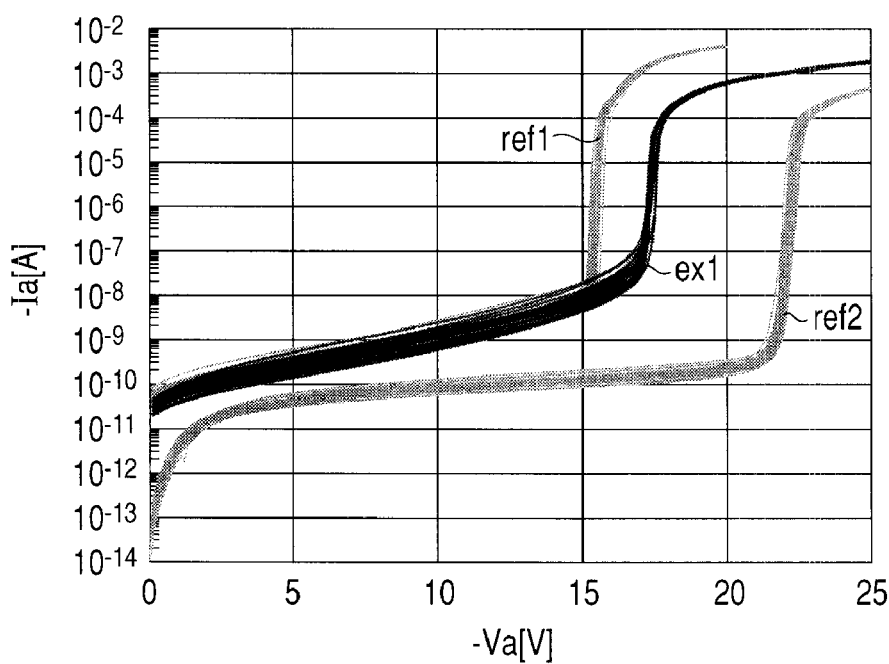
FIG. 13 is a graph diagram showing the relationship between a backward voltage and current at the electrical characteristics of the semiconductor device illustrative of the first preferred embodiment of the present invention.

Actually, the present inventors et al. have evaluated the electrical characteristics of the Schottky barrier diode SBD1 illustrated in the first preferred embodiment. FIG. 12 shows forward characteristics and FIG. 13 shows backward characteristics. Curve groups shown in light gray color in the drawings show the same characteristics of the Schottky barrier diode SBDa and SBDb discussed by the present inventors et al., which are shown in FIGS. 4, 5, 7 and 8, and have been described simultaneously for comparison. Of those discussed by the present inventors et al. in particular, one marked with a symbol ref1 indicates the characteristic of the Schottky barrier diode SBDa described using FIGS. 4 and 5, one marked with a symbol ref2 indicates the characteristic of the Schottky barrier diode SBDb described using FIGS. 7 and 8. The characteristic of the Schottky barrier diode SBD1 having the configuration illustrated in the first preferred embodiment is marked with a symbol ex1 and indicated in black solid lines.

At the forward characteristics as shown in FIG. 12, for example, a value of current Ia=$1.0\times10^{-5}$ [A] or so is obtained when the voltage Va=0.3[V], for example. Thus, the rising characteristic assumes the characteristic similar to the characteristic ref1 of the Schottky barrier diode SBDa discussed by the present inventors et al. and is satisfactory as the low resistance characteristic. Incidentally, such a high rising voltage and high resistance characteristic as seen in another Schottky barrier diode SBDb discussed by the present inventors et al. do not appear. This corresponds to an effect based on a result obtained by making high the impurity concentration of the n-type cathode region nCa1, which contributes particularly to a current value at the electrical characteristic.

At the backward characteristics as shown in FIG. 13, a breakdown phenomenon becomes remarkable from the neighborhood of the voltage Va=17.5[V]. This shows the characteristic between the two types of Schottky barrier diode SBDa and SBDb discussed by the present inventors et al. That is, although such a high breakdown voltage characteristic as close to that of the Schottky barrier diode SBDb brought to a low concentration in all cathode regions is not obtained, an improvement in the breakdown voltage ranging from about 2 to 2.5[V] has been realized as compared with the Schottky barrier diode SBDa of the previously-illustrated structure.

That is, the Schottky barrier diode SBD1 having the configuration illustrated in the first preferred embodiment can obtain such an expected effect as described above in that while the forward current is being held at a large value, the breakdown voltage is improved to the range of about 2 to 2.5[V]. Thus, the Schottky barrier diode SBD1 having a margin ranging from 4 to 4.5[V] with respect to the practically-used breakdown voltage 13[V] can be formed and the applied voltage at screening can be enhanced. As a result, the reliability of the semiconductor device can be enhanced using the Schottky barrier diode SBD1 of the configuration illustrated in the first preferred embodiment.

Here, the Schottky barrier diode SBD1 illustrated in the first preferred embodiment is mounted over the same semiconductor chip as other elements at the LCD driver, i.e., it is formed simultaneously with other elements. A process for manufacturing the same will be illustrated below by way of example. In the semiconductor device illustrated in the first preferred embodiment in particular, the Schottky barrier diode SBD1 is also formed together in a semiconductor chip formed with an integrated circuit for an LCD driver comprised of three types of MIS (Metal Insulator Semiconductor) type field effect transistors (hereinafter called simply "transistors") different in breakdown voltage. Although the details thereof are shown below, its manufacturing process does not have a process step dedicated for the Schottky barrier diode SBD1. That is, all the process steps for forming the Schottky barrier diode SBD1 belong to the same process as any of the processes for forming the three types of transistors.

A method for manufacturing the semiconductor device illustrated in the first preferred embodiment will be explained in sequence using FIGS. 14 through 29. FIGS. 14 through 29 respectively show fragmentary sectional views on the main surface S1 side formed with a plurality of elements in a semiconductor substrate 1.

Figure 14:
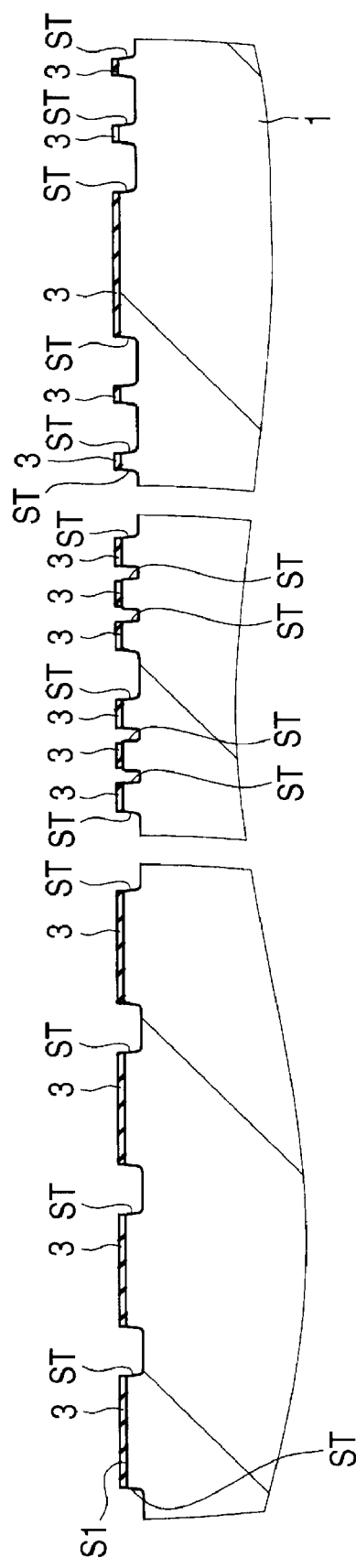
FIG. 14 is a fragmentary sectional view in a manufacturing process of the semiconductor device showing the first preferred embodiment of the present invention.

First, areas or regions for forming elements or devices are formed over the main surface S1 of the semiconductor substrate 1. As shown in FIG. 14, an insulating film 13 is formed over main surface S1 of the semiconductor substrate 1. The insulating film 3 is assumed to be a laminated or layered film of a film comprised principally of silicon oxide ($SiO_x$) and a film comprised principally of silicon nitride ($SiN_x$). The insulting film 3 in this case has a lower layer that is a film comprised principally of silicon oxide and is formed by a thermal oxidation method or the like, for example. It upper layer is of a film comprised principally of silicon nitride and is formed by a chemical vapor deposition (CVD) method or the like, for example. Since the film of the upper layer comprised principally of silicon oxide has been removed at the process stage shown in FIG. 14 as described in detail below, it is not shown herein.

Thereafter, a series of photography process steps like the application of a photoresist film (not shown) exposure via a pattern mask and development are executed to form a desired pattern in the photoresist film. When it is desired to process a more precision pattern accurately at this time, an anti-reflection agent called so-called BARC (Bottom Anti-Reflecting Coating) or the like may be applied to below the photoresist film. Thus, it is possible to prevent, for example, the halation of exposure light at a steplike portion or the like and perform the development of a more accurate pattern. The photolithography process is similar subsequently. By the process steps described up to now, the photoresist film processed into each desired pattern is formed over the main surface S1 of the semiconductor substrate 1. The insulting film 3 formed over the main surface S1 is brought to an exposed shape at each opening of the photoresist film. Incidentally, although the BARC is exposed at the opening where the BARC is used, this description will be omitted below unless mentioned specially.

Next, the insulting film 3 exposed to each opening and the semiconductor substrate 1 located therebelow are subjected to anisotropic etching with the patterned photoresist film as an etching mask. Thus, shallow trench portions ST are formed in the main surface S1 of the semiconductor substrate 1. Thereafter, the photoresist film is removed by ashing using, for example, a plasma ashing method or the like, whereby such a structure as shown in FIG. 14 is obtained.

Figure 15:
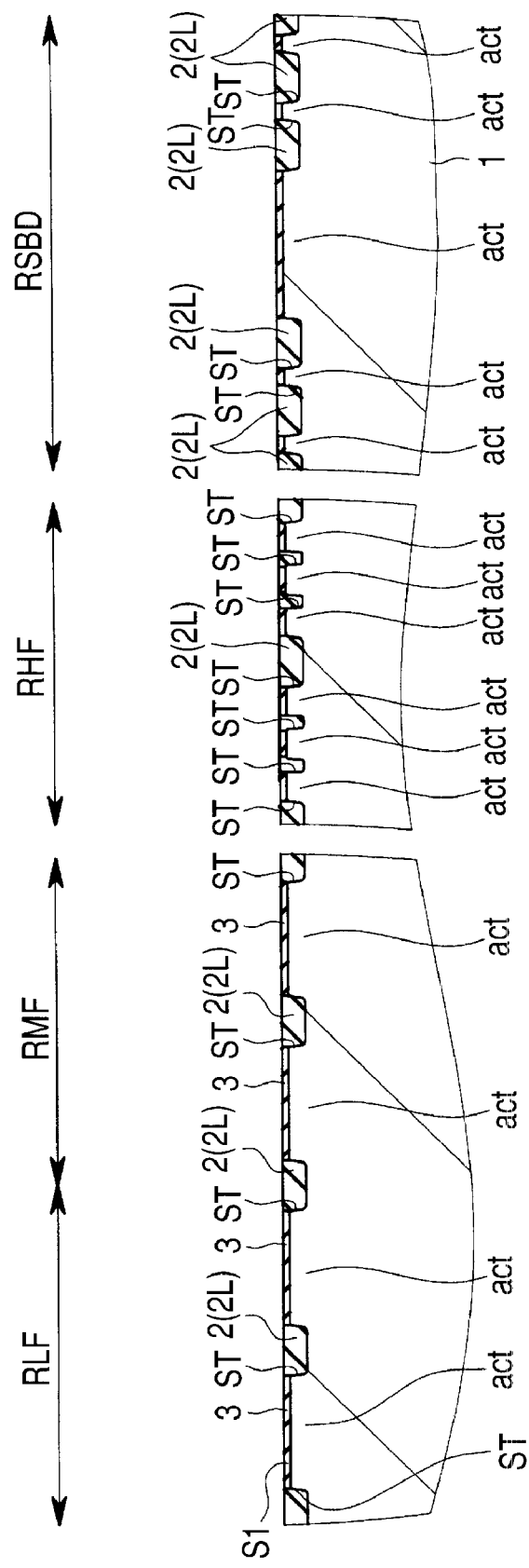
FIG. 15 is a fragmentary sectional view in the manufacturing process of the semiconductor device, following FIG. 14.

Subsequently, as shown in FIG. 15, an insulating film 2L comprised principally of silicon oxide is formed in the main surface S1 of the semiconductor substrate 1 so as to embed or bury the shallow trench portions ST. The insulating film 2L is assumed to be formed by the CVD method or the like with TEOS (Tetra Ethyl Ortho Silicate) and ozone ($O_3$) as raw materials after a thin silicon oxide film used as a bed or base has been deposited over the surface of each shallow trench portion ST by, for example, a dry thermal oxidation method or the like.

Thereafter, surface grinding or polishing is performed on the insulating film 2L from the main surface S1 of the semiconductor substrate 1 by, for example, a chemical mechanical polishing (CMP) method or the like thereby to retract into the level of the insulating film 3 comprised of silicon nitride or the like. Thus, STI-type separation or isolation portions 2 with the shallow trench portions ST being buried with the insulating film 2L comprised of silicon oxide or the like.

A plurality of device or element regions or areas act insulated and separated by the separation portions 2 are defined in the main surface S1 of the semiconductor substrate 1 in accordance with the above process steps. Various semiconductor elements are formed in the element regions act. In the semiconductor device illustrated in the first preferred embodiment, a plurality of transistors, Schottky barrier diodes and the like are formed in these element regions act. Process steps for forming each low breakdown voltage transistor (first field effect transistor) (symbol QL in FIGS. 23 through 29) in a low breakdown voltage transistor area or region (first region) RLF of the element regions act, forming each middle breakdown voltage transistor (second field effect transistor) (symbol QM in FIGS. 23 through 29) in a middle breakdown voltage transistor area or region (second region) RMF of those, forming each high breakdown voltage transistor (third field effect transistor) (symbol QH in FIGS. 23 through 29) in a high breakdown voltage transistor area or region (third region) RHF of those, and forming a Schottky barrier diode (symbol SBD1 in FIGS. 24 through 29) in a diode area or region (fourth region) RSBD of those are shown below.

In the process of manufacturing the semiconductor device illustrated in the first preferred embodiment, a process step for forming the Schottky barrier diode SBD1 of the structure illustrated by way of example in FIG. 10 by applying any of the transistor forming process steps executed on the transistor regions RLF, RMF and RHF to the diode region RSBD in like manner is shown therein. Thus, a process for manufacturing components formed in the diode region RSBD will be explained below in contradistinction to the components of the Schottky barrier diode SBD1 illustrated in FIG. 10. Since the structure of the Schottky barrier diode SBD1 to be formed is similar to the structure described using FIG. 10, the detailed description of the structure formed during the manufacturing process is omitted herein.

Figure 16:
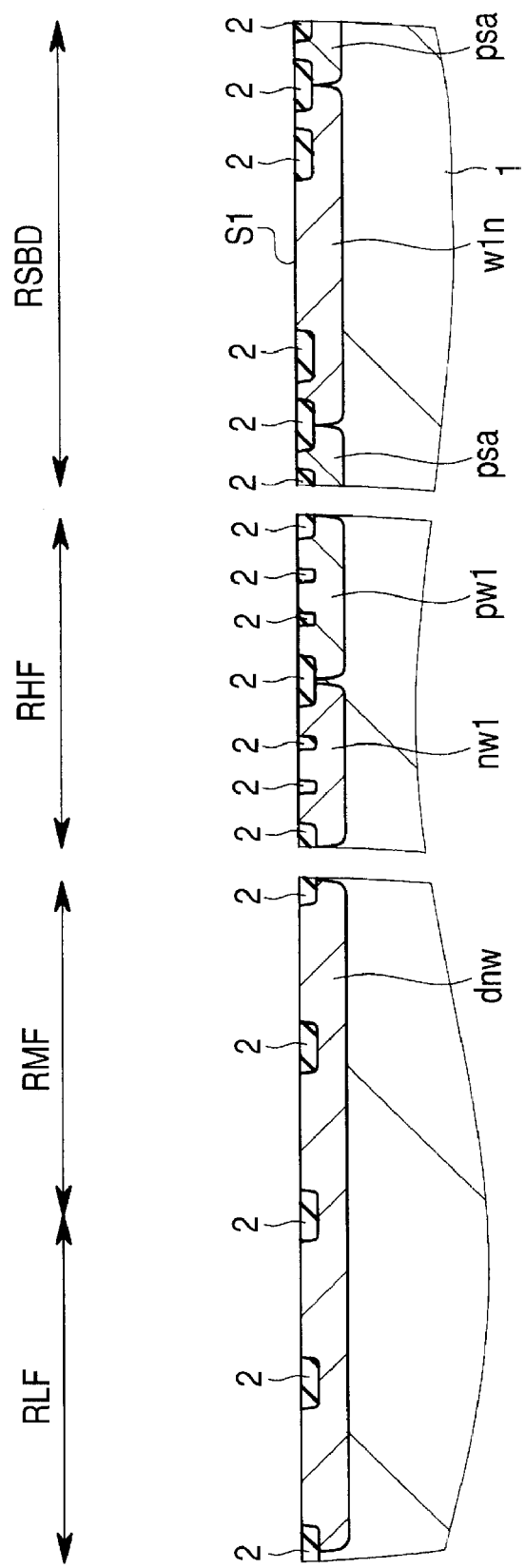
FIG. 16 is a fragmentary sectional view in the manufacturing process of the semiconductor device, following FIG. 15.

As shown in FIG. 16, a high breakdown voltage p well (transistor forming fifth well region) pw1 corresponding to a p-type semiconductor region is formed in part of the element regions act in the high breakdown voltage transistor region RHF. Here, such a photoresist film or the like that the area or region desired to form the high breakdown voltage p well pw1 is being opened is first formed over the main surface S1 of the semiconductor substrate 1 by a photolithography method or like (not shown). Thereafter, impurity ions each comprised of the III-group element, such as boron ions or the like are injected from the main surface S1 side of the semiconductor substrate 1 at desired energy and dose using an ion implantation method or the like. The dose at this time is related to the impurity concentration that determines a carrier concentration in the corresponding semiconductor region. Subsequently, the photoresist film is removed and heat treatment called so-called annealing for heating at a desired temperature is performed for a desired hour in an atmosphere of an inert gas. Thus, the high breakdown voltage p well pw1 is diffused to a desired depth. Simultaneously at this time, the implanted purity becomes an acceptor ion by entering into the crystal site and assumes a state capable of producing a positive hole corresponding to each of carriers (it is activated). When the rate of activation is of 1, for example, the impurity concentration and the carrier concentration become substantially equal to each other. The process of forming each p-type semiconductor region is assumed to be similar subsequently unless mentioned specially.

In the first embodiment, the impurity concentration of the high breakdown voltage p well pw1 is set higher than that of the semiconductor substrate 1 of p type.

In the first preferred embodiment, a p-type substrate power-feeding region (fourth semiconductor region) psa is formed in the diode region RSBD by the process of forming the high breakdown voltage p well pw1 in the high breakdown voltage transistor region RHF simultaneously with it.

Thereafter, a device or element n well (element or device forming well region) dnw corresponding to an n-type semiconductor region is formed throughout the low breakdown voltage transistor region RLF and the middle breakdown voltage transistor region RMF in the device regions act formed over the main surface S1 of the semiconductor substrate 1. Similarly, a high breakdown voltage n well (transistor forming sixth well region) nw1 corresponding to an n-type semiconductor region is formed in part of the region other than the high breakdown voltage p well pw1 in the high breakdown voltage transistor region RHF. The device n well dnw and the high breakdown voltage n well nw1 may be formed in separate processes or the same process. Here, the formation of each n-type semiconductor region is similar to the method of forming the p-type semiconductor region typified by the high breakdown voltage p well pw1 described above. That is, impurity ions each comprised of the V-group element such as phosphorus ions, arsenic ions or the like are implanted by the ion implantation method or the like with the photoresist film having the desired opening pattern formed over the main surface S1 of the semiconductor substrate 1 by the photolithography method or the like being used as an ion-implantation mask, and annealing is made to perform diffusion and activation, thereby forming each n-type semiconductor region having a desired diffusion depth and carrier concentration. Subsequently, the process of forming each n-type semiconductor region is assumed to be similar unless mentioned specially.

Although the high breakdown voltage p well pw1 has been explained so as to be formed prior to the device n well dnw and the high breakdown n well nw1 in the above description, no limitation is imposed on it. The latter may be formed in a preceding process. An annealing process may be performed on them simultaneously depending on conditions such as a diffusion depth and a carrier concentration desired to be made to the two.

In the first preferred embodiment, the device n well dnw and the high breakdown voltage n well nw1 are substantially the same degree as the high breakdown voltage p well pw1 in impurity concentration and set higher than that of the semiconductor substrate 1.

In the first preferred embodiment, an n-well region (first well region) w1n is formed in the diode region RSBD simultaneously by either one or both of the process step for forming the device n well dnw in the low breakdown voltage transistor region RLF and the middle breakdown voltage transistor region RMF and the process step for forming the high breakdown voltage n well nw1 in the high breakdown voltage transistor region RHF.

Figure 17:
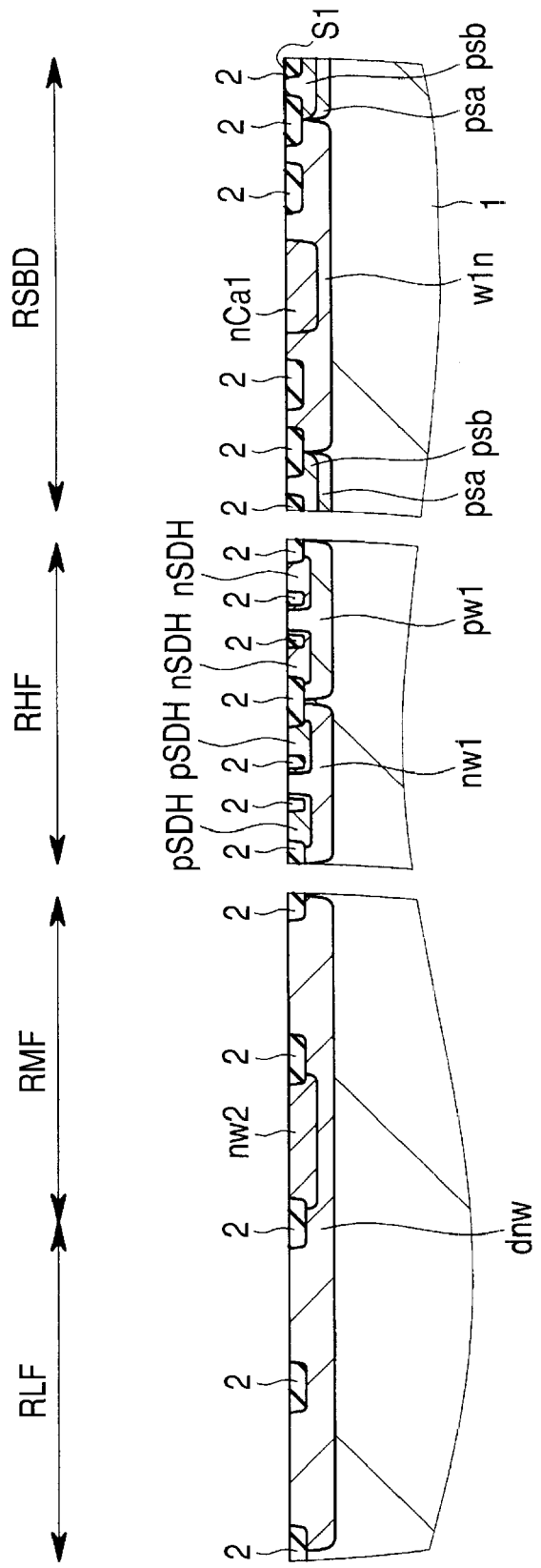
FIG. 17 is a fragmentary sectional view in the manufacturing process of the semiconductor device, following FIG. 16.

Next, as shown in FIG. 17, a middle breakdown voltage n well (transistor forming fourth well region) nw2 corresponding to an n-type semiconductor region is formed in part of the device regions act contained in the device n well dnw in the middle breakdown voltage transistor region RMF. Similarly, a high breakdown voltage n-type source/drain (fifth source/drain region) nSDH corresponding to an n-type semiconductor region is formed in part of the high breakdown voltage p well pw1 in the high breakdown voltage transistor region RHF. The middle breakdown voltage n well nw2 and the high breakdown voltage n-type source/drain nSDH may be formed in separate processes or the same process. Here, the high breakdown voltage n-type source/drain nSDH becomes a so-called source/drain region which emits carriers to a channel or assumes the role of absorbing the carriers from the channel in a transistor to be formed later.

In the first preferred embodiment, the middle breakdown voltage n well nw2 and the high breakdown voltage n-type source/drain nSDH are set higher than the device n well dnw, the high breakdown voltage n well nw1 and the n-well region w1n in impurity concentration.

In the first preferred embodiment, an n-type cathode region (first semiconductor region) nCa1 is formed in the diode region RSBD simultaneously by either one or both of the process step for forming the middle breakdown voltage n well nw2 and the process step for forming the high breakdown voltage n-type source/drain nSDH.

Thereafter, a high breakdown voltage p-type source/drain (sixth source/drain region) pSDH corresponding to a p-type semiconductor region is formed in part of the high breakdown voltage n well nw1 in the high breakdown voltage transistor region RHF. Here, the high breakdown voltage p-type source/drain pSDH becomes a so-called source/drain region which emits carriers to a channel or takes the role of absorbing the carriers from the channel in a transistor to be formed later.

In the first preferred embodiment, the high breakdown voltage p-type source/drain pSDH is set higher than the high breakdown voltage p well pw1 and the p-type substrate power-feeding region psa in impurity concentration.

In the first preferred embodiment, the feeding portion of the Schottky barrier diode SBD1 to the substrate might be provided as the p-type semiconductor regions of two layers different in impurity concentration as described using FIG. 10, for example. Here, the p-type substrate power-feeding region (fourth semiconductor region) psb corresponding to the second layer is higher in impurity concentration than the already formed p-type substrate power-feeding region psa corresponding to the first layer in the manufacturing process of the first preferred embodiment described in FIG. 16. Thus, in the first preferred embodiment, the p-type substrate power-feeding region psb is formed in the diode region RSBD simultaneously by the process step for forming the high breakdown voltage p-type source/drain pSDH.

Figure 18:
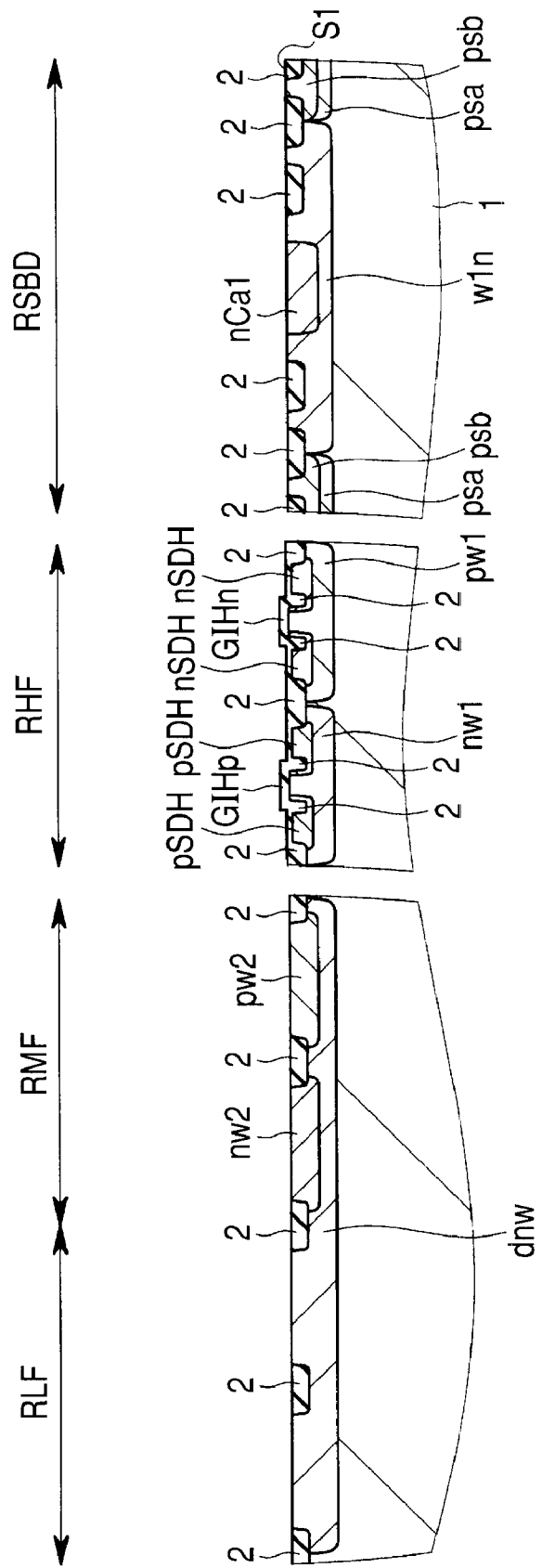
FIG. 18 is a fragmentary sectional view in the manufacturing process of the semiconductor device, following FIG. 17.

Next, as shown in FIG. 18, an n-type high breakdown voltage gate insulating film (fifth gate insulating film) GIHn is formed in part of the high breakdown voltage p well pw1 in the high breakdown voltage transistor region RHF. A p-type high breakdown voltage gate insulating film (sixth gate insulating film) GIHp is formed in part of the high breakdown n well nw1 in the high breakdown transistor region RHF.

Here, each of the n-type high breakdown voltage gate insulating film GIHn and the p-type high breakdown voltage gate insulating film GIHp is taken as an insulating film comprised principally of silicon oxide, which is formed by applying, for example, a thermal oxidation method and a TEOS-CVD method in order. The normal photolithography method or the like is used in its patterning processing. Incidentally, the two types of gate insulating films GIHn and GIHp formed in the high breakdown voltage transistor region RHF may be formed simultaneously or patterned simultaneously if the film quality and thickness required are the same.

Thereafter, a middle breakdown voltage p well (transistor forming third well region) pw2 corresponding to a p-type semiconductor region is formed in part of the region other than the middle breakdown voltage n well nw2, of the device n well dnw in the middle breakdown voltage transistor region RMF.

In the first preferred embodiment, the impurity concentration of the middle breakdown voltage p well pw2 is the same degree as that of the middle breakdown voltage n well nw2 and is set higher than that of each of the device n well dnw, high breakdown voltage n well nw1 and n-well region w1n.

Figure 19:
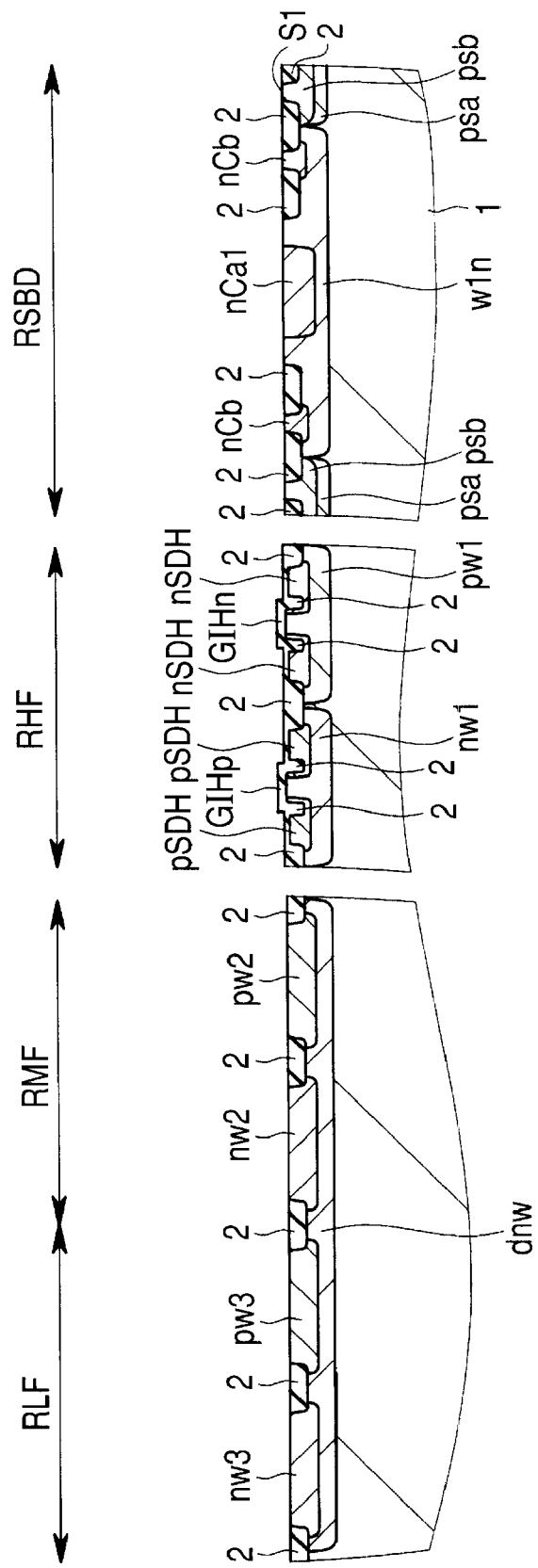
FIG. 19 is a fragmentary sectional view in the manufacturing process of the semiconductor device, following FIG. 18.

Next, as shown in FIG. 19, a low breakdown voltage n well (transistor forming second well region) nw3 corresponding to an n-type semiconductor region is formed in part of the device regions act contained in the device n well dnw in the low breakdown voltage transistor region RLF. In the first preferred embodiment, the impurity concentration of the low breakdown voltage n well nw3 is set higher than that of the middle breakdown voltage n well nw2.

In the first preferred embodiment, an n-type cathode conduction region (third semiconductor region) nCb is formed in the diode region RSBD simultaneously by the process step for forming the low breakdown voltage n well nw3.

A low breakdown voltage p well (transistor forming first well region) pw3 corresponding to a p-type semiconductor region is formed in part of the region free of the formation of the low breakdown voltage n well nw3, of the device regions act contained in the device n well dnw in the low breakdown voltage transistor region RLF. In the first preferred embodiment, the impurity concentration of the low breakdown voltage p well pw3 is set to the same degree as that of the middle breakdown voltage p well pw2 and set higher than that thereof.

Here, any of the low breakdown voltage n well nw3 in the low breakdown voltage transistor are RLF, the n-type cathode conduction region nCb in the diode region RSBD, and the low breakdown voltage p well pw3 in the low breakdown voltage transistor region RLF may be formed precedently. An annealing process may be conducted simultaneously depending on conditions such as a diffusion depth, a carrier concentration, etc. desired for the two.

Figure 20:
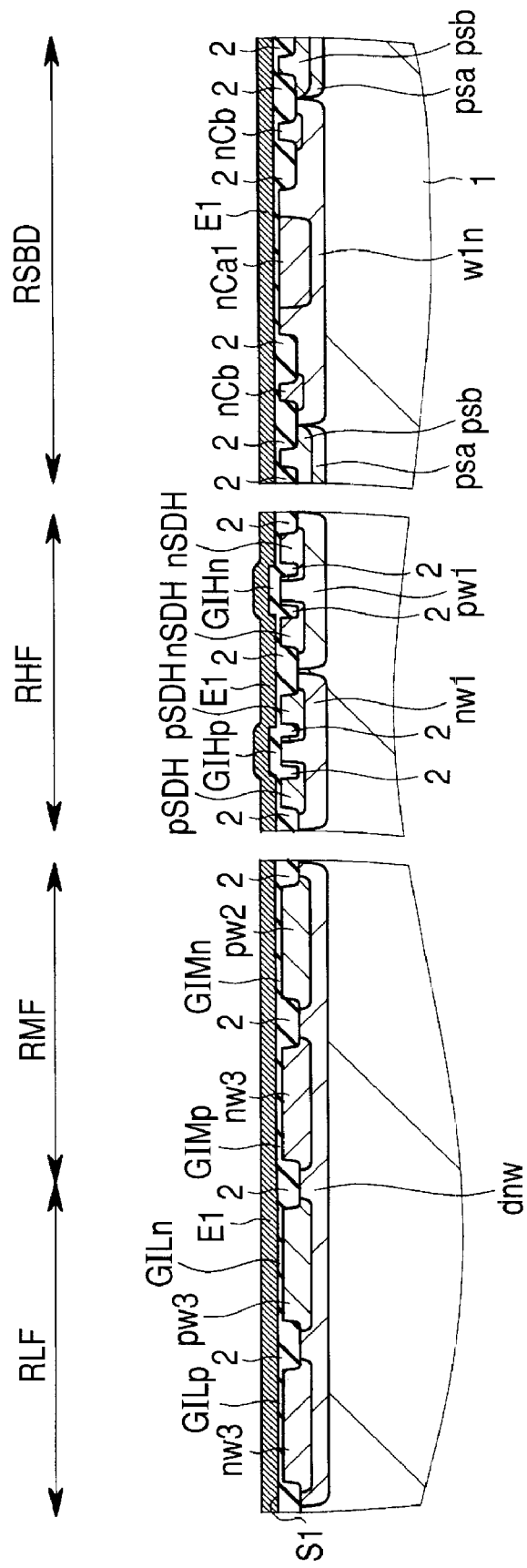
FIG. 20 is a fragmentary sectional view in the manufacturing process of the semiconductor device, following FIG. 19.

Next, as shown in FIG. 20, an n-type middle breakdown voltage gate insulating film (third gate insulating film) GIMn is formed in part of the middle breakdown voltage p well pw2 in the middle breakdown voltage transistor region RMF. A p-type middle breakdown voltage gate insulating film (fourth gate insulating film) GIMp is formed in part of the middle breakdown voltage n well nw2 in the middle breakdown voltage transistor region RMF. An n-type breakdown voltage gate insulating film (first gate insulating film) GILn is formed in part of the low breakdown voltage p well pw3 in the low breakdown voltage transistor region RLF. A p-type low breakdown voltage gate insulating film (second gate insulating film) GILp is formed in part of the low breakdown voltage n well nw3 in the low breakdown voltage transistor region RLF.

Here, each of the gate insulating films GIMn, GIMp, GILn and GILp is taken or assumed as an insulating film comprised principally of silicon oxide, which has been formed by applying, for example, the thermal oxidation method and TEOS-CVD method in order. These may be formed in the separate processes as described above or formed in the same process depending on the conditions.

Thereafter, a conductor film E1 is formed over the entire main surface S1 of the semiconductor substrate 1. Here, a film comprised principally of polysilicon is formed by the CVD method or the like, for example. Thereafter, the conductor film E1 is covered with a photoresist film patterned by the photolithography method or the like, for example and desired doping is effected on each desired region by the ion implantation method or the like. It is thus possible to cause, for example, characteristics such as resistivity to differ between, for example, on the low breakdown voltage transistor region RLF and on the middle breakdown voltage transistor region RMF in the formed conductor film E1.

Figure 21:
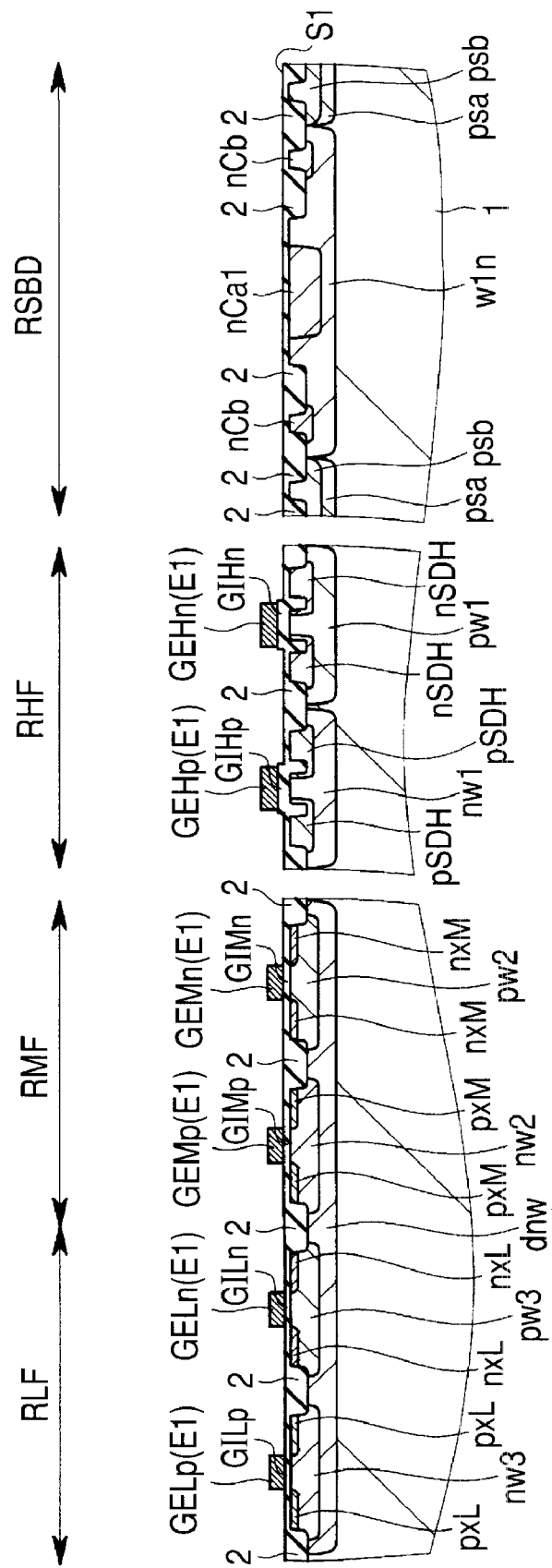
FIG. 21 is a fragmentary sectional view in the manufacturing process of the semiconductor device, following FIG. 20.

Next, as shown in FIG. 21, the conductor film E1 is patterned by, for example, the photolithography method and an anisotropic etching method or the like. At this time, it is processed so as to take desired gate electrode shapes in the transistor regions RLF, RMF and RHF. In the diode region RSBD, the front surface is etched without leaving the photoresist film upon photolithography to eliminate the conductor film E1 in the diode region RSBD.

An n-type high breakdown voltage gate electrode (fifth gate electrode) GEHn and a p-type high breakdown voltage gate electrode (sixth gate electrode) GEHp are respectively formed over the high breakdown voltage p well pw1 and the high breakdown voltage n well nw1 in the high breakdown voltage transistor region RHF in the above-described manner. An n-type middle breakdown voltage gate electrode (third gate electrode) GEMn and a p-type middle breakdown voltage gate electrode (fourth gate electrode) GEMp are respectively formed over the middle breakdown voltage p well pw2 and the middle breakdown voltage n well nw2 in the middle breakdown voltage transistor region RMF. An n-type low breakdown voltage gate electrode (first gate electrode) GELn and a p-type low breakdown voltage gate electrode (second gate electrode) GELp are respectively formed over the low breakdown voltage p well pw3 and the low breakdown voltage n well nw3 in the low breakdown voltage transistor region RLF. These are normally collectively processed and formed by the photolithography method and the anisotropic etching method or the like.

Thereafter, semiconductor regions each having a desired polarity and a desired impurity concentration are formed in the wells nw3, pw3, nw2 and pw2 (corresponding thereto in order respectively) located at lateral lower portions of the formed gate electrodes GELp, GELn, GEMp and GEMn by, for example, the ion implantation method or the like in the low breakdown voltage transistor region RLF and the middle breakdown voltage transistor region RMF. Described specifically, low breakdown voltage p-type extension regions pxL are formed in the low breakdown voltage n well nw3, low breakdown voltage n-type extension regions nxL are formed in the low breakdown voltage p well pw3, middle breakdown voltage p-type extension regions pxM are formed in the middle n well nw2, and middle breakdown voltage n-type extension regions nxM are formed in the middle breakdown voltage p well pw2, respectively.

The extension regions pxL, nxL, pxM and nxM are respectively of so-called extension regions in which carriers are injected to channels in transistors to which the extension regions belong, and become one factor that determines the characteristics of the transistors. Thus, the depth of junction to each well, the impurity concentration relative to each well, and the like are determined depending on the characteristics required for the transistors. Described qualitatively, they are lower in impurity concentration than source/drain regions (symbols pSDL, nSDL, pSDM and nSDM in FIGS. 23 through 29) to be described in detail later.

Figure 22:
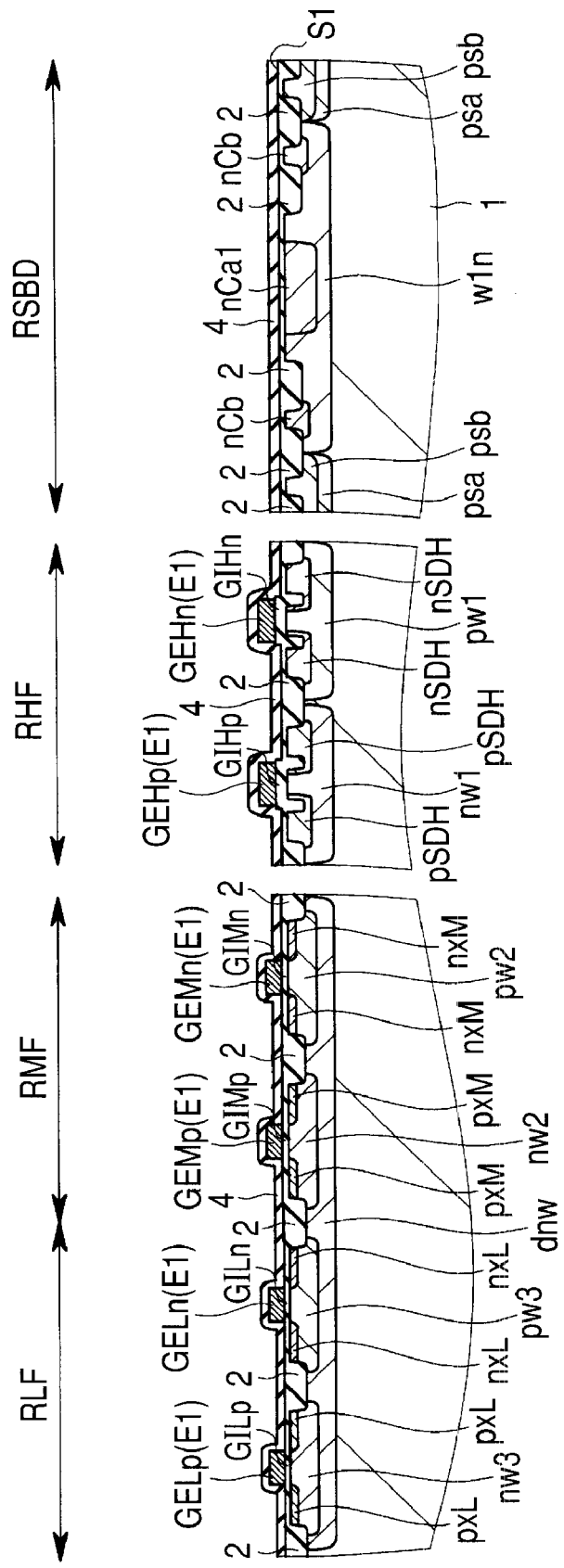
FIG. 22 is a fragmentary sectional view in the manufacturing process of the semiconductor device, following FIG. 21.

Next, as shown in FIG. 22, an insulating film 4 is formed so as to cover the main surface S1 of the semiconductor substrate 1. Here, the insulating film 4 is assumed to be an insulating film comprised principally of silicon oxide, which is formed by the TEOS-CVD method or the like, for example.

Figure 23:
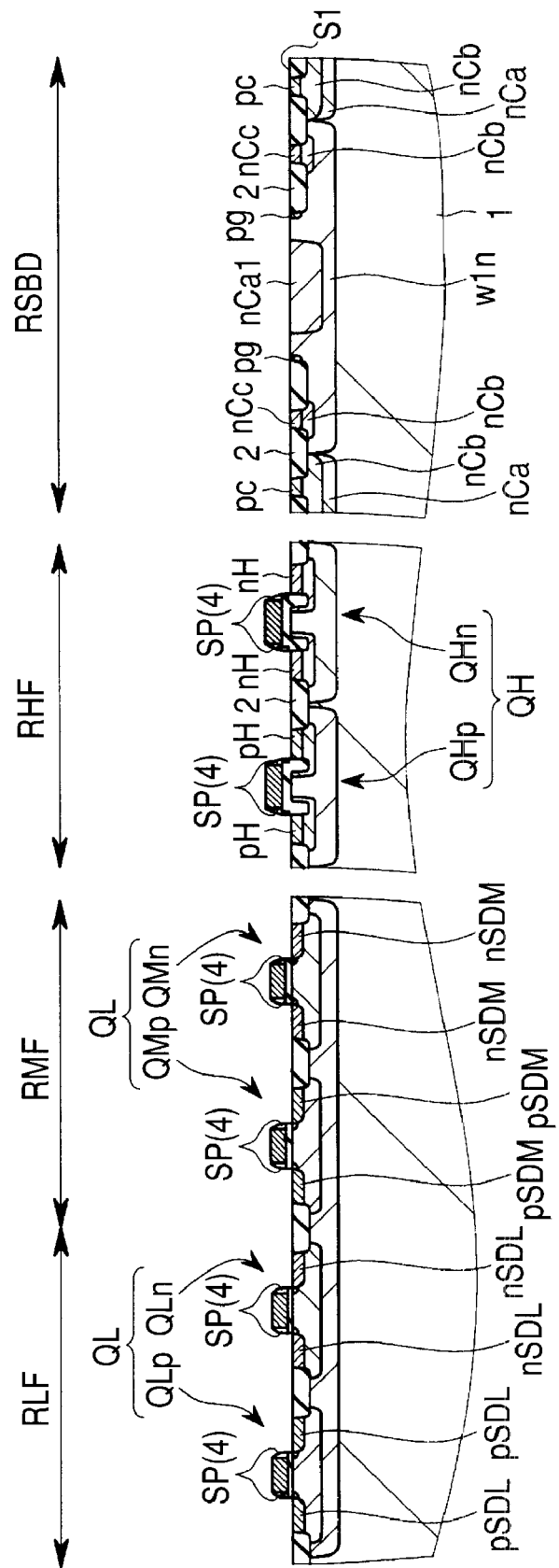
FIG. 23 is a fragmentary sectional view in the manufacturing process of the semiconductor device, following FIG. 22.

Thereafter, as shown in FIG. 23, etching is effected on the entire main surface S1 of the semiconductor substrate 1 from the main surface S1 with respect to the insulating film 4 (etchback). Thus, sidewall spacers SP each comprised of the insulating film 4 are formed over their corresponding sidewalls of the gate electrodes GELp, GELn, GEMp, GEMn, GEHp and GEHn that have protruded over the main surface S1.

Next, semiconductor regions each having a desired polarity and a desired impurity concentration are respectively formed in the wells nw3, pw3, nw2 and pw2 (corresponding thereto in order respectively) located at lateral lower portions of the sidewall spacers SP formed at the gate electrodes GELp, GELn, GEMp and GEMn by, for example, the ion implantation method or the like. Described specifically, low breakdown voltage p-type source/drains (second source/drain region) pSDL are formed in the low breakdown voltage n well nw3, low breakdown voltage n-type source/drains (first source/drain region) nSDL are formed in the low breakdown voltage p well pw3, middle breakdown voltage p-type source/drains (fourth source/drain region) pSDM are formed in the middle breakdown voltage n well nw2, and middle breakdown voltage n-type source/drains (third source/drain region) nSDM are formed in the middle breakdown voltage p well pw2, respectively. These assume so-called source/drain regions each of which emits carriers to a channel via each of the extension regions pxL, nxL, pxM and nxM or takes the role of absorbing the carriers from the channel in each transistor to be formed later.

Here, the source/drain regions of the same polarity may be formed in the same process. For example, a combination of the low breakdown voltage p-type source/drains pSDL and the middle breakdown voltage p-type source/drains pSDM and a combination of the low breakdown voltage n-type source/drains nSDL and the middle breakdown voltage n-type source/drains nSDM may respectively be formed in the same process.

When semiconductor regions relatively high in impurity concentration, for forming electrical coupling to their corresponding source/drain regions pSDH and nSDH located at the lateral lower portions of the gate electrodes GEHp and GEHn in the high breakdown voltage transistor region RHF are formed, they may be formed simultaneously by the above process. Described specifically, a p-type semiconductor region pH may be formed in each of the high breakdown voltage p-type source/drains pSDH by the process of forming either one or both of the low breakdown voltage p-type source/drains pSDL and the middle breakdown voltage p-type source/drains pSDM. An n-type semiconductor region nH may be formed in each of the high breakdown voltage n-type source/drains nSDH by the process of forming either one or both of the low breakdown voltage n-type source/drains nSDL and the middle breakdown voltage n-type source/drains nSDM.

In the first preferred embodiment, the impurity concentrations of the low breakdown voltage p-type source/drains pSDL and the middle breakdown voltage p-type source/drains nSDM are set higher than those of the low breakdown voltage p-type extension regions pxL and the middle breakdown voltage p-type extension regions pxM. The impurity concentrations of the low breakdown voltage n-type source/drains nSDL and the middle breakdown voltage n-type source/drains nSDM are set higher than those of the low breakdown voltage n-type extension regions nxL and the middle breakdown voltage n-type extension regions nxM.

In the first preferred embodiment, a p-type guard ring region (second semiconductor region) pg is formed in the diode region RSBD simultaneously by either one or both of the process step for forming the low breakdown voltage p-type source/drains pSDL and the process step for forming the middle breakdown voltage p-type source/drains pSDM. Similarly, a p-type semiconductor region pc may be formed in the diode region RSBD.

In the first preferred embodiment, an n-type semiconductor region nCc may be formed in the diode region RSBD simultaneously by either one or both of the process step for forming the low breakdown voltage n-type source/drains nSDL and the process step for forming the middle breakdown voltage n-type source/drains nSDM.

In accordance with the above process steps, the basic configurations of the transistors different in breakdown voltage are respectively formed in the transistor regions RLF, RMF and RHF. That is, the two types of low breakdown voltage transistors (first field effect transistor) QL are formed in the low breakdown voltage transistor region RLF, the two types of middle breakdown voltage transistors (second field effect transistor) QM are formed in the middle breakdown voltage transistor region RMF, and the two types of high breakdown voltage transistors (third field effect transistor) QH are formed in the high breakdown voltage transistor region RHF.

In particular, the two types of low breakdown voltage transistors QL correspond to an n channel type low breakdown voltage transistor (hereinafter called simply "n-type low breakdown voltage transistor") QLn formed in the low breakdown voltage p well pw3, and a p channel type low breakdown voltage transistor (hereinafter called simply "p-type low breakdown voltage transistor") QLp formed in the low breakdown voltage n well nw3. Their operating breakdown voltages are 1.5[V]. The two types of middle breakdown voltage transistors QM correspond to an n channel type middle breakdown voltage transistor (hereinafter called simply "n-type middle breakdown voltage transistor") QMn formed in the middle breakdown voltage p well pw2, and a p channel type middle breakdown voltage transistor (hereinafter called simply "p-type middle breakdown voltage transistor") QMp formed in the middle breakdown voltage n well nw2. Their operating breakdown voltages are 6.0[V]. The two types of high breakdown voltage transistors QH correspond to an n channel type high breakdown voltage transistor (hereinafter called simply "n-type high breakdown voltage transistor") QHn formed in the high breakdown voltage p well pw1, and a p channel type high breakdown voltage transistor (hereinafter called simply "p-type high breakdown voltage transistor") QHp formed in the high breakdown voltage n well nw1. Their operating breakdown voltages are 25.0[V].

Figure 24:
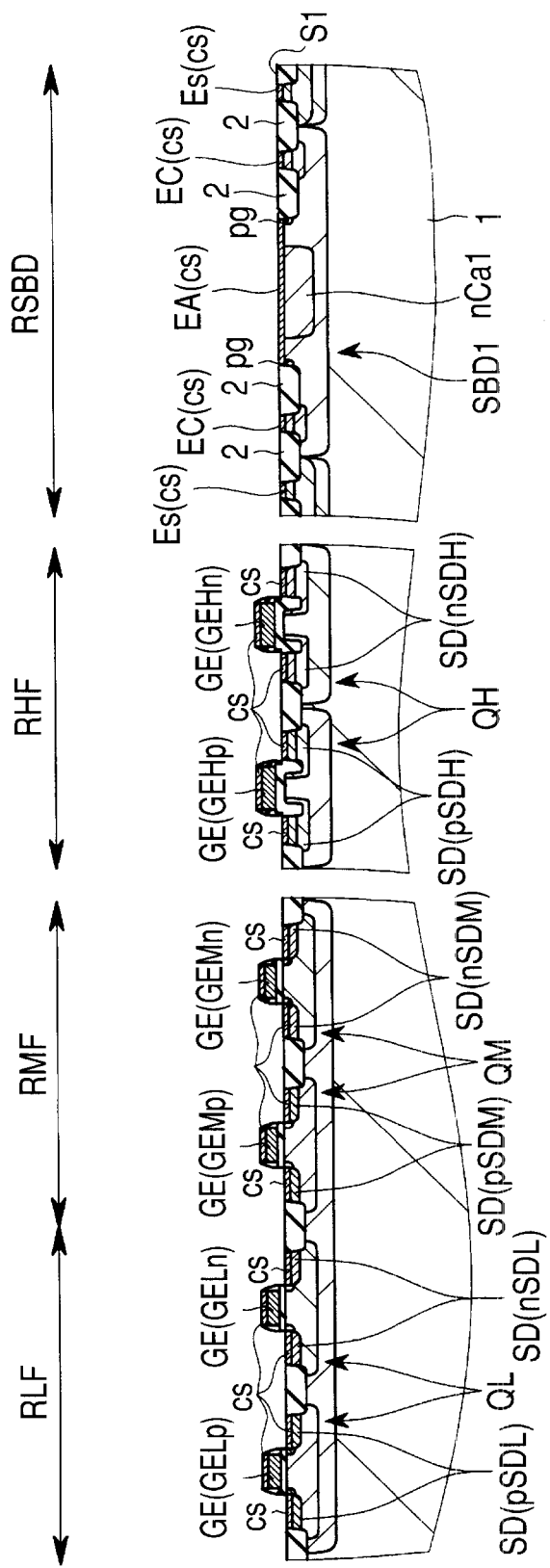
FIG. 24 is a fragmentary sectional view in the manufacturing process of the semiconductor device, following FIG. 23.

Next, when contact plugs for taking electrical coupling to the surfaces of the source/drains nSDL, pSDL, nSDM, pSDM, nSDH and pSDH (hereinafter collectively represented as "symbol SD") of the transistors QL, QM and QH and the surfaces of the gate electrodes GELn, GELp, GEMn, GEMp, GEHn and GEHp (hereinafter collectively represented as "GE") are formed as shown in FIG. 24, a silicide layer (electrical coupling conductor film) cs low in resistance value is formed in such a manner that ohmic coupling is realized. Described specifically, it is based on a method shown below.

After the process step descried using FIG. 23, the main surface S1 of the semiconductor substrate 1 is cleaned and a thin oxide film or the like formed thereby is removed by chemicals processing or the like. At this time, silicon is exposed at the surfaces other than the source/drains SD, gate electrodes GE and separation portions 2 in the diode region RSBD in the main surface S1 of the semiconductor substrate 1. Thereafter, for example, a cobalt film or the like is deposited over the main surface S1 of the semiconductor substrate 1 by a sputtering method or the like (not shown). Subsequently, an annealing process is performed on the semiconductor substrate 1 held in the above state. Here, silicon and cobalt are in contact at the surfaces other than the source/drains SD, gate electrodes GE and separation portions 2 in the diode region RSBD. A cobalt silicide layer corresponding to a compound of silicon and cobalt is formed by the annealing process.

Since the cobalt silicide layer formed in this way has a metal class low resistance value and is electrically coupled to the original silicon layer formed with the cobalt silicide layer, the cobalt silicide layer is suitable for electrical coupling to components such as the source, gate, drain and the like of each transistor, for example. The silicide layer cs is formed over the source/drains SD and gate electrodes GE of the transistors QL, QM and QH in the above-described manner as shown in FIG. 24.

In the first preferred embodiment, a similar silicide layer cs is formed in regions free of formation of the separation portions 2 in the main surface S1 of the semiconductor substrate 1 of the diode region RSBD simultaneously by the process step for forming the silicide layer cs in the transistor regions RLF, RMF and RHF as described above. That is, an anode conductor film (first conductor film) EA, a cathode conductor film (second conductor film) EC and a substrate power-feeding conductor film (third conductor film) Es are formed by this process step. In particular, the electrical coupling of the anode conductor film EA and the n-type cathode region nCa1 assumes Schottky coupling. Here, no limitation is imposed on the formation of the same silicide layer cs in all the regions shown above. In this case, each region not desired to form the silicide layer cs is covered with, for example, the photoresist film upon the above deposition of cobalt film by the sputtering method or the like, and the regions in which the silicide layer cs is not formed can be formed selectively by prevention of silicidation.

By the above process, the basic configuration of the Schottky barrier diode SBD1 having the Schottky junction can be formed in the diode region RSBD. A wiring forming process step for electrically coupling the respective elements and forming each integrated circuit having desired functions is conducted subsequently.

Figure 25:
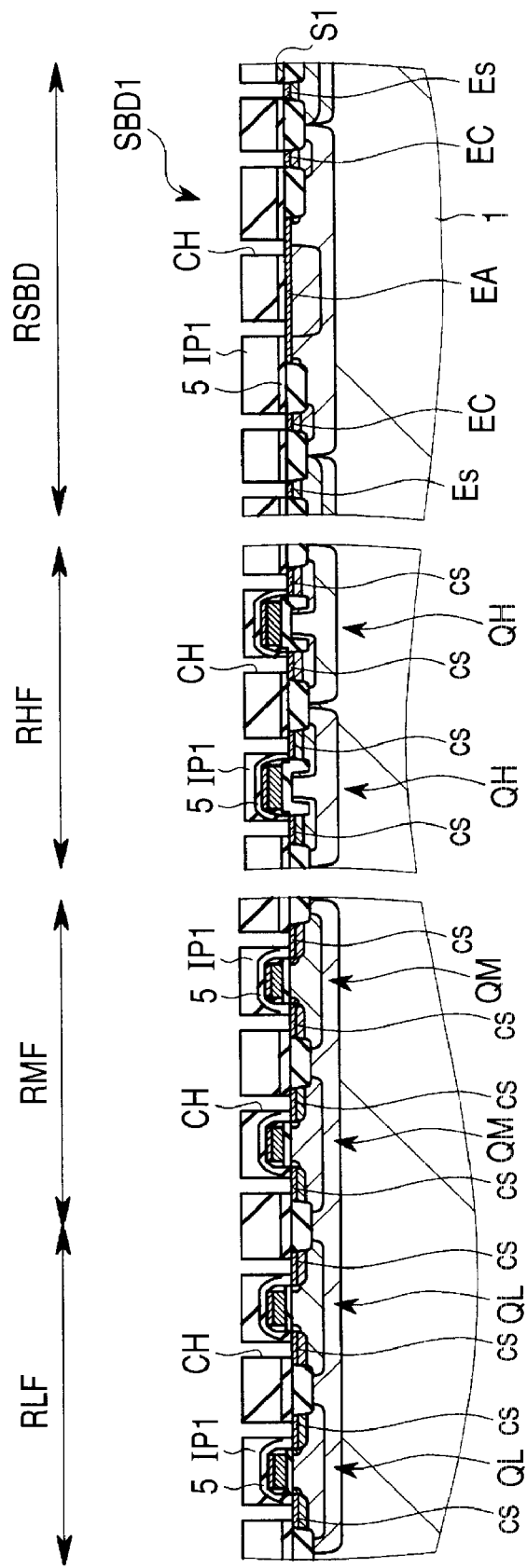
FIG. 25 is a fragmentary sectional view in the manufacturing process of the semiconductor device, following FIG. 24.

As shown in FIG. 25, an insulating film 5 comprised of, for example, silicon nitride or the like is formed over the main surface S1 of the semiconductor substrate 1 by the CVD method or the like, for example. Thereafter, an interlayer insulating film IP1 comprised of, for example, silicon oxide or the like is formed sufficiently thicker than the bedding insulating film 5 by, for example, the TEOS-CVD method or the like so as to cover the insulting film 5.

Thereafter, such contact holes CH as to penetrate the desired silicide layer cs are formed. Described specifically, a photoresist film or the like patterned so as to open the region for forming or defining each contact hole CH is formed by the photolithography method or the like. Anisotropic etching is done from the main surface S1 of the semiconductor substrate 1 to form each contact hole CH.

At this time, the interlayer insulating film IP1 comprised of silicon oxide is different in etching speed from the insulating film 5 comprised of silicon nitride. In particular, the above anisotropic etching is effected on the bedding insulating film 5 rather than the interlayer insulating film IP1 on such a condition that the etching speed becomes slow sufficiently. Thus, when the etching for forming each contact hole CH is conducted, the progress of etching stops apparently when the etching has reached the bedding insulating film 5. Thereafter, the condition is changed to a condition for etching silicon nitride to perform processing under its condition, whereby the insulating film 5 is etched continuously. Thus, even where the interlayer insulating film IP1 relatively thick is etched, the contact holes CH, which penetrate the silicide layer cs by overetching and do not damage to the source/drains SD consequently, can be formed on a self-alignment basis.

Figure 26:
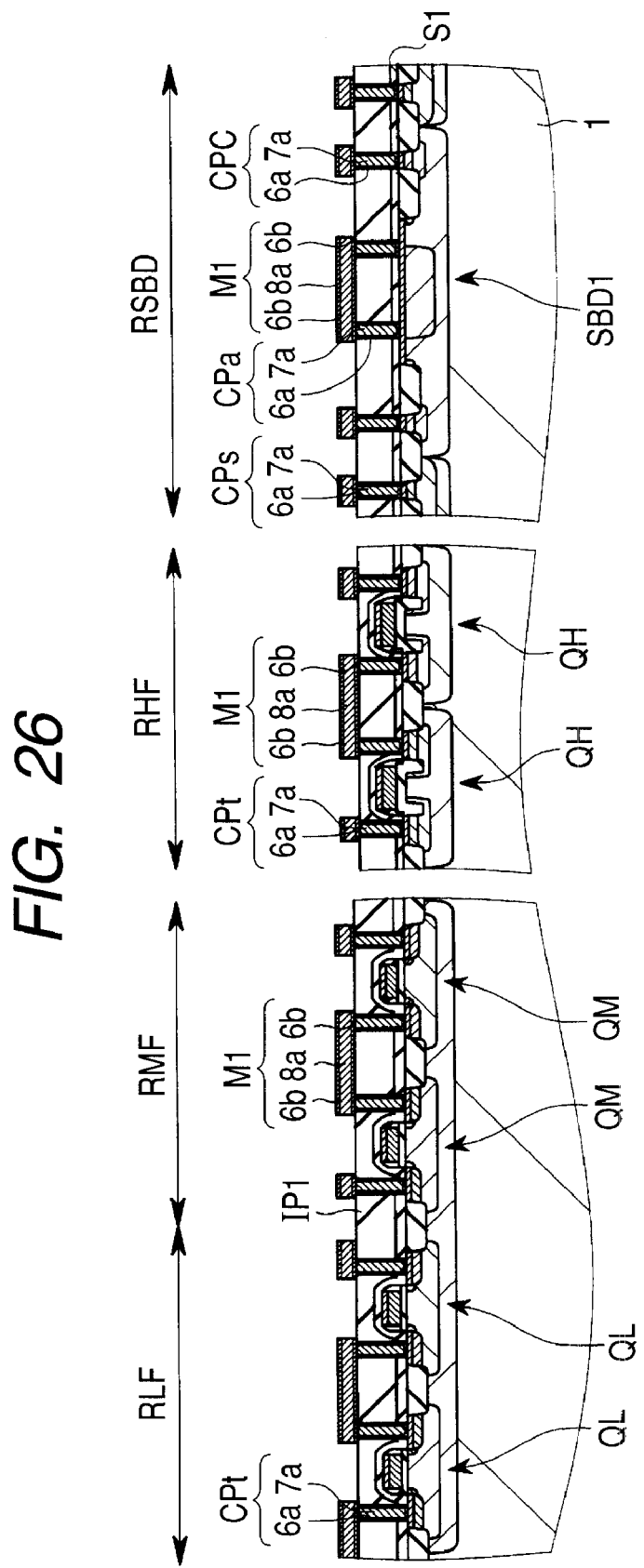
FIG. 26 is a fragmentary sectional view in the manufacturing process of the semiconductor device, following FIG. 25.

Next, as shown in FIG. 26, the inside of each contact hole CH is covered with a barrier metal 6a comprised of, for example, titanium nitride (TiN) or the like. Here, the barrier metal 6a is assumed to be formed by the combination of the sputtering method, CVD and the like, for example. Next, a conductor film 7a comprised of, for example, tungsten or the like is formed so as to bury the contact holes CH. Here, the conductor film 7a is assumed to be formed by the CVD method or the like. Thereafter, polishing is performed from the upper surface of the interlayer insulating film IP1 by the CMP method or the like to leave the barrier metal 6a and the conductor film 7a only within the contact holes CH and remove others.

By the above process, transistor contact plugs (wiring conductive portion) CPt each having the barrier metal 6a and the conductor film 7a can be formed over the surfaces of the source/drains SD and gate electrodes GE of the transistors QL, QM and QH. In the first preferred embodiment, an anode contact plug (first conductive portion) CPA, a cathode contact plug (second conductive portion) CPC and a substrate power-feeding contact plug (third conductive portion) CPs each having the barrier metal 6a and the conductor film 7a are formed in the diode region RSBD simultaneously by the process step for forming each transistor contact plug CPt.

Here, the barrier metal 6a comprised principally of titanium nitride prevents a chemical reaction between both the conductor film 7a comprised principally of tungsten and silicon, electromigration of the conductor film 7a and the like. Further, the barrier metal 6a is excellent in adhesion to the conductor film 7a comprised principally of tungsten, the interlayer insulating film IP1 comprised principally of silicon oxide, and the like. From the above reasons, the barrier metal 6a comprised principally of titanium nitride is used to form each of the contact plugs CPt, CPA, CPC and CPs into a desired shape.

Next, the barrier metal 6b, the conductor film 8a and the barrier metal 6b are formed over the interlayer insulating film IP1 in order by, for example, the sputtering method or the like to form a desired wiring. Here, the barrier metals 6b of two layers are similar and assumed to be formed depending on the purpose and material similar to the barrier metal 6a contained in each of the contact plugs CPt, CPA, CPC, CPs and the like, for example. The conductor film 8a is assumed to be formed with, for example, an alloy of aluminum and copper, or the like as a principal part.

Thereafter, processing is conducted to make a desired wiring pattern by the photolithography method and anisotropic etching method thereby to form a first wiring layer M1 having the barrier metals 6b of two layers and the conductor film 8a.

Figure 27:
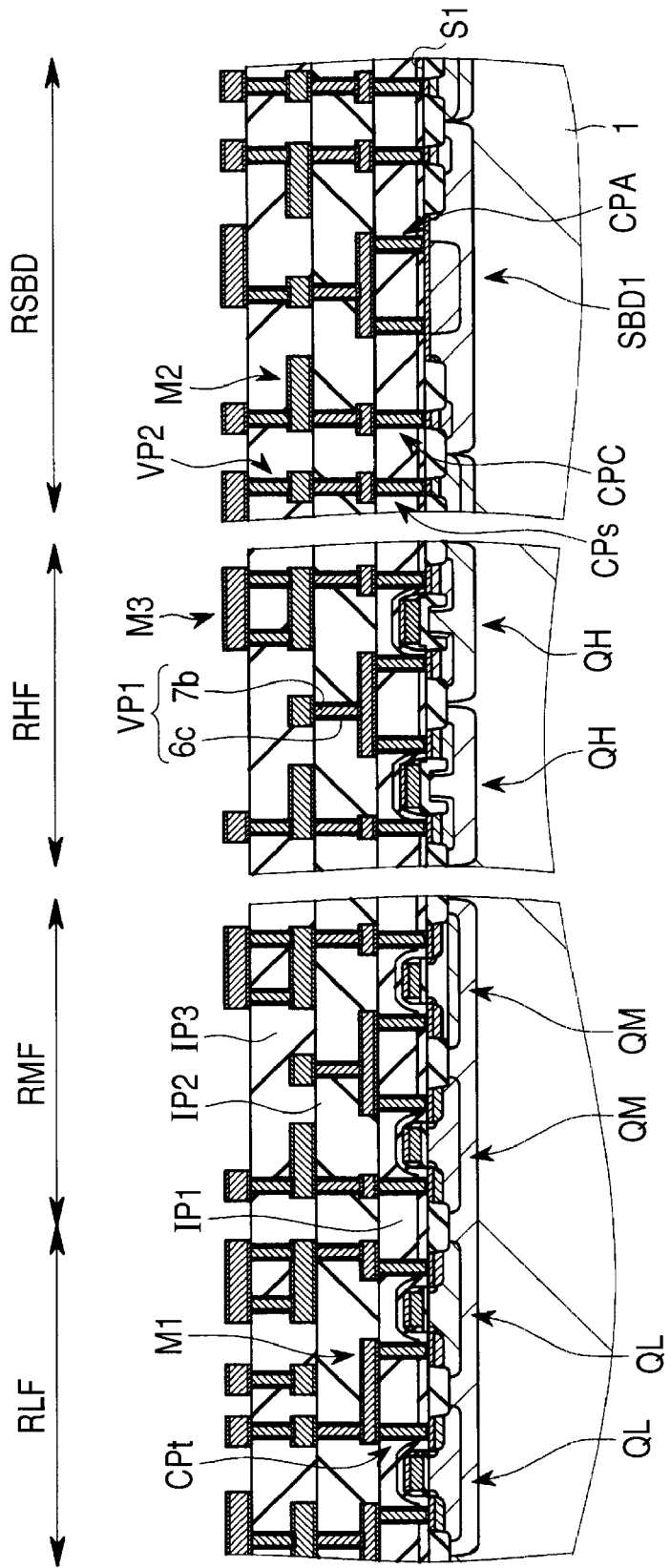
FIG. 27 is a fragmentary sectional view in the manufacturing process of the semiconductor device, following FIG. 26.

Next, as shown in FIG. 27, the first wiring layer M1 is covered with an interlayer insulating film IP2 comprised of silicon oxide or the like formed by, for example, the TEOS-CVD method or the like. Thereafter, such first via plugs VP1 each having a barrier metal 6c and a conductor film 7b as to be electrically coupled to the first wiring layer M1 are formed. A material that forms the barrier metal 6c and the conductor film 7b, a method for forming the first via plugs VP1, and the like are assumed to be similar to the contact plugs CPt, CPA, CPC and CPs described using FIG. 26, for example.

Thereafter, a second wiring layer M2, an interlayer insulating film IP3, second via plugs VP2 and a third wiring layer M3 each corresponding to an upper layer are further formed by a process similar to the process of forming the first wiring layer M1, interlayer insulating film IP2 and first via plugs VP1. Thus, desired wiring structures are formed and a semiconductor device having required characteristics is formed.

Figure 28:
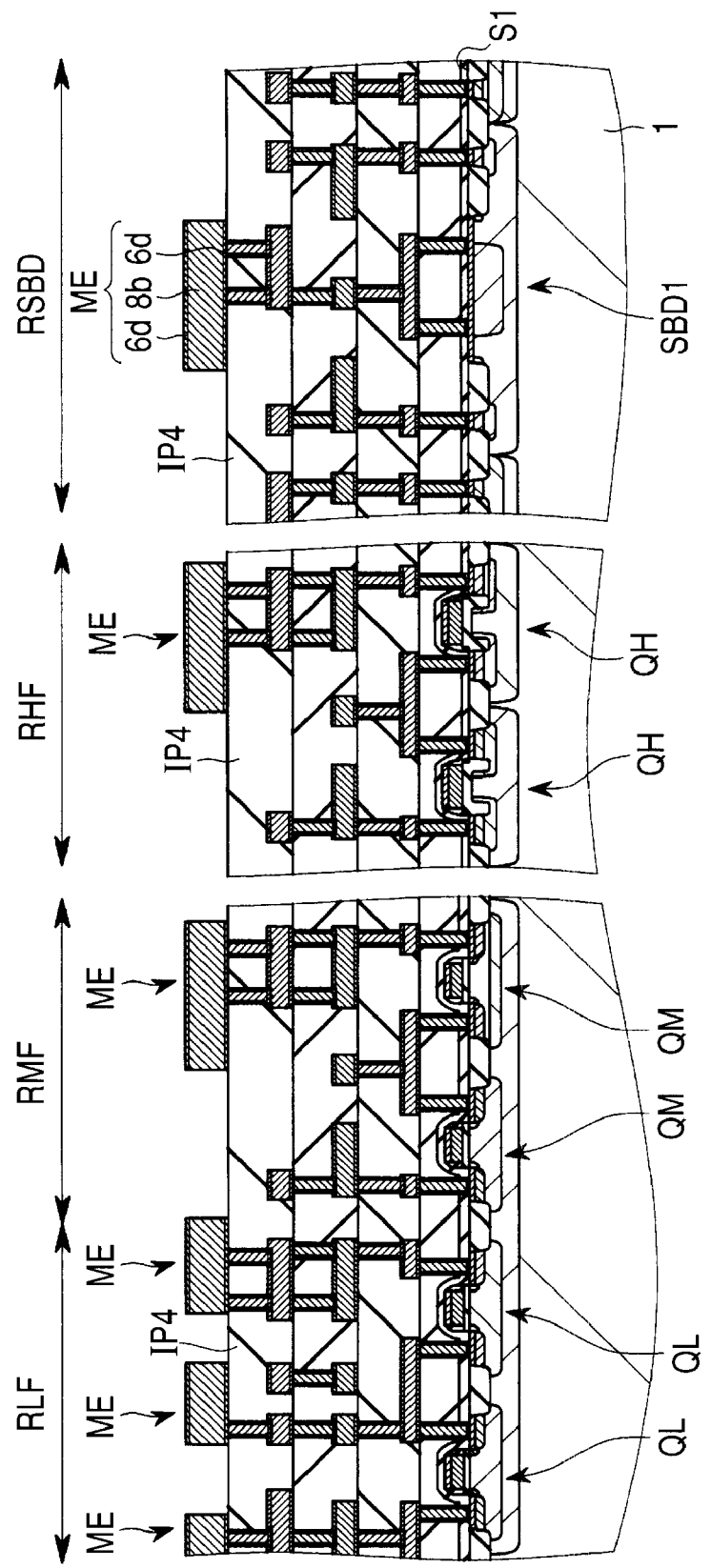
FIG. 28 is a fragmentary sectional view in the manufacturing process of the semiconductor device, following FIG. 27.

Next, as shown in FIG. 28, metal electrodes ME are formed over the top interlayer insulating film IP4 in the first preferred embodiment. The metal electrodes ME are also comprised of a material similar to that for each of the wiring layers M1 through M3 or the like. That is, each of the metal electrodes ME takes a structure in which a conductor film 8b comprised of, for example, an alloy or the like of aluminum and copper is interposed between barrier metals 6d or the like each comprised principally of, for example, titanium nitride.

Here, the metal electrodes ME are finally exposed to the outside. Thus, the upper barrier metal 6d is formed relatively thick to prevent that soft oxidative aluminum that forms the conductor film 8 corresponding to a main wiring material is exposed by a subsequent process step or the like. For example, the upper barrier metal 6b in the first wiring layer M1 is assumed to be about 20 [nm], whereas the upper barrier metal 6d in each metal electrode ME is assumed to be about 75 [nm].

Figure 29:
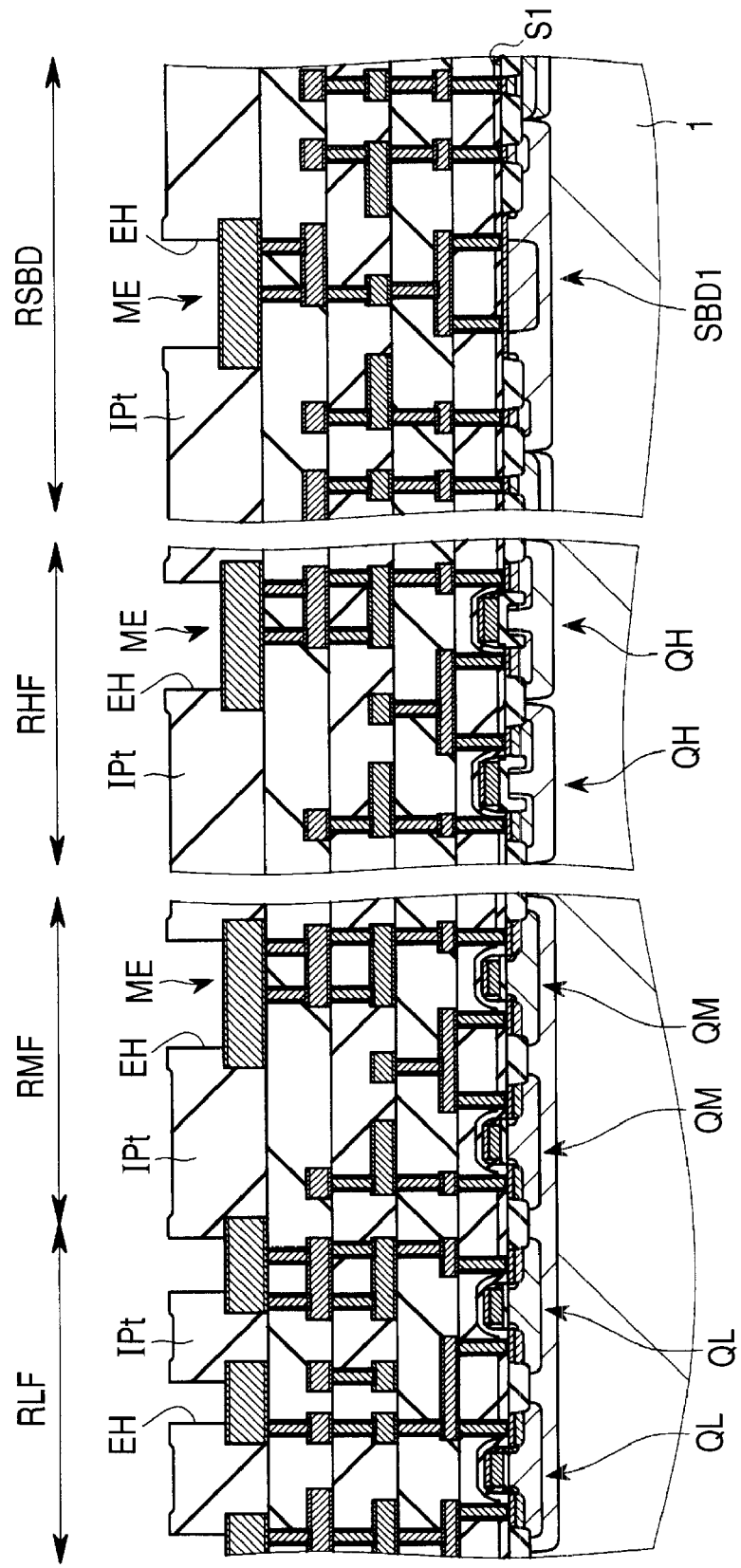
FIG. 29 is a fragmentary sectional view in the manufacturing process of the semiconductor device, following FIG. 28.

Next, as shown in FIG. 29, a protection insulating film IPt comprised of, for example, silicon oxide, silicon nitride or the like is formed so as to cover each metal electrode ME. Here, the protection insulating film IPt is formed by, for example, the CVD method, the TEOS-CVD method and the like.

Thereafter, such openings EH as to expose the metal electrodes ME are formed by the photolithography method and the anisotropic etching method or the like. For example, so-called wire bonding or bump electrode and the like are formed at the metal electrodes ME exposed in this way. Thus, the metal electrodes are electrically coupled to other semiconductor chips each equipped with an external circuit, a wiring board or integrated circuits different in function.

In the first preferred embodiment as described above, the Schottky barrier diode SBD1 having the configuration described using FIG. 10 can be formed by applying the process steps for forming the various field effect transistors QL, QM and QH that form the LCD driver, as described using FIGS. 14 through 29. That is, when all the configurations containing the basic configuration of the Schottky barrier diode SBD1 whose effects have been described in the first preferred embodiment, and its wiring structure are formed over the semiconductor chip, there is no need to introduce new process steps specialized for the Schottky barrier diode SBD1. Thus, a Schottky barrier diode having a new effect can be formed over a semiconductor chip identical to the LCD driver by the same process as the manufacturing process of the semiconductor device used up to now. The introduction of the new process steps in the manufacturing process of the semiconductor device cause a reduction in yield and an increase in manufacturing cost, and the introduction of a new inspecting process step is also required, thus leading to impairment of the reliability of the semiconductor device. Thus, the reliability of the semiconductor device can be further enhanced as a consequence by applying the semiconductor device manufacturing method illustrated in the first preferred embodiment.

Second Preferred Embodiment

The first preferred embodiment has shown the example in which the n-type cathode region high in concentration is formed from a distance physically from the p-type guard ring at the end of the Schottky junction in the Schottky barrier diode formed over the semiconductor chip, thereby to improve the breakdown voltage relative to the backward voltage. The second preferred embodiment will illustrate a Schottky barrier diode having a structure in which the periphery of a p-type guard ring is covered with a p-type semiconductor region low in concentration thereby to isolate an n-type cathode region high in concentration therefrom.

A semiconductor device according to the second preferred embodiment of the present invention is equivalent to one in which an integrated circuit based on a plurality of field effect transistors and the like, and a Schottky barrier diode are formed over the same semiconductor chip as an LCD driver capable of manifesting desired functions.

Figure 30:
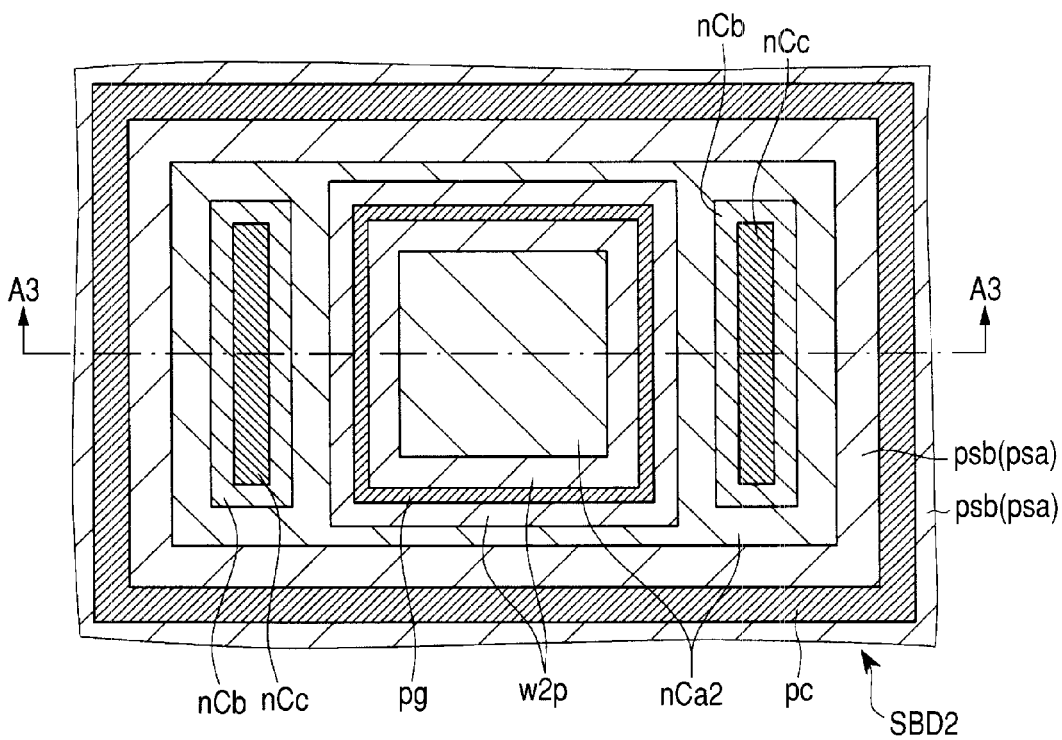
FIG. 30 is a fragmentary plan view of a semiconductor device showing another embodiment of the present invention.
Figure 31:
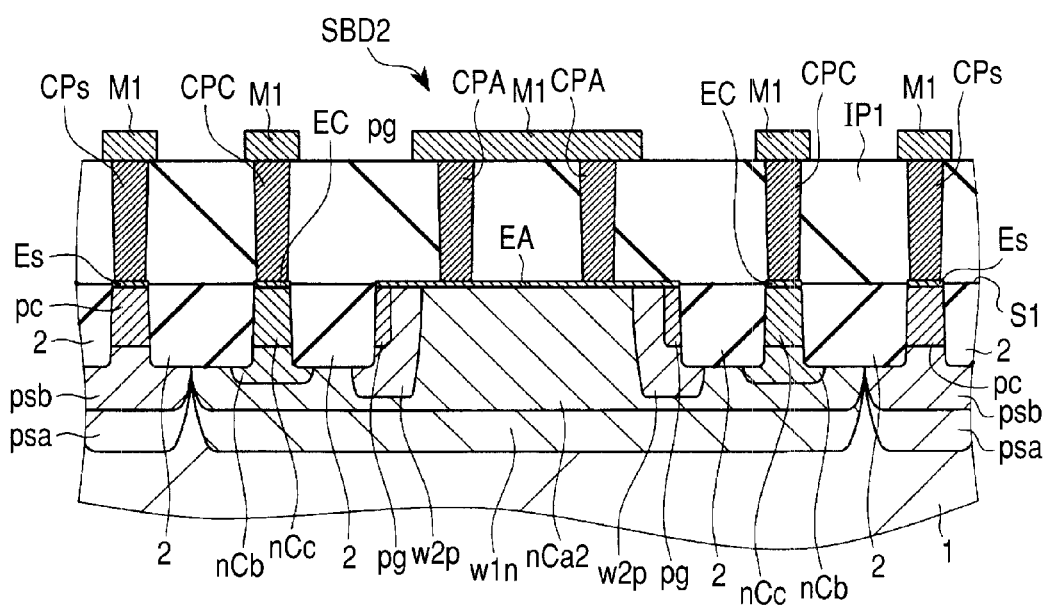
FIG. 31 is a fragmentary sectional view taken along line A3-A3 of the semiconductor device shown in FIG. 30.

FIG. 30 shows a plan view of a Schottky barrier diode SBD2 formed within the semiconductor chip. FIG. 31 shows a sectional view taken along line A3-A3 of FIG. 30. A structure or configuration of the Schottky barrier diode SBD2 illustrated in the second preferred embodiment will be explained below in detail using FIGS. 30 and 31. It will be explained while comparing with the Schottky barrier diode SBD1 having the structure described using FIGS. 9 and 10 in the first preferred embodiment.

The Schottky barrier diode SBD2 illustrated in the second preferred embodiment has a different configuration within an n-well region win as compared with the Schottky barrier diode SBD1 according to the first preferred embodiment and is similar thereto except for it.

An n-type cathode region (first semiconductor region) nCa2 corresponding to an n-type semiconductor region is formed within the n-well region win of the Schottky barrier diode SBD2 so as to integrally contain n-type cathode conduction regions nCb and a p-type guard ring region pg. Here, the n-type cathode region nCa2 and an anode conductor film EA are Schottky-coupled and carriers in the Schottky barrier diode SBD2 drift across the n-type cathode region nCa2. The impurity concentration thereof is set to the same degree as the n-type cathode region nCa1 in the Schottky barrier diode SBD1 illustrated in the first preferred embodiment.

Further, a low-concentration p-well region (second well region) w2p corresponding to a p-type semiconductor region is formed within the n-well region win of the Schottky barrier diode SBD2 so as to include the periphery of the p-type guard ring region pg. The impurity concentration of the low-concentration p-well region w2p is set lower than that of the p-type guard ring region pg. That is, the low-concentration p-well region w2p isolates the p-type guard ring region pg formed at the end of the anode conductor film EA and the n-type cathode region nCa2 high in impurity concentration from each other.

The Schottky barrier diode SBD2 illustrated in the second preferred embodiment is different in the above configuration from the Schottky barrier diode SBD1 illustrated in the first preferred embodiment. Since the present Schottky barrier diode is similar in other configuration to the Schottky barrier diode SBD1 shown in the first preferred embodiment described using FIGS. 9 and 10, its description is omitted herein.

Figure 32:
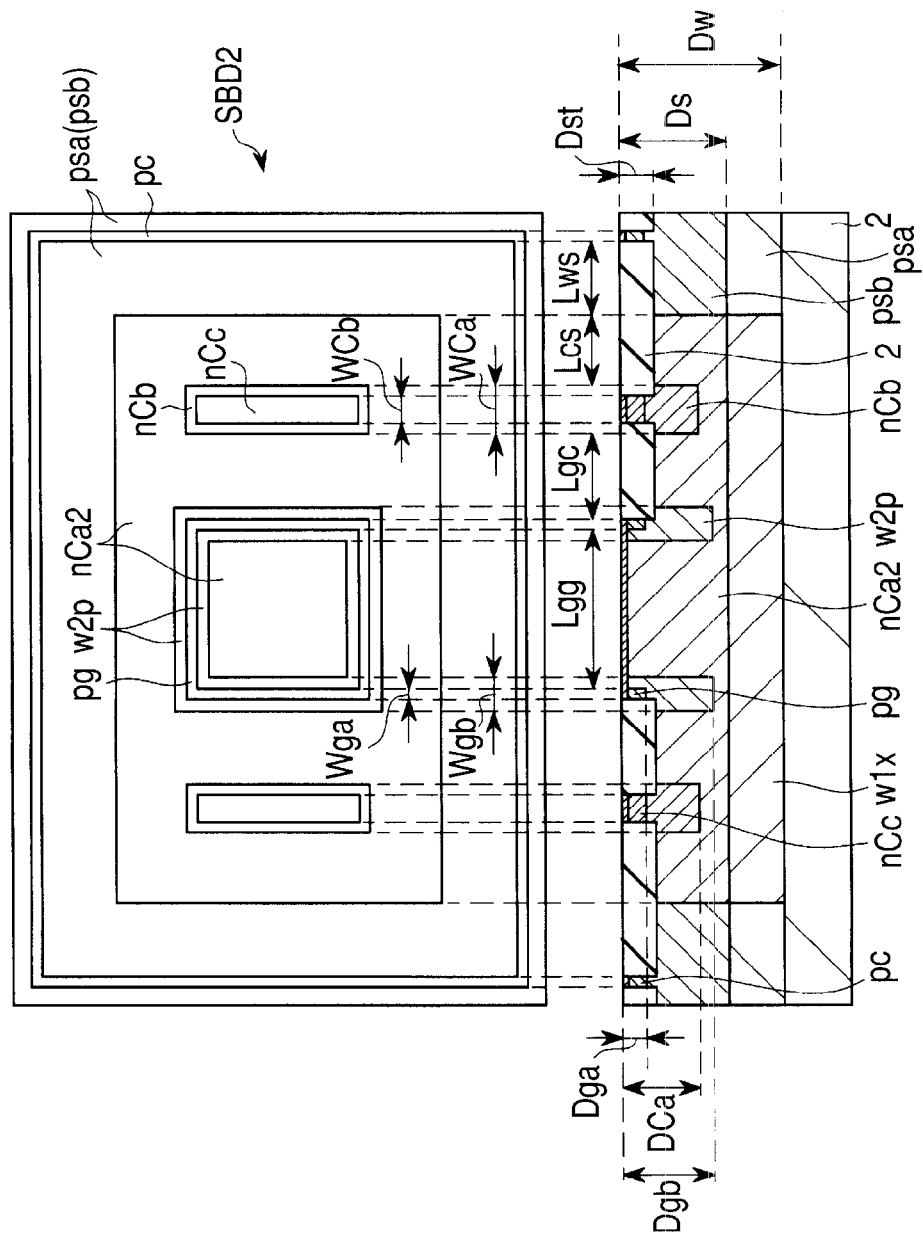
FIG. 32 is an explanatory view showing dimensions of respective semiconductor regions in the semiconductor device shown in FIG. 30.

A summary of examples illustrative of plane dimensions and depth dimensions of the respective semiconductor regions as to the Schottky barrier diode SBD2 of the above configuration, which is illustrated in the second preferred embodiment, is shown in FIG. 32. As examples at typical or representative spots or places of the dimensions in the plane direction of the semiconductor substrate 1, there may be mentioned a cathode region width WCa=1.5 [μm], a cathode electrode width WCb=0.86 [μm], a guard ring width Wga=0.32 [μm], a low-concentration guard ring width Wgb=0.4 [μm], a guard ring-to-guard ring distance Lgg=5 [μm], a guard ring/cathode distance Lgc=2.68 [μm], a cathode/power-feeding portion distance Lcs=2.2 [μm] and a well/power-feeding portion distance Lws=2.31 [μm]. As examples at representative spots of the dimensions in the depth direction of the semiconductor substrate 1, there may be mentioned a well depth Dw=5 [μm], a power-feeding portion depth Ds=1.1 [μm], a cathode depth DCa=0.8 [μm] a separation portion depth Dst=0.35 [μm], a guard ring depth Dga=0.25 [μm] and a low-concentration guard ring depth Dgb=0.8 [μm].

In the second preferred embodiment, the following effects can be expected since the Schottky barrier diode SBD2 having the above configuration is set. It is possible to ensure a forward current, i.e., hold forward characteristics by setting the n-type cathode region nCa2 across which the carriers drift, to a high impurity concentration in the Schottky barrier diode SBD2. With the formation of the low-concentration p-well region w2p of low impurity concentration around the p-type guard ring, a depletion layer at a pn junction between the p-well region w2p and the n-type cathode region nCa2 can be spread gently within the low-concentration p-well region w2p even though an electric field concentrates due to a backward voltage. Thus, a change in the electric field in the depletion layer with respect to the backward voltage becomes gentle, thereby making it possible to enhance the breakdown voltage.

Figure 33:
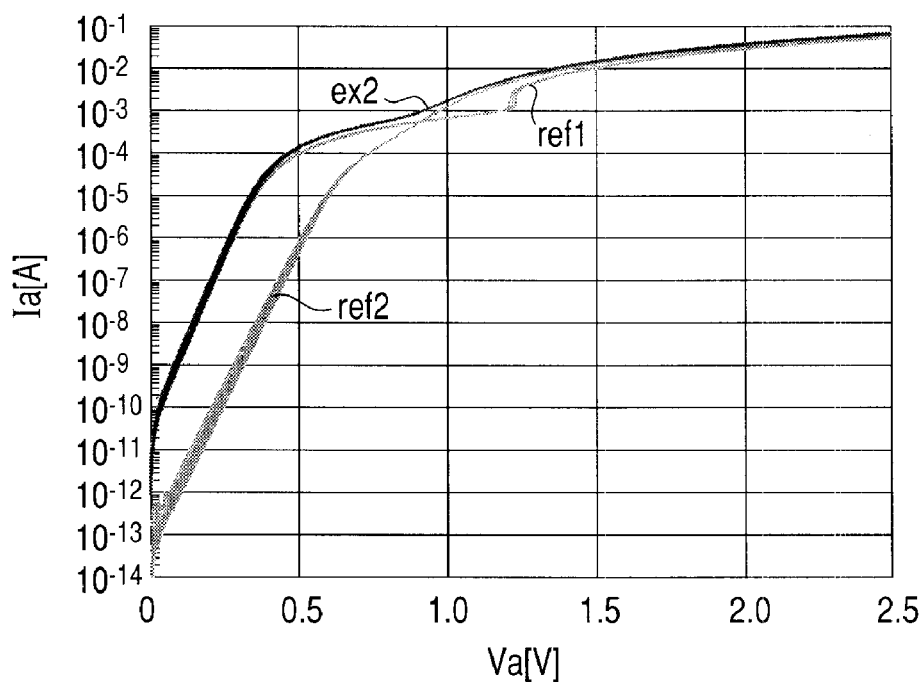
FIG. 33 is a graph diagram showing the relationship between a forward voltage and current at electrical characteristics of a semiconductor device illustrative of a second preferred embodiment of the present invention.
Figure 34:
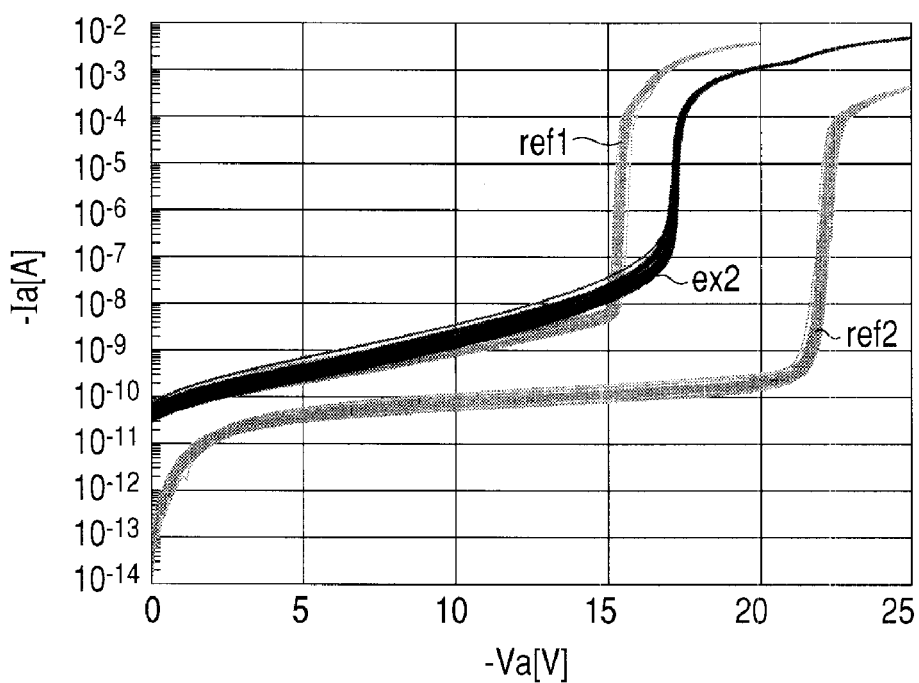
FIG. 34 is a graph diagram showing the relationship between a backward voltage and current at the electrical characteristics of the semiconductor device illustrative of the second preferred embodiment of the present invention.

Actually, the present inventors et al. have evaluated the electrical characteristics of the Schottky barrier diode SBD2 illustrated in the second preferred embodiment. FIG. 33 shows forward characteristics and FIG. 34 shows backward characteristics. Curve groups shown in light gray color in the drawings show the same characteristics of the Schottky barrier diode SBDa and SBDb discussed by the present inventors et al. and have been described simultaneously for comparison. A method of representing those is similar to FIGS. 12 and 13 in the first preferred embodiment. However, the characteristic of the Schottky barrier diode SBD2 of structure illustrated in the second preferred embodiment is marked with a symbol ex2 and shown in black solid lines.

At the forward characteristics as shown in FIG. 33, a value of current Ia=1.0×10$^{-5}$ [A] or so is obtained when the voltage Va=0.3[V], for example. Thus, the rising characteristic assumes the characteristic similar to the characteristic ref1 of the Schottky barrier diode SBDa discussed by the present inventors et al. and is satisfactory as the low resistance characteristic. Incidentally, such a high rising voltage and high resistance characteristic as seen in another Schottky barrier diode SBDb discussed by the present inventors et al. do not appear. This corresponds to an effect based on a result obtained by making high the impurity concentration of the n-type cathode region nCa2, which contributes particularly to a current value at the electrical characteristic.

At the backward characteristics as shown in FIG. 34, a breakdown phenomenon becomes remarkable from the neighborhood of the voltage Va=17.5[V]. This shows the characteristic between the two types of Schottky barrier diode SBDa and SBDb discussed by the present inventors et al. That is, although such a high breakdown voltage characteristic as close to that of the Schottky barrier diode SBDb brought to the low concentration in all cathode regions is not obtained, an improvement in the breakdown voltage ranging from about 2 to 2.5[V] is realized as compared with the Schottky barrier diode SBDa of the previously-illustrated structure.

That is, the Schottky barrier diode SBD2 having the configuration illustrated in the second preferred embodiment can obtain such an expected effect as described above in that while the forward current is being held at a large value, the breakdown voltage is improved to the range of about 2 to 2.5[V]. Thus, the Schottky barrier diode SBD2 having a margin ranging from 4 to 4.5[V] with respect to the practically-used breakdown voltage 13[V] can be formed and the applied voltage at screening can be made high. As a result, the reliability of the semiconductor device can be enhanced using the Schottky barrier diode SBD2 of the configuration illustrated in the second preferred embodiment.

A method for forming the Schottky barrier diode SBD2 illustrated in the second preferred embodiment over the semiconductor substrate 1 will next be illustrated. Even in the case of the Schottky barrier diode SBD2 illustrated in the second preferred embodiment in a manner similar to the first preferred embodiment, it is formed over the same semiconductor chip as various elements that form the LCD driver. By a process step identical to a process step for forming a plurality of types of transistors different in breakdown voltage, the Schottky barrier diode SBD2 is also formed simultaneously. That is, all the process steps for forming the Schottky barrier diode SBD2 belong to the same process step as any of the transistor forming process steps.

A method for manufacturing the semiconductor device illustrated in the second preferred embodiment will be explained using FIGS. 35 through 37 in order. Here, many process steps are similar to the semiconductor device manufacturing method described using FIGS. 14 through 29 in the first preferred embodiment. Thus, the process step for forming components peculiar to the Schottky barrier diode SBD2 is mentioned specially in the second preferred embodiment. Unless other process steps similar to the first preferred embodiment are mentioned specially, their detailed explanations will be omitted.

Such a structure as shown in FIG. 16 is first formed by process steps similar to those described using FIGS. 14 through 16 in the first preferred embodiment. That is, isolation or separation portions 2 are formed in a main surface of a semiconductor substrate 1. A device n well dnw, a high breakdown voltage n well nw1 and a high breakdown p well pw1 are formed in their corresponding transistor regions RLF, RMF and RHF. An n-well region win and a p-type substrate power-feeding region psa are formed in their corresponding diode region RSBD.

Figure 35:
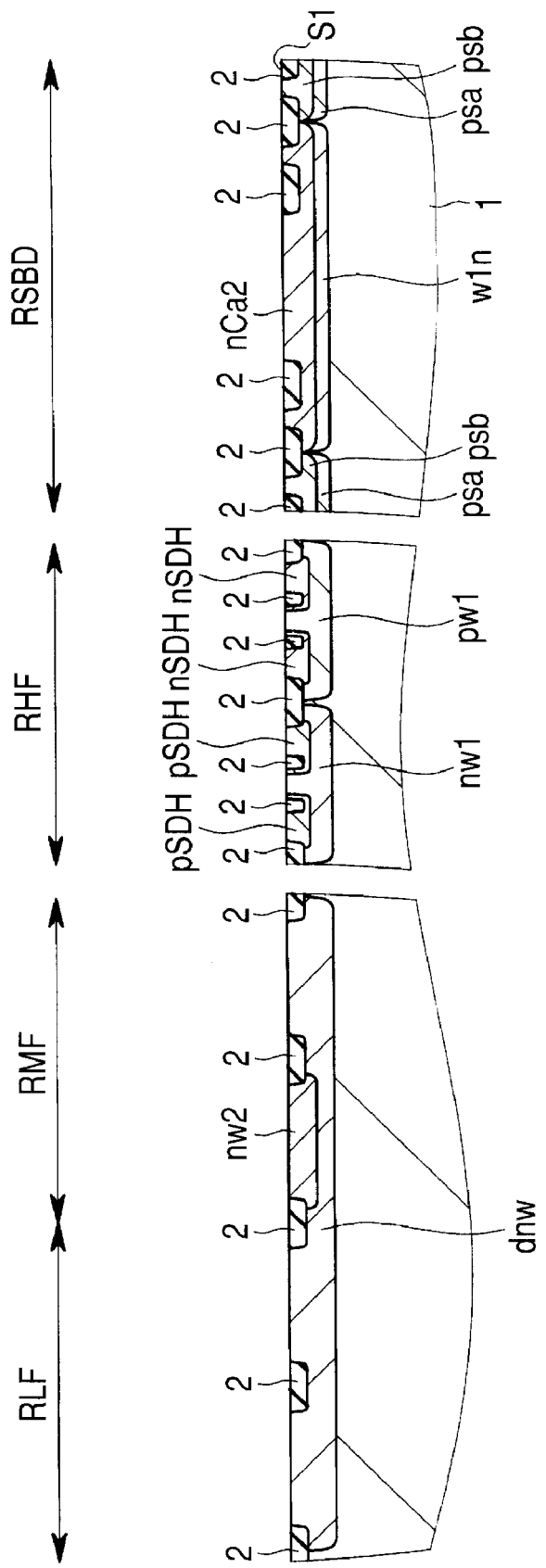
FIG. 35 is a fragmentary sectional view in a manufacturing process of the semiconductor device showing the second preferred embodiment of the present invention.

Next, as shown in FIG. 35, a middle breakdown voltage n well nw2, a high breakdown voltage n-type source/drain nSDH and a high breakdown voltage p-type source/drain pSDH are formed by a process step similar to the process step described using FIG. 17. By the process step for forming the high breakdown voltage p-type source/drain pSDH, a p-type substrate power-feeding region psb is formed in the diode region RSBD simultaneously.

In the second preferred embodiment at this time, an n-type cathode region (first semiconductor region) nCa2 is formed in the diode region RSBD simultaneously by either one or both of the process step for forming the middle breakdown voltage n well nw2 and the process step for forming the high breakdown voltage n-type source/drain nSDH.

Here, the impurity concentration of the n-type cathode region nCa2 becomes higher than that of the n-well region win. This is because the middle breakdown voltage n well nw2 or the high breakdown voltage n-type source/drain nSDH formed simultaneously with the n-type cathode region nCa2 is higher in impurity concentration than the device n well dnw formed simultaneously with the n-well region win. That is, when the Schottky barrier diode SBD2 is formed by a process step identical to the process step for forming the existing transistors, the n-type cathode region nCa2 becomes higher in impurity concentration than the n-well region w1n.

Figure 36:
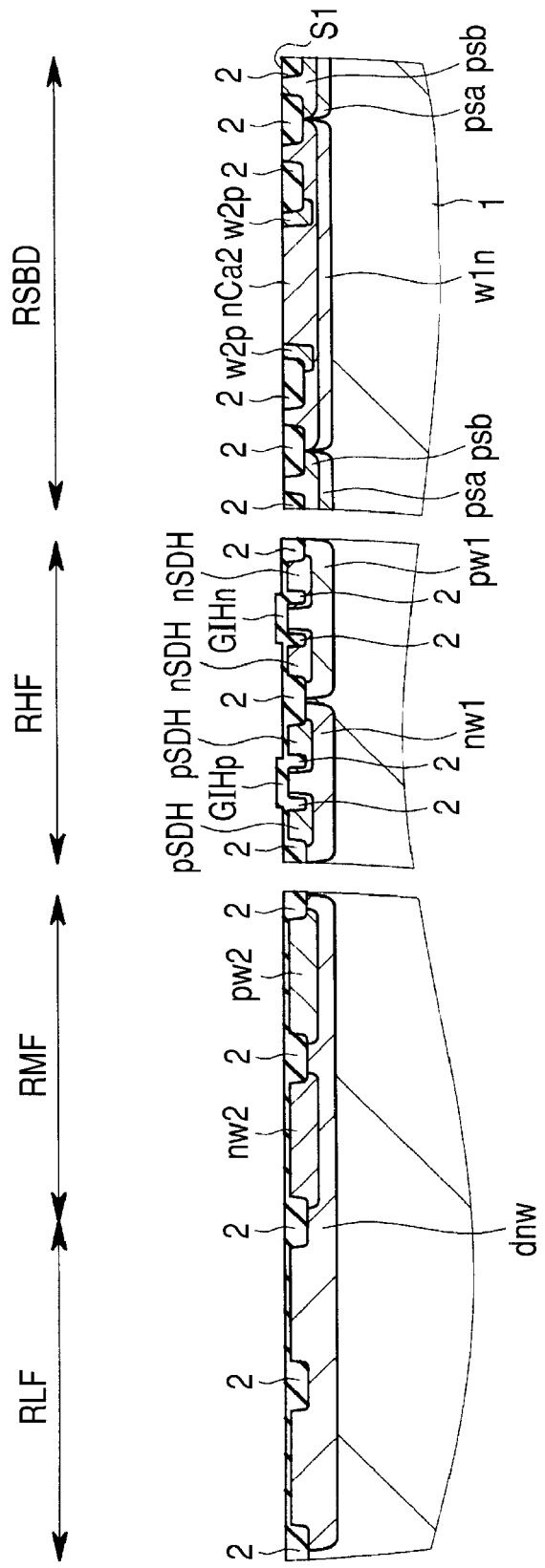
FIG. 36 is a fragmentary sectional view in the manufacturing process of the semiconductor device, following FIG. 35.

Next, as shown in FIG. 36, an n-type high breakdown voltage gate insulating film GIHn, a p-type high breakdown voltage gate insulating film GIHp and a middle breakdown voltage p well pw2 are formed by a process step similar to the process step described using FIG. 18.

In the second preferred embodiment at this time, a low-concentration p-well region (second well region) w2p is formed in the diode region RSBD simultaneously by the process step for forming the middle breakdown voltage p well pw2.

Here, in the second preferred embodiment, it is desirable to set the impurity concentration of the low-concentration p-well region w2p to the same degree as that of the n-type cathode region nCa2 in terms of the formation of the low-concentration p-well region w2p in a desired size. This is because when the low-concentration p-well region w2p and the n-type cathode region nCa2 are close to each other in impurity concentration upon an annealing process frequently executed in the manufacturing process, the boundary position of the pn junction is hard to move. Thus, if the diffusion layers close to each other in impurity concentration are taken, then the accuracy of dimension is enhanced.

Even from such a viewpoint, the middle breakdown voltage n well nw2 or the high breakdown voltage n-type source/drain nSDH formed simultaneously with the n-type cathode region nCa2, and the middle breakdown voltage p well pw2 formed simultaneously with the low-concentration p-well region w2p have impurity concentrations of the same degree originally and meet the demand. Here, since the middle breakdown voltage p well pw2 is formed within the device n well dnw as the purpose for device isolation, the former is always brought to the high concentration. Thus, in the present embodiment, the low-concentration p-well region w2p formed simultaneously with the middle breakdown voltage p well pw2, and the n-type cathode region nCa2 held in the impurity concentration of the same degree are set higher in impurity concentration than the n-well region win formed simultaneously with the device n well dnw.

Figure 37:
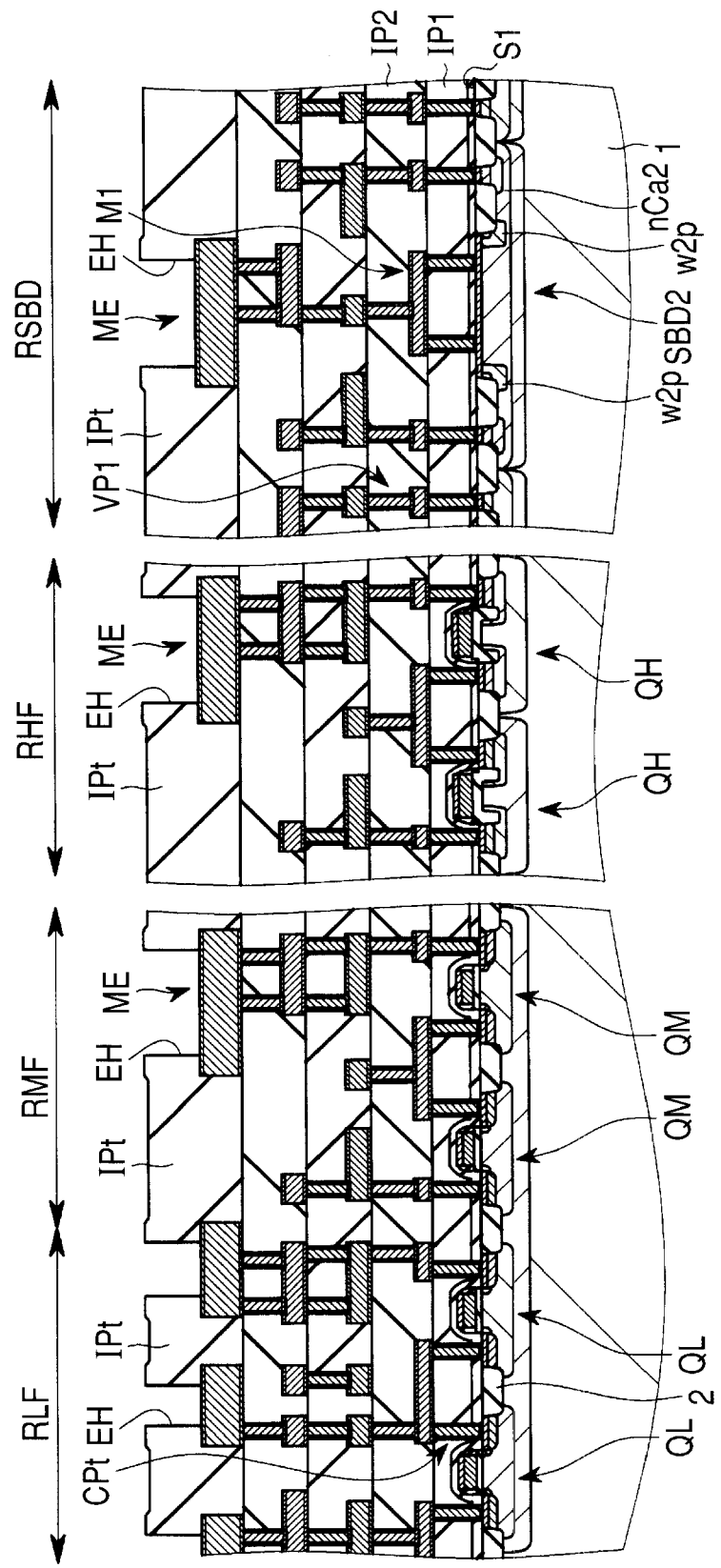
FIG. 37 is a fragmentary sectional view in the manufacturing process of the semiconductor device, following FIG. 36.

In the subsequent process steps, a semiconductor device having such a structure as shown in FIG. 37 according to the second preferred embodiment is formed by performing process steps similar to the method described using FIGS. 19 through 29 in the first preferred embodiment. Described specifically, low breakdown voltage transistors QL, middle breakdown voltage transistors QM and high breakdown voltage transistors QH are formed over a main surface S1 of a semiconductor substrate 1. In the second preferred embodiment, the Schottky barrier diode SBD2 of the structure described using FIG. 31 is formed over the main surface S1 of the same semiconductor substrate 1. Further, a multilayer wiring layer comprised of, for example, a first wiring layer M1, first via plugs VP1 and an interlayer insulating film IP2 and the like is formed.

In the second preferred embodiment as described above, the Schottky barrier diode SBD2 of the structure described using FIG. 31 can also be formed over the semiconductor substrate 1 by the same process steps as those for other field effect transistors QL, QM, QH and the like. In the Schottky barrier diode SBD2 illustrated in the second preferred embodiment at this time, the n-type cathode region nCa2 and the low-concentration p-well region w2p different in configuration as compared with the Schottky barrier diode SBD1 illustrated in the first preferred embodiment could also be formed without introducing a new process step. Thus, the semiconductor device manufacturing method illustrated in the second preferred embodiment is not accompanied by a reduction in yield, an increase in manufacturing cost and the introduction of a new inspection step. As a consequence, the reliability of the semiconductor device can further be enhanced.

According to the above description using FIG. 36 in the second preferred embodiment, the low-concentration p-well region w2p in the diode region RSB was formed simultaneously by the same process step as the middle breakdown voltage p well pw2 in the middle breakdown voltage transistor region RMF. However, this may be formed simultaneously with other process steps shown below.

Figure 38:
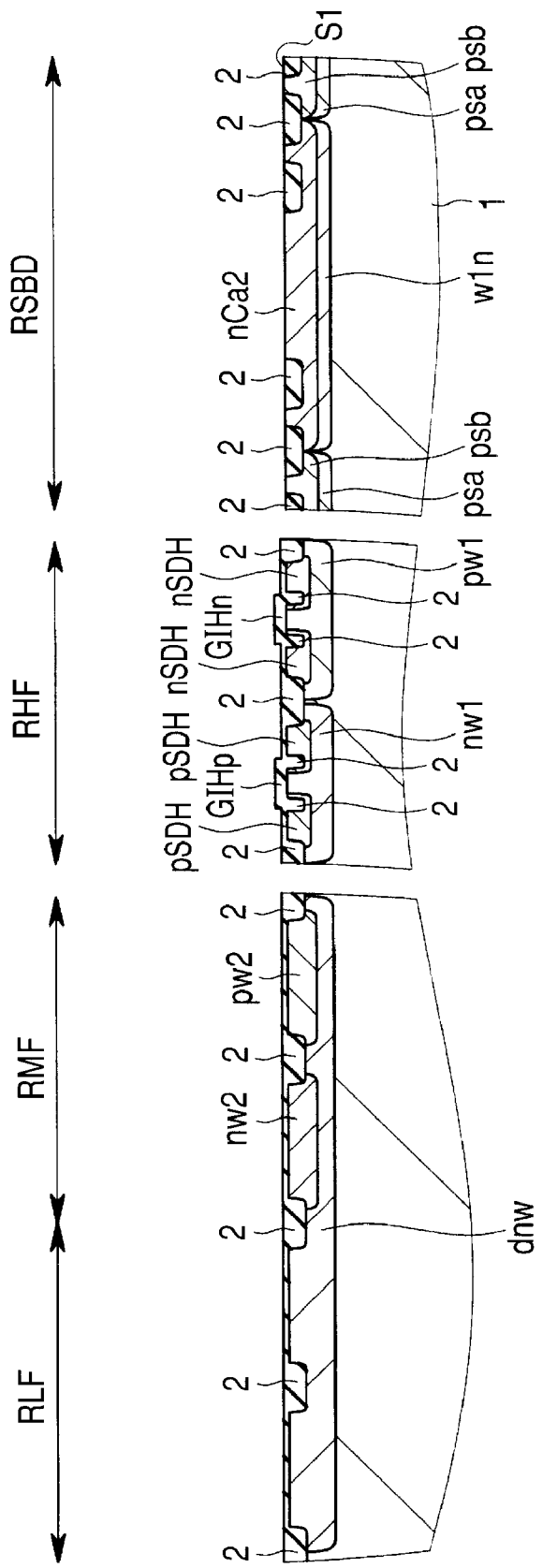
FIG. 38 is a fragmentary sectional view in a manufacturing process of a semiconductor device showing a modification of the second preferred embodiment of the present invention.

Up to the configuration described using FIG. 35 is formed in like manner. Subsequently, the low-concentration p-well region w2p is formed simultaneously with the middle breakdown voltage p well pw2 in the process step using FIG. 36. In a modification of the second preferred embodiment, however, any semiconductor region is not formed in the diode region RSBD as shown in FIG. 38.

Figure 39:
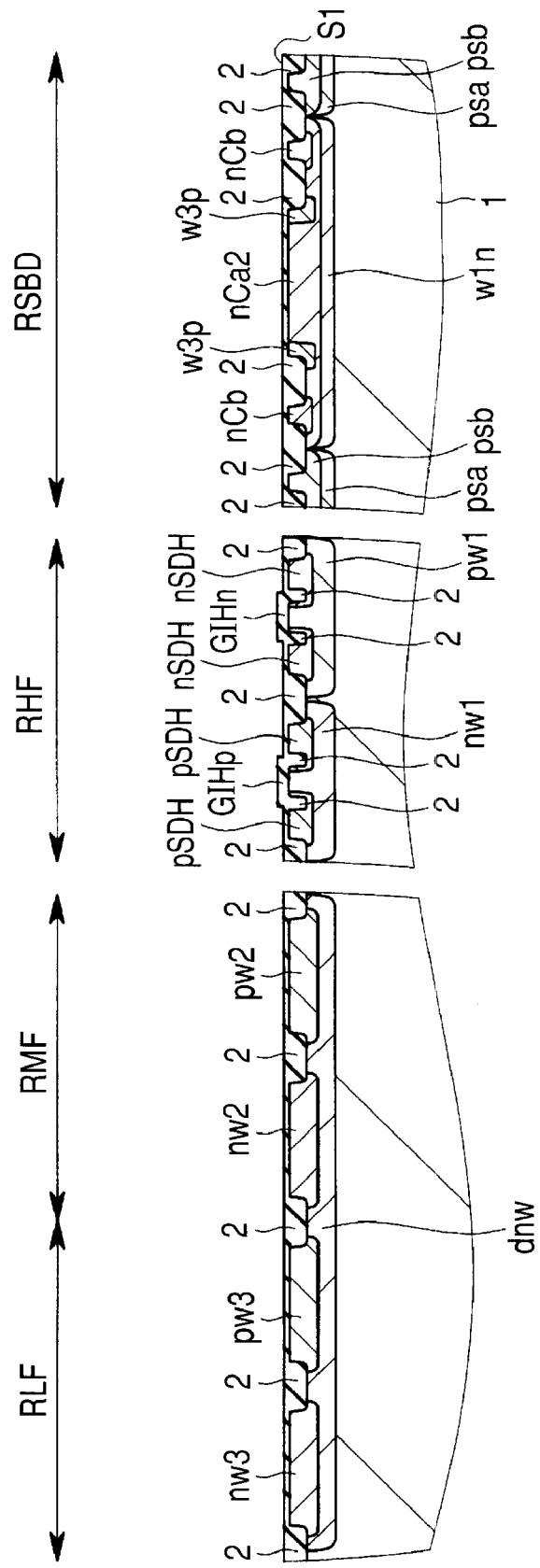
FIG. 39 is a fragmentary sectional view in the manufacturing process of the semiconductor device, following FIG. 38.

Subsequently, as shown in FIG. 39, a low breakdown voltage n well nw3 and a low breakdown voltage p well pw3 are formed in the low breakdown transistor region RLF by a process step similar to the process step described using FIG. 19 in the first preferred embodiment. In the modification of the second preferred embodiment at this time, a low-concentration p-well region (second well region) w3p is formed in the diode region RSBD simultaneously by the process step for forming the low breakdown voltage p well pw3. Here, the impurity concentration of the low-concentration p-well region w3p shown in FIG. 39 in the modification of the second preferred embodiment is of the same degree as the impurity concentration of the low-concentration p-well region w2p shown in FIG. 36 in the second preferred embodiment or higher than it. Configurations other than the above are assumed to be similar.

In its subsequent process steps, a structure similar to one shown in FIG. 37 is formed by applying process steps similar to those for the semiconductor device illustrated previously in the second preferred embodiment.

In the Schottky barrier diode SBD2 of the configuration described using FIG. 31 in the second preferred embodiment as described above, the low-concentration p-well region w2p may be formed as the low-concentration p-well region w3p by the same process step as that for the low breakdown voltage p well pw3. Thus, the concentrations of the low-concentration p-well regions w2p and w3p that surround the p-type guard ring region pg can be changed without adding a manufacturing process newly.

Figure 40:
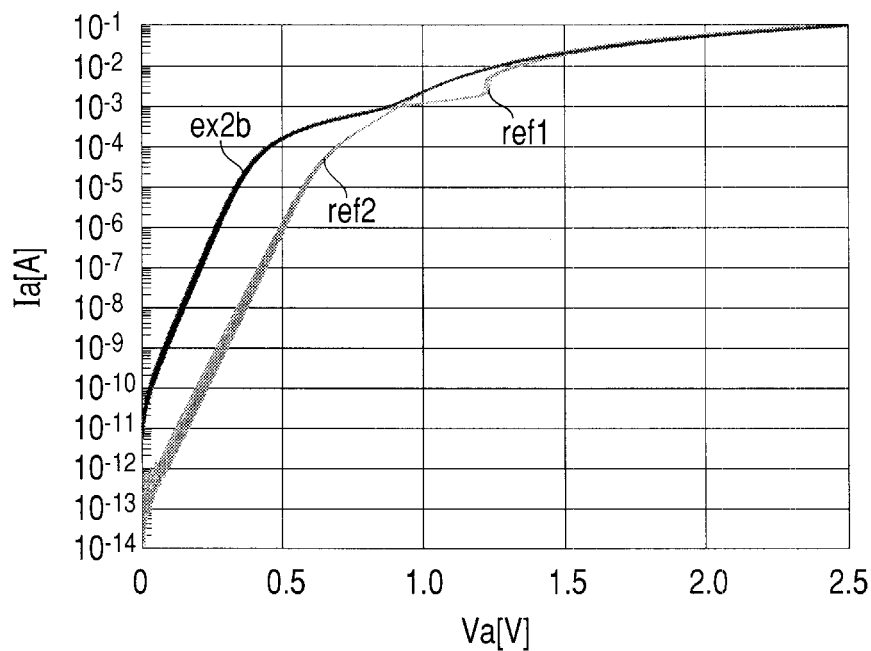
FIG. 40 is a graph diagram showing the relationship between a forward voltage and current at electrical characteristics of the semiconductor device illustrative of the modification of the second preferred embodiment of the present invention.
Figure 41:
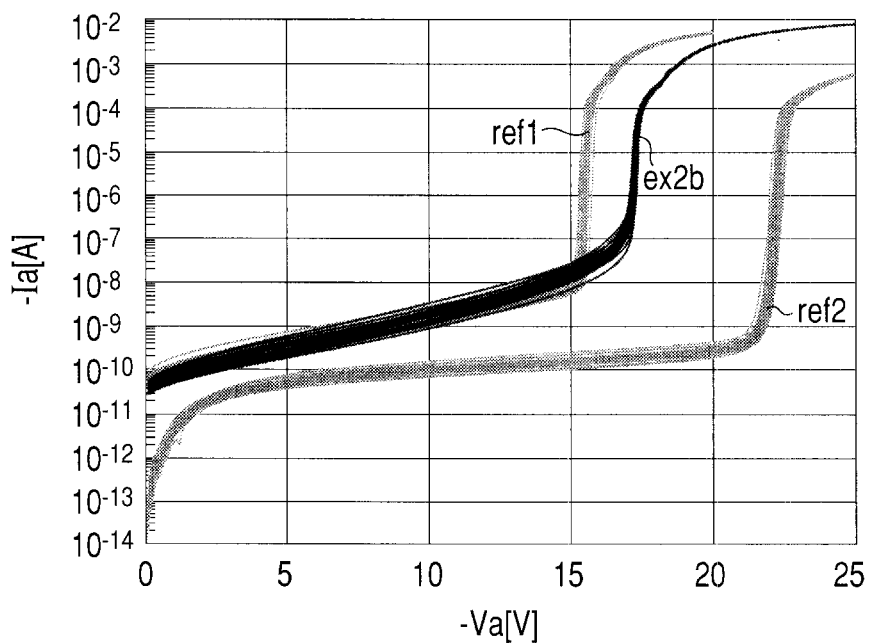
FIG. 41 is a graph diagram showing the relationship between a backward voltage and current at the electrical characteristics of the semiconductor device illustrative of the modification of the second preferred embodiment of the present invention.

The present inventors et al. have evaluated the electrical characteristics of the Schottky barrier diode SBD2 formed by the modification of the second preferred embodiment. FIG. 40 shows forward characteristics and FIG. 41 shows backward characteristics. A method of representing the characteristics is similar to the drawings (FIGS. 12, 13 and the like, for example) indicative of the electrical characteristics in the above. However, the characteristics of the Schottky barrier diode SBD2 of structure illustrated in the modification of the second preferred embodiment are marked with a symbol ex2b and shown in black solid lines.

These electrical characteristics are substantially similar to the characteristics of the Schottky barrier diode SBD2 shown using FIGS. 33 and 34 in the second preferred embodiment even both in the forward and backward directions. Described more quantitatively, at the forward characteristic, current $Ia=1.0\times 10^{-5}$ [A] or so is obtained when the voltage $Va=0.3$ [V]. At the backward characteristic, the breakdown voltage takes about 17.5[V].

An effect similar to the first preferred embodiment is obtained even by the semiconductor device manufacturing method illustrated in the modification of the second preferred embodiment as described above. Thus, the reliability of the semiconductor device can be enhanced in a manner similar to the semiconductor device manufacturing method previously illustrated in the second preferred embodiment.

Third Preferred Embodiment

Each of the first and second preferred embodiments has illustrated the technique in which the region low in impurity concentration is formed between the p-type guard ring and the n-type anode region in the Schottky barrier diode formed over the semiconductor substrate, thereby relaxing the influence of the field concentration at the backward bias and enhancing the backward breakdown voltage while the forward current is being maintained. A third preferred embodiment will illustrate a Schottky barrier diode having such a configuration that a backward current is suppressed further effectively by making use of the spread of a depletion layer at a backward bias.

The semiconductor device according to the third preferred embodiment of the present invention is equivalent to one in which an integrated circuit based on a plurality of field effect transistors and the like, and a Schottky barrier diode are formed in the same semiconductor chip, as an LCD driver which can manifest desired functions.

Figure 42:
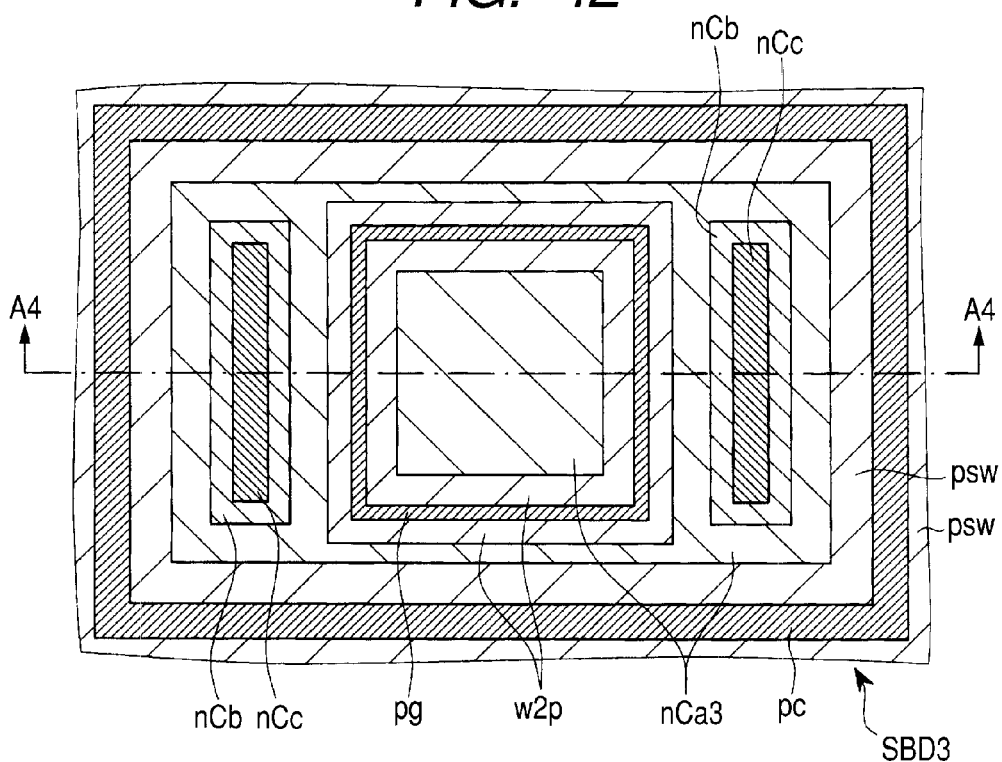
FIG. 42 is a fragmentary plan view of a semiconductor device showing a third preferred embodiment of the present invention.
Figure 43:
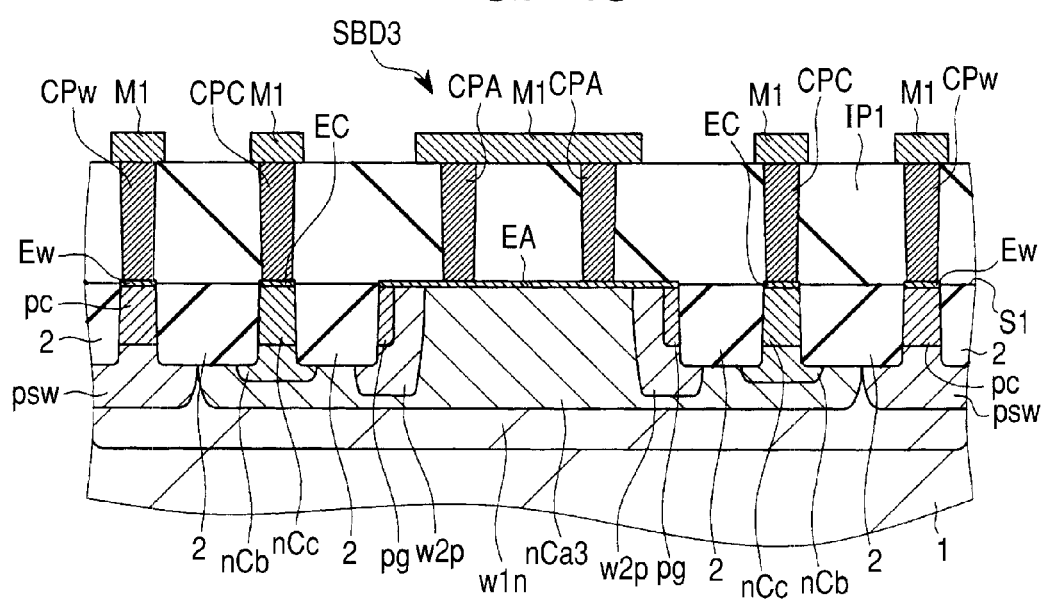
FIG. 43 is a fragmentary sectional view taken along line A4-A4 of the semiconductor device shown in FIG. 42.

FIG. 42 shows a plan view of a Schottky barrier diode SBD3 formed within the semiconductor chip. FIG. 43 shows a sectional view taken along line A4-A4 of FIG. 42. A configuration of the Schottky barrier diode SBD3 illustrated in the third preferred embodiment will hereinafter be described in detail using FIGS. 42 and 43. The present Schottky barrier diode SBD3 will be explained here while comparing with the Schottky barrier diode SBDa of the structure discussed by the present inventors et al. which has been described using FIGS. 1 and 2 in the first preferred embodiment.

The Schottky barrier diode SBD3 illustrated in the third preferred embodiment has different configurations within a p-well region (first well region) w1p as compared with the Schottky barrier diode SBDa discussed by the present inventors et al. in the first preferred embodiment, and is similar thereto except for it.

First, the p-well region w1$p$ of the Schottky barrier diode SBD3 and an n-type cathode region nCa3 lying therein are similar in configuration to the p-well region w1$x$ and n-type cathode region nCa$x$ described using FIG. 2 in the Schottky barrier diode SBDa discussed by the present inventors et al.

In the third preferred embodiment, a low-concentration p-well region (second well region) w2$p$ corresponding to a p-type semiconductor region is formed within the n-type cathode region nCa3 lying in the p-well region w1$p$ of the Schottky barrier diode SBD3 so as to include the periphery of a p-type guard ring region pg. The impurity concentration of the low-concentration p-well region w2$p$ is assumed to be lower than that of the p-type guard ring region pg. That is, the low-concentration p-well region w2$p$ isolates the p-type guard ring region pg formed at the end of an anode conductor film EA, and the n-type cathode region nCa3 high in impurity concentration.

The Schottky barrier diode SBD3 illustrated in the third preferred embodiment is different in the above configuration from the Schottky barrier diode SBDa discussed by the present inventors et al. by way of example in the first preferred embodiment. Since the present Schottky barrier diode is similar in other configuration to the Schottky barrier diode SBDa described using FIGS. 1 and 2, its description is omitted herein.

Figure 44:
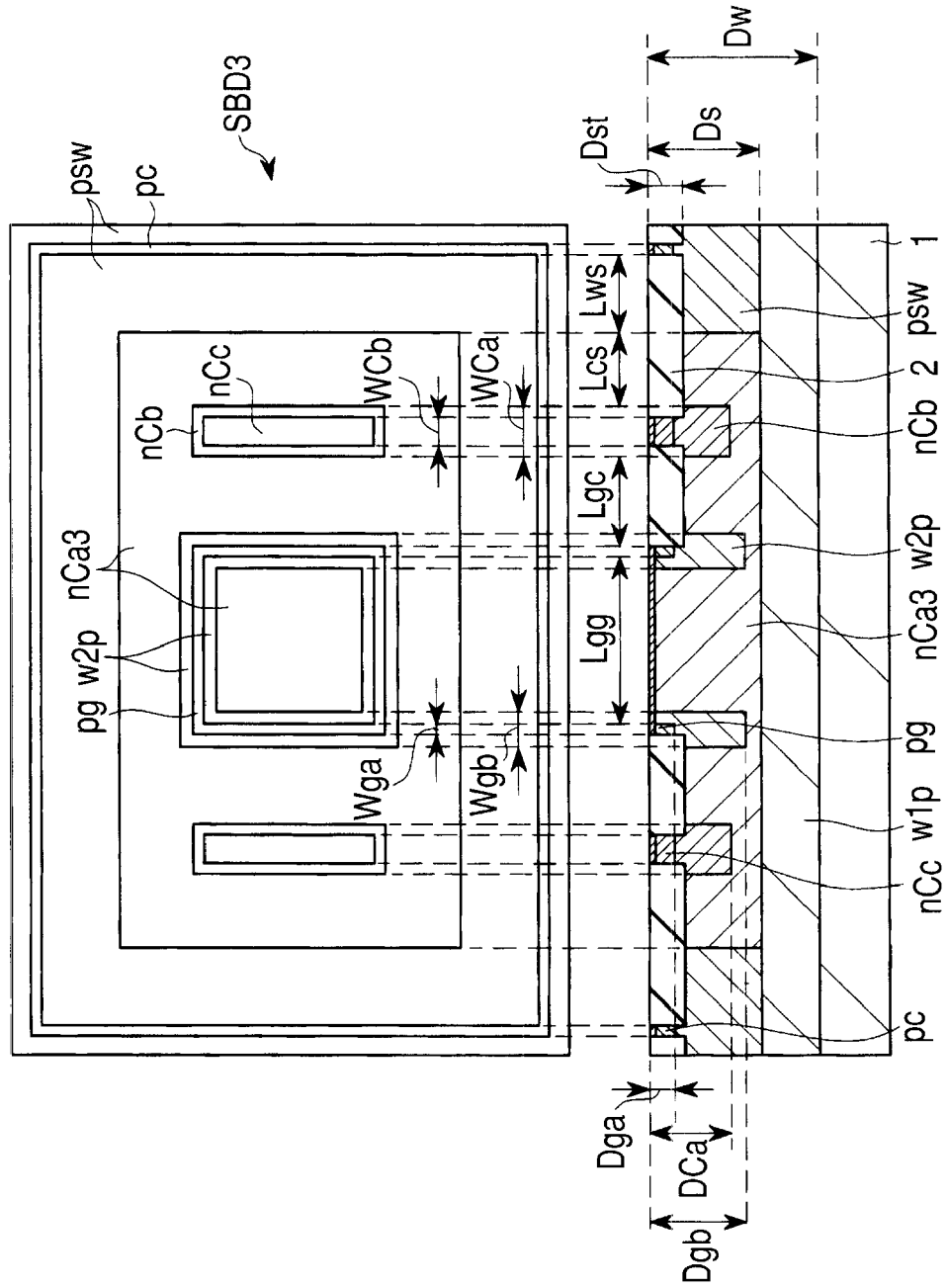
FIG. 44 is an explanatory view showing dimensions of respective semiconductor regions in the semiconductor device shown in FIG. 42.

A summary of examples illustrative of plane dimensions and depth dimensions of the respective semiconductor regions as to the Schottky barrier diode SBD3 of the above configuration, which is illustrated in the third preferred embodiment, is shown in FIG. 44. As examples at typical or representative spots or places of the dimensions in the plane direction of the semiconductor substrate 1, there may be mentioned a cathode region width WCa=1.5 [μm], a cathode electrode width WCb=0.86 [μm], a guard ring width Wga=0.32 [μm], a low-concentration guard ring width Wgb=0.4 [μm], a guard ring-to-guard ring distance Lgg=5 [μm], a guard ring/cathode distance Lgc=2.68 [μm], a cathode/power-feeding portion distance Lcs=2.2 [μm] and a well/power-feeding portion distance Lws=2.31 [μm]. As examples at representative spots of the dimensions in the depth direction of the semiconductor substrate 1, there may be mentioned a well depth Dw=5 [μm], a power-feeding portion depth Ds=1.1 [μm], a cathode depth DCa=0.8 [μm] a separation portion depth Dst=0.35 [μm], a guard ring depth Dga=0.25 [μm] and a low-concentration guard ring depth Dgb=0.8 [μm].

In the third preferred embodiment, the following effects can be expected by providing the Schottky barrier diode SBD3 of the above configuration. First, the low-concentration p-well region w2$p$ is formed so as to surround the p-type guard ring region pg, whereby the improvement in characteristic by the isolation of the p-type guard ring region pg of high impurity concentration and the n-type cathode region nCa3 becomes similar to the effect illustrated in the second preferred embodiment. That is, since the low-concentration p-well region w2$p$ low in impurity concentration exists around the p-type guard ring region pg on which the electric field based on the backward voltage concentrates, and the depletion layer spreads broader, the field concentration can be relaxed and the breakdown voltage at the backward bias can be enhanced. Further, since the n-type cathode region nCa3 corresponding to a conduction path of each carrier is high in impurity concentration, the forward characteristics can be held.

In addition to this, the n-type cathode region nCa3 corresponding to the conduction path of the carriers is formed in the p-well region w1$p$ in the third preferred embodiment.

Further, a p-type well power-feeding region (fourth semiconductor region) psw, a p-type semiconductor region pc, a well power-feeding conductor film (third conductor film) Ew and well power-feeding contact plugs (third conductive portion) CPw are formed in the p-well region w1$p$. When the Schottky barrier diode SBD3 is in an operating state here, it does not depend on its bias direction and the p-well region w1$p$ is supplied with power so as to assume the same potential as its anode.

When it is considered that such a backward voltage as described above is applied in this state, a pn junction between the p-well region w2$p$ including the p-type guard ring region and the n-type cathode region nCa3 is placed under a reverse bias and a pn junction between the p-well region w1$p$ and the n-type cathode region nCa3 is also placed under a reverse bias. Thus, the depletion layer spreads from both directions of the low-concentration p-well region w2$p$ and the p-well region w1$p$ in the n-type cathode region nCa3 upon application of the backward voltage. Here, the transportation of the carriers of the Schottky barrier diode SBD3 is not placed in a reverse sequence and the carries pass through the region interposed between the low-concentration p-well region w2$p$ and the p-well region w1$p$. Thus, the depletion layer interferes with the carrier transport route as described above upon the application of the backward voltage, thus making it possible to reduce a backward current.

Figure 45:
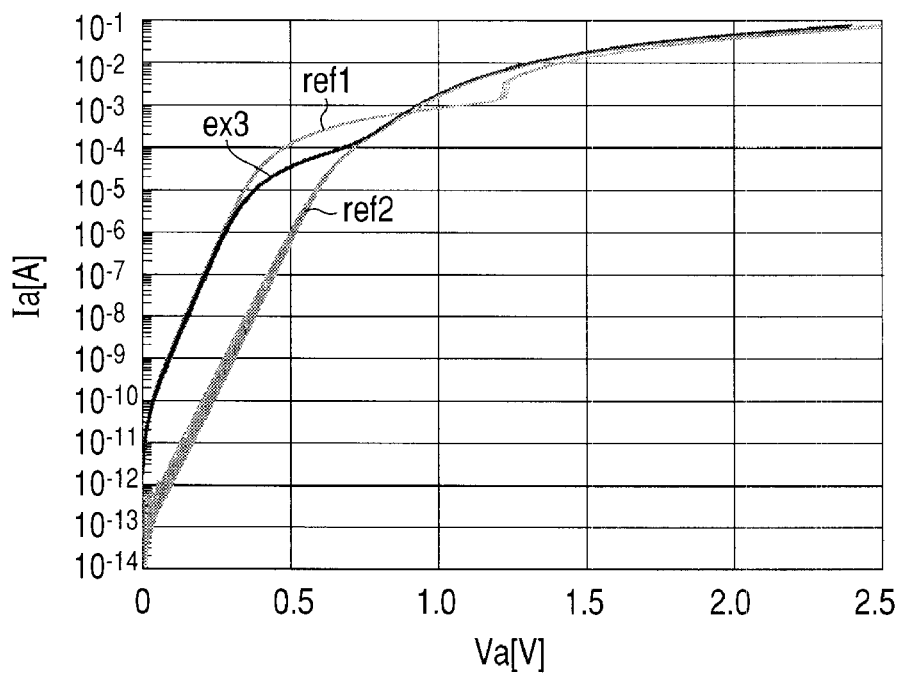
FIG. 45 is a graph diagram showing the relationship between a forward voltage and current at electrical characteristics of the semiconductor device illustrative of the third preferred embodiment of the present invention.
Figure 46:
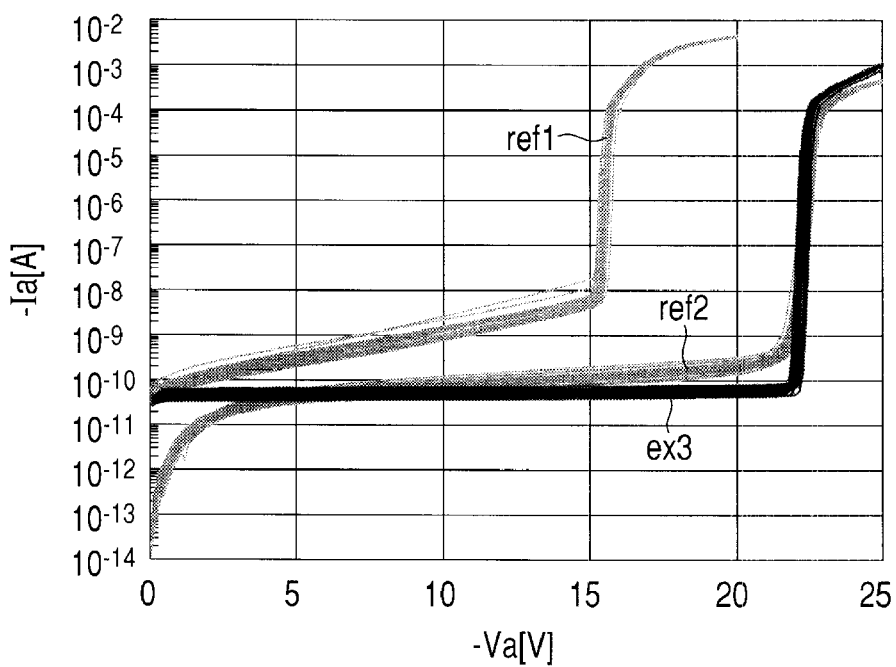
FIG. 46 is a graph diagram showing the relationship between a backward voltage and current at the electrical characteristics of the semiconductor device illustrative of the third preferred embodiment of the present invention.

Actually, the present inventors et al. have evaluated the electrical characteristics of the Schottky barrier diode SBD3 illustrated in the third preferred embodiment. FIG. 45 shows forward characteristics and FIG. 46 shows backward characteristics. Curve groups shown in light gray color in the drawings show the same characteristics of the Schottky barrier diode SBDa and SBDb discussed by the present inventors et al. and have been described simultaneously for comparison. A method of representing those is similar to FIGS. 12 and 13 in the first preferred embodiment. The characteristic of the Schottky barrier diode SBD3 having the configuration illustrated in the third preferred embodiment is marked with a symbol ex3 and indicated in black solid lines.

At the forward characteristics as shown in FIG. 45, for example, a value being slightly below current Ia=$1.0 \times 10^{-5}$ [A] is obtained when the voltage Va=0.3[V], for example. Further, a current Ia value low by about 0.5 digit with respect to the characteristic ref1 of the Schottky barrier diode SBDa discussed by the present inventors et al. is reached in the vicinity of the voltage Va=0.5[V]. However, such a high rising voltage and high resistance characteristic as seen in another Schottky barrier diode SBDb discussed by the present inventors et al. do not appear and a satisfactory riding characteristic is shown. This corresponds to an effect based on a result obtained by making high the impurity concentration of the n-type cathode region nCa3, which contributes particularly to a current value at the electrical characteristic.

At the backward characteristics as shown in FIG. 46, a breakdown phenomenon becomes noticeable from the neighborhood of the voltage Va=22.5[V]. This is a value of the same degree as the breakdown voltage of the Schottky barrier diode SBDb highest in backward breakdown voltage, discussed by the present inventors et al. This results in the fact that an improvement in the breakdown voltage ranging from about 7 to 7.5[V] has been realized as compared with the Schottky barrier diode SBDa of the previously-illustrated structure. Thus, the effect of application of the above configuration illustrated in the third preferred embodiment has been demonstrated.

According to the technique illustrated in the third preferred embodiment as described above, the Schottky barrier diode SBD3 having a margin ranging from 9 to 9.5[V] with respect to the practically-used breakdown voltage 13[V] can be formed and the applied voltage at screening can be more enhanced. As a result, the reliability of the semiconductor device can further be enhanced.

A method of forming the Schottky barrier diode SBD3 illustrated in the third preferred embodiment over its corresponding semiconductor substrate 1 will next be illustrated. Even in the case of the Schottky barrier diode SBD3 illustrated in the third preferred embodiment in a manner similar to the first and second preferred embodiments, it is formed over the same semiconductor chip as various elements that form the LCD driver. By a process step identical to a process step for forming a plurality of types of transistors different in breakdown voltage, the Schottky barrier diode SBD3 is also formed simultaneously. That is, all the process steps for forming the Schottky barrier diode SBD3 belong to the same process step as any of the transistor forming process steps.

A method for manufacturing the semiconductor device illustrated in the third preferred embodiment will be explained using FIGS. 47 through 50 in order. Here, many process steps are similar to the semiconductor device manufacturing method described using FIGS. 14 through 29 in the first preferred embodiment. Thus, the process step for forming components peculiar to the Schottky barrier diode SBD3 is mentioned specially in the third preferred embodiment. Unless other process steps similar to the first preferred embodiment are mentioned specially, their detailed explanations will be omitted.

Such a structure as shown in FIG. 15 is first formed by process steps similar to those described using FIGS. 14 and 15 in the first preferred embodiment. That is, shallow-trench type isolation or separation portions 2 are formed in a main surface of a semiconductor substrate 1.

Figure 47:
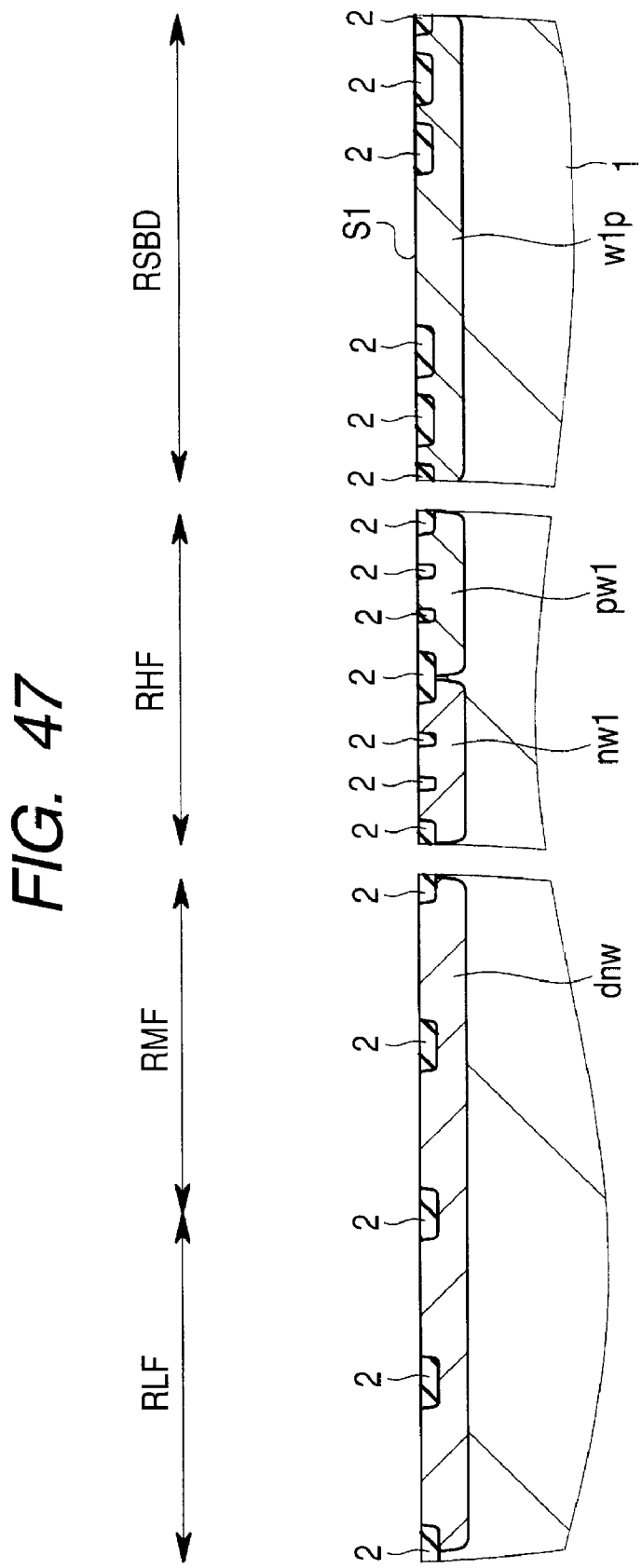
FIG. 47 is a fragmentary sectional view in a manufacturing process of the semiconductor device showing the third preferred embodiment of the present invention.

Next, as shown in FIG. 47, a device n well dnw, a high breakdown voltage n well nw1 and a high breakdown p well pw1 are formed by a process step similar to the process step described using FIG. 16. At this time, a p-well region (first well region) w1$p$ is formed in a diode region or area RSBD simultaneously by the process step for forming the high breakdown voltage p well pw1 in the third preferred embodiment.

Figure 48:
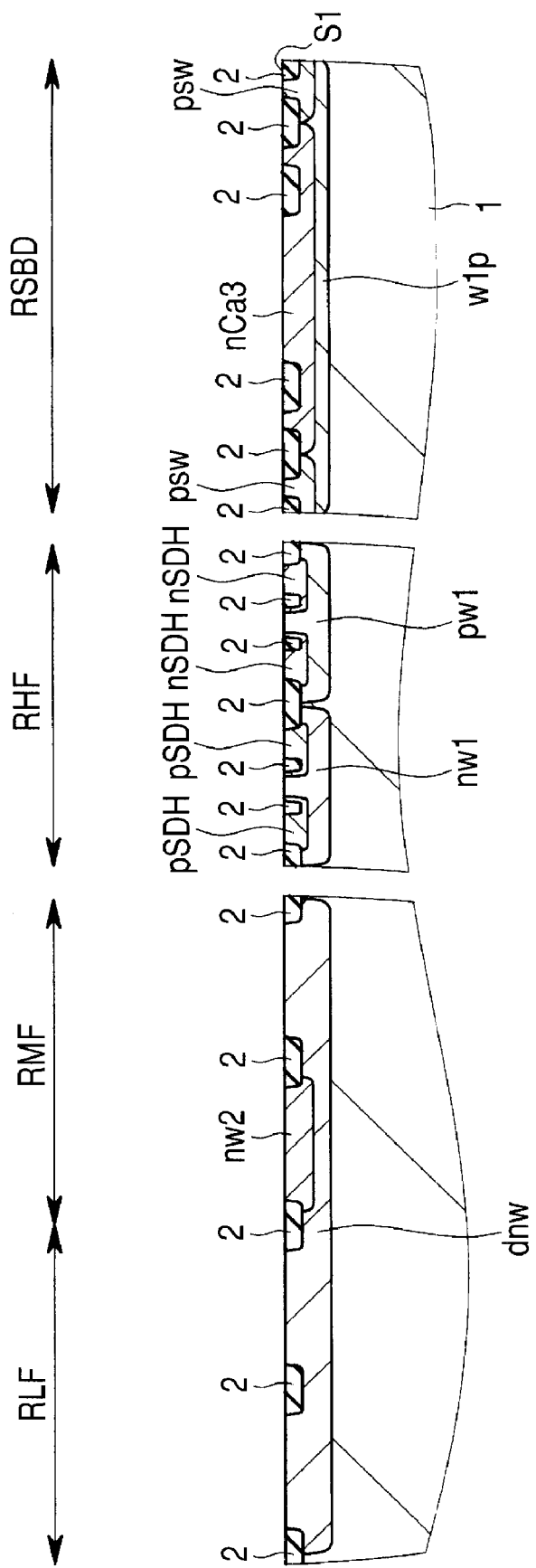
FIG. 48 is a fragmentary sectional view in the manufacturing process of the semiconductor device, following FIG. 47.

Next, as shown in FIG. 48, a middle breakdown voltage n well nw2, a high breakdown voltage n-type source/drain nSDH and a high breakdown voltage p-type source/drain pSDH are formed by a process step similar to the process step described using FIG. 17. By the process step for forming the high breakdown voltage p-type source/drain pSDH, a p-type well power-feeding region (fourth semiconductor region) psw is formed in the diode region RSBD simultaneously. The p-type well power-feeding region psw is formed in a manner similar to the p-type substrate power-feeding region psb in FIG. 17.

In the third preferred embodiment at this time, an n-type cathode region (first semiconductor region) nCa3 is formed in the diode region RSBD simultaneously by either one or both of the process step for forming the middle breakdown voltage n well nw2 and the process step for forming the high breakdown voltage n-type source/drain nSDH.

Figure 49:
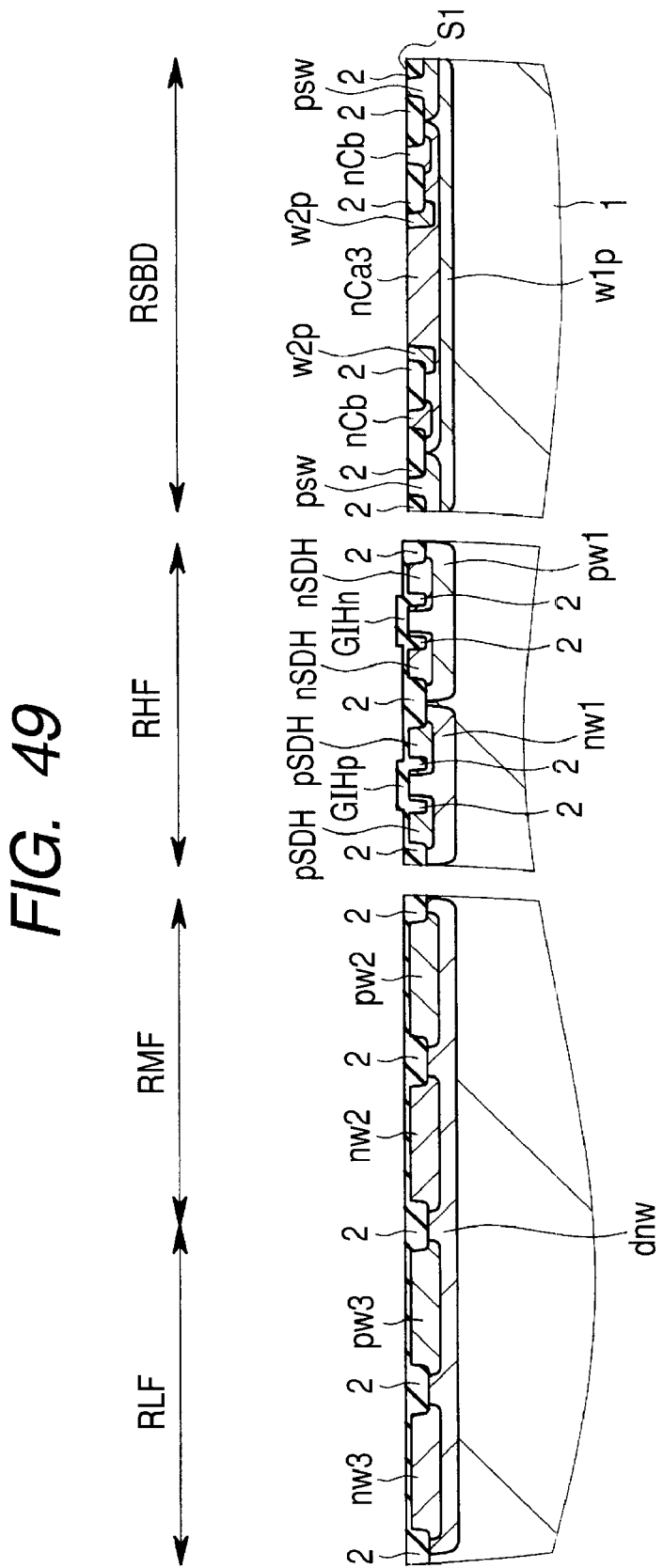
FIG. 49 is a fragmentary sectional view in the manufacturing process of the semiconductor device, following FIG. 48.

Next, as shown in FIG. 49, an n-type high breakdown voltage gate insulating film GIHn, a p-type high breakdown voltage gate insulating film GIHp, a middle breakdown voltage p well pw2, a low breakdown voltage n well nw3 and a low breakdown voltage p well pw3 are formed by a process step similar to the process step described using FIGS. 18 and 19.

In the third preferred embodiment at this time, a low-concentration p-well region (second well region) w2$p$ is formed in the diode region RSBD simultaneously by either one of the process step for forming the middle breakdown voltage p well pw2 and the process step for forming the low breakdown voltage p well pw3.

Figure 50:
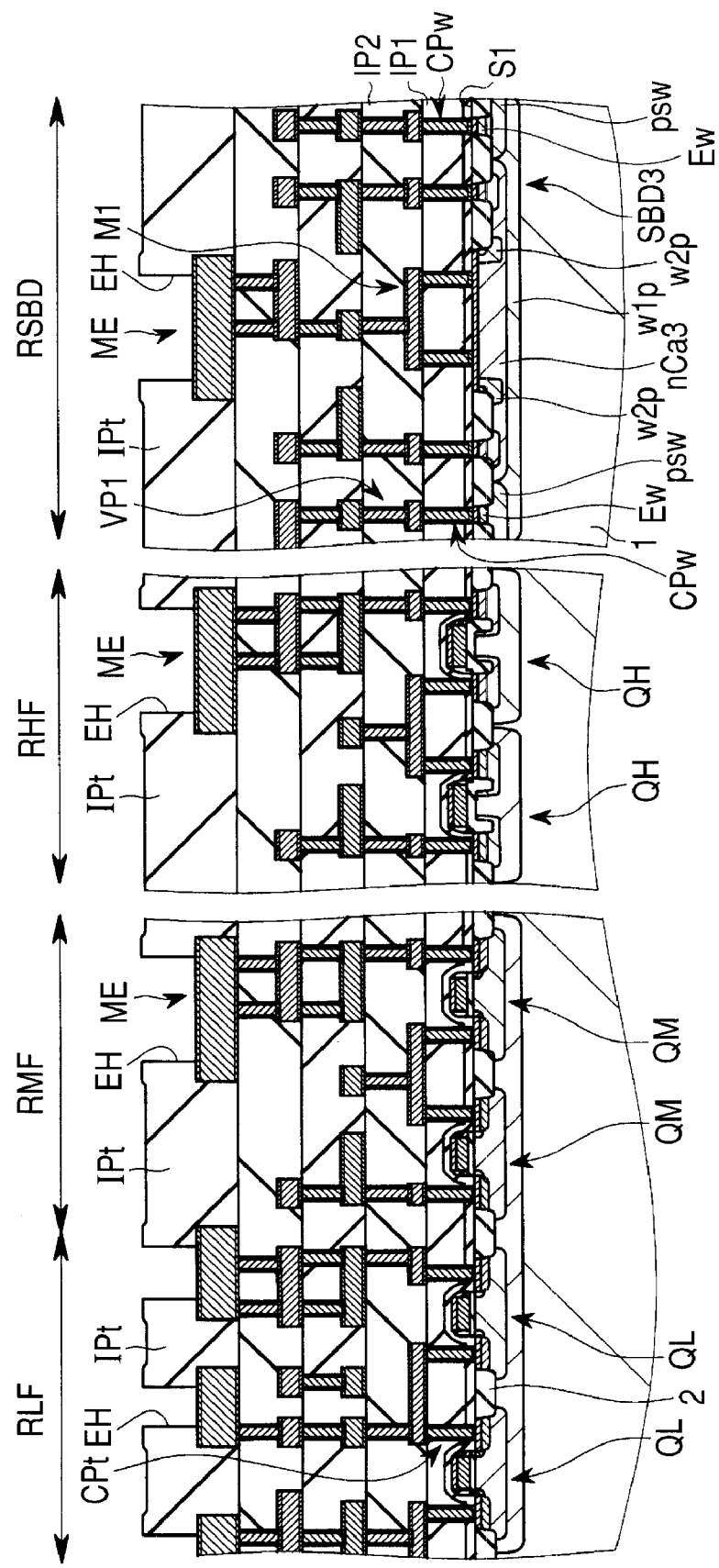
FIG. 50 is a fragmentary sectional view in the manufacturing process of the semiconductor device, following FIG. 49.

In the subsequent process steps, a semiconductor device having such a structure as shown in FIG. 50 according to the third preferred embodiment is formed by performing process steps similar to the method described using FIGS. 20 through 29 in the first preferred embodiment. Described specifically, low breakdown voltage transistors QL, middle breakdown voltage transistors QM and high breakdown voltage transistors QH are formed over a main surface S1 of a semiconductor substrate 1. In the third preferred embodiment, the Schottky barrier diode SBD3 of the structure described using FIG. 43 is formed over the main surface S1 of the same semiconductor substrate 1. Further, a multilayer wiring layer comprised of, for example, a first wiring layer M1, first via plugs VP1 and an interlayer insulating film IP2 and the like is formed.

Here, in a process step for forming a well power-feeding conductor film (third conductor film) Ew and well power-feeding contact plugs (third conductive portion) CPw in the diode region RSBD in the third preferred embodiment, they are formed in a manner similar to the substrate power-feeding conductor film Es described using FIG. 24 and the substrate power-feeding contact plugs CPs described using FIGS. 25 and 26.

In the third preferred embodiment as described above, the Schottky barrier diode SBD3 of the configuration described using FIG. 43 can also be formed over the semiconductor substrate 1 by the same process steps as those for other field effect transistors QL, QM, QH and the like. In the Schottky barrier diode SBD3 illustrated in the third preferred embodiment at this time, the low-concentration p-well region w2$p$ different in configuration as compared with the Schottky barrier diode SBDa illustrated as the example discussed by the present inventors et al. in the first preferred embodiment could also be formed without introducing a new process step. Thus, the semiconductor device manufacturing method illustrated in the third preferred embodiment is not accompanied by a reduction in yield, an increase in manufacturing cost and the introduction of a new inspection step. As a consequence, the reliability of the semiconductor device can further be enhanced.

While the invention made above by the present inventors has been described specifically on the basis of the preferred embodiments, the present invention is not limited to the embodiments referred to above. It is needless to say that various changes can be made thereto without the scope not departing from the gist thereof.

The present invention is applicable to a semiconductor industry necessary to configure or form, for example, a driving integrated circuit of a liquid crystal display.

What is claimed is:

1. A semiconductor device comprising:
   (a) a semiconductor substrate of a first conductivity type;
   (b) a first well region formed in the semiconductor substrate, the first well region being of a second conductivity type opposite to the first conductivity type;
   (c) a first semiconductor region of the second conductivity type, the first semiconductor region being formed within the first well region;
   (d) a second semiconductor region of the first conductivity type, the second semiconductor region being formed so as to surround the first semiconductor region in a plan view;

(e) a first conductor film formed so as to cover the first semiconductor region and the second semiconductor region and to be electrically coupled to the first semiconductor region and the second semiconductor region;

(f) a first conductive portion electrically coupled to the first conductor film;

(g) a separation portion formed over the semiconductor substrate, the separation portion being formed outside the second semiconductor region;

(h) a third semiconductor region of the second conductivity type, the third semiconductor region being formed outside the second semiconductor region such that a portion of the separation portion is between the third semiconductor region and the second semiconductor region;

(i) a second conductor film formed so as to cover the third semiconductor region and to be electrically coupled to the third semiconductor region; and (j) a second conductive portion electrically coupled to the second conductor film, wherein electrical coupling of the first semiconductor region and the first conductor film is of Schottky coupling, wherein the first semiconductor region and the second semiconductor region do not contact each other, wherein the second semiconductor region is formed at a peripheral portion of the first conductor film in the first well region, wherein an impurity concentration of the first semiconductor region is higher than an impurity concentration of the first well region, and wherein the first semiconductor region extends deeper into the first well region than does the separation portion.

2. The semiconductor device according to claim 1, further including:

a fourth semiconductor region of the first conductivity type, the fourth semiconductor region being formed outside the first well region, a third conductor film formed so as to cover the fourth semiconductor region and to be electrically coupled to the fourth semiconductor region, and a third conductive portion electrically coupled to the third conductor film, wherein an impurity concentration of the fourth semiconductor region is higher than an impurity concentration of the semiconductor substrate.

3. The semiconductor device according to claim 2, wherein the fourth semiconductor region is formed so as to surround the first well region in the plan view.

4. The semiconductor device according to claim 1, wherein the semiconductor substrate comprises a semiconductor material comprised principally of silicon, and the first conductor film is a material comprised of a compound of silicon and a metal element.

5. The semiconductor device according to claim 1, wherein an impurity concentration of the third semiconductor region is higher than an impurity concentration of the first semiconductor region.

6. The semiconductor device according to claim 1, wherein a plurality of field effect transistors are formed in the semiconductor substrate.

7. The semiconductor device according to claim 1, wherein the first conductive portion is directly above the first semiconductor region.

8. The semiconductor device according to claim 7, wherein the first conductive portion is not directly above the second semiconductor region.

9. The semiconductor device according to claim 1, wherein the second semiconductor region is in direct contact with the separation portion, and wherein the third semiconductor region is in direct contact with the separation portion.

10. The semiconductor device according to claim 1, wherein the separation portion is formed by embedding an insulation film into a trench formed in the semiconductor substrate.

* * * * *